(12) United States Patent
Dokai et al.

(10) Patent No.: US 8,676,117 B2
(45) Date of Patent: Mar. 18, 2014

(54) WIRELESS IC DEVICE AND COMPONENT FOR WIRELESS IC DEVICE

(75) Inventors: Yuya Dokai, Nagaokakyo (JP); Noboru Kato, Moriyama (JP); Satoshi Ishino, Kusatsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/567,108

(22) Filed: Aug. 6, 2012

(65) Prior Publication Data

US 2012/0292396 A1 Nov. 22, 2012

Related U.S. Application Data

(63) Continuation of application No. 12/714,607, filed on Mar. 1, 2010, which is a continuation of application No. 12/543,553, filed on Aug. 19, 2009, now Pat. No. 8,078,106, which is a continuation of application No. 12/359,690, filed on Jan. 26, 2009, now Pat. No. 7,630,685, which is a continuation of application No. 11/624,382, filed on Jan. 18, 2007, now Pat. No. 7,519,328.

(60) Provisional application No. 60/746,436, filed on May 4, 2006, provisional application No. 60/823,005, filed on Aug. 21, 2006, provisional application No. 60/825,754, filed on Sep. 15, 2006.

(30) Foreign Application Priority Data

| Jan. 19, 2006 | (JP) | 2006-011626 |
| Mar. 22, 2006 | (JP) | 2006-079099 |
| May 26, 2006 | (JP) | 2006-146258 |
| Jun. 30, 2006 | (JP) | 2006-182685 |
| Aug. 31, 2006 | (JP) | 2006-236777 |

(51) Int. Cl.
*H04B 5/00* (2006.01)

(52) U.S. Cl.
USPC .................................. 455/41.1; 455/333

(58) Field of Classification Search
USPC ........... 455/41.1, 41.2, 334, 39, 42, 327, 333, 455/130; 340/10.1, 10.3, 10.42
See application file for complete search history.

(56) References Cited

U.S. PATENT DOCUMENTS

| 3,364,564 A | 1/1968 | Kurtz et al. |
| 4,794,397 A | 12/1988 | Ohe et al. |

(Continued)

FOREIGN PATENT DOCUMENTS

| CA | 2 279 176 A1 | 7/1998 |
| CN | 1218432 C | 9/2005 |

(Continued)

OTHER PUBLICATIONS

Official communication issued in counterpart European Application No. 08 77 7758, dated on Jun. 30, 2009.

(Continued)

*Primary Examiner* — Sonny Trinh
(74) *Attorney, Agent, or Firm* — Keating & Bennett, LLP

(57) ABSTRACT

A wireless IC device includes a wireless IC chip, a power supply circuit board upon which the wireless IC chip is mounted, and in which a power supply circuit is provided, the power supply circuit includes a resonant circuit having a predetermined resonant frequency, and a radiation pattern, which is adhered to the underside of the power supply circuit board, for radiating a transmission signal supplied from the power supply circuit, and for receiving a reception signal to supply this to the power supply circuit. The resonant circuit is an LC resonant circuit including an inductance device and capacitance devices. The power supply circuit board is a multilayer rigid board or a single-layer rigid board, and between the wireless IC chip and the radiation pattern is connected by DC connection, magnetic coupling, or capacitive coupling.

10 Claims, 29 Drawing Sheets

(56) References Cited

U.S. PATENT DOCUMENTS

| | | | |
|---|---|---|---|
| 5,232,765 A | 8/1993 | Yano et al. | |
| 5,253,969 A | 10/1993 | Richert | |
| 5,337,063 A | 8/1994 | Takahira | |
| 5,374,937 A | 12/1994 | Tsunekawa et al. | |
| 5,399,060 A | 3/1995 | Richert | |
| 5,491,483 A | 2/1996 | D'Hont | |
| 5,528,222 A * | 6/1996 | Moskowitz et al. | 340/572.7 |
| 5,757,074 A | 5/1998 | Matloubian et al. | |
| 5,854,480 A | 12/1998 | Noto | |
| 5,903,239 A | 5/1999 | Takahashi et al. | |
| 5,936,150 A | 8/1999 | Kobrin et al. | |
| 5,955,723 A | 9/1999 | Reiner | |
| 5,995,006 A | 11/1999 | Walsh | |
| 6,104,311 A | 8/2000 | Lastinger | |
| 6,107,920 A | 8/2000 | Eberhardt et al. | |
| 6,154,137 A | 11/2000 | Goff et al. | |
| 6,172,608 B1 | 1/2001 | Cole | |
| 6,181,287 B1 | 1/2001 | Beigel | |
| 6,190,942 B1 | 2/2001 | Wilm et al. | |
| 6,243,045 B1 | 6/2001 | Ishibashi | |
| 6,249,258 B1 | 6/2001 | Bloch et al. | |
| 6,259,369 B1 | 7/2001 | Monico | |
| 6,271,803 B1 | 8/2001 | Watanabe et al. | |
| 6,329,915 B1 * | 12/2001 | Brady et al. | 340/572.1 |
| 6,335,686 B1 | 1/2002 | Goff et al. | |
| 6,362,784 B1 | 3/2002 | Kane et al. | |
| 6,367,143 B1 | 4/2002 | Sugimura | |
| 6,378,774 B1 | 4/2002 | Emori et al. | |
| 6,406,990 B1 | 6/2002 | Kawai | |
| 6,448,874 B1 | 9/2002 | Shiino et al. | |
| 6,452,563 B1 | 9/2002 | Porte | |
| 6,462,716 B1 | 10/2002 | Kushihi | |
| 6,542,050 B1 | 4/2003 | Arai et al. | |
| 6,600,459 B2 | 7/2003 | Yokoshima et al. | |
| 6,634,564 B2 | 10/2003 | Kuramochi | |
| 6,664,645 B2 | 12/2003 | Kawai | |
| 6,763,254 B2 | 7/2004 | Nishikawa | |
| 6,812,707 B2 | 11/2004 | Yonezawa et al. | |
| 6,828,881 B2 | 12/2004 | Mizutani et al. | |
| 6,837,438 B1 | 1/2005 | Takasugi et al. | |
| 6,861,731 B2 | 3/2005 | Buijsman et al. | |
| 6,927,738 B2 | 8/2005 | Senba et al. | |
| 6,956,481 B1 | 10/2005 | Cole | |
| 6,963,729 B2 | 11/2005 | Uozumi | |
| 7,088,249 B2 | 8/2006 | Senba et al. | |
| 7,088,307 B2 | 8/2006 | Imaizumi | |
| 7,112,952 B2 | 9/2006 | Arai et al. | |
| 7,119,693 B1 | 10/2006 | Devilbiss | |
| 7,129,834 B2 | 10/2006 | Naruse et al. | |
| 7,248,221 B2 | 7/2007 | Kai et al. | |
| 7,250,910 B2 | 7/2007 | Yoshikawa et al. | |
| 7,276,929 B2 | 10/2007 | Arai et al. | |
| 7,317,396 B2 | 1/2008 | Ujino | |
| 7,336,243 B2 * | 2/2008 | Jo et al. | 343/895 |
| 7,365,686 B2 * | 4/2008 | Sakama et al. | 343/700 MS |
| 7,405,664 B2 | 7/2008 | Sakama et al. | |
| 7,586,446 B2 * | 9/2009 | Sakama et al. | 343/702 |
| 2001/0011012 A1 | 8/2001 | Hino et al. | |
| 2002/0011967 A1 | 1/2002 | Goff et al. | |
| 2002/0015002 A1 | 2/2002 | Yasukawa et al. | |
| 2002/0044092 A1 | 4/2002 | Kushihi | |
| 2002/0067316 A1 | 6/2002 | Yokoshima et al. | |
| 2002/0093457 A1 | 7/2002 | Hamada et al. | |
| 2002/0196192 A1 | 12/2002 | Nagumo et al. | |
| 2003/0006901 A1 | 1/2003 | Kim et al. | |
| 2003/0020661 A1 | 1/2003 | Sato | |
| 2003/0045324 A1 | 3/2003 | Nagumo et al. | |
| 2003/0169153 A1 | 9/2003 | Muller | |
| 2004/0001027 A1 | 1/2004 | Killen et al. | |
| 2004/0026519 A1 | 2/2004 | Usami et al. | |
| 2004/0056823 A1 | 3/2004 | Zuk et al. | |
| 2004/0066617 A1 | 4/2004 | Hirabayashi et al. | |
| 2004/0217915 A1 | 11/2004 | Imaizumi | |
| 2004/0219956 A1 | 11/2004 | Iwai et al. | |
| 2004/0227673 A1 | 11/2004 | Iwai et al. | |
| 2004/0252064 A1 | 12/2004 | Yuanzhu | |
| 2005/0001031 A1 | 1/2005 | Akiho et al. | |
| 2005/0092836 A1 | 5/2005 | Kudo | |
| 2005/0099337 A1 | 5/2005 | Takei et al. | |
| 2005/0125093 A1 | 6/2005 | Kikuchi et al. | |
| 2005/0134460 A1 | 6/2005 | Usami | |
| 2005/0134506 A1 | 6/2005 | Egbert | |
| 2005/0138798 A1 | 6/2005 | Sakama et al. | |
| 2005/0140512 A1 | 6/2005 | Sakama et al. | |
| 2005/0232412 A1 | 10/2005 | Ichihara et al. | |
| 2005/0236623 A1 | 10/2005 | Takechi et al. | |
| 2005/0275539 A1 | 12/2005 | Sakama et al. | |
| 2006/0001138 A1 | 1/2006 | Sakama et al. | |
| 2006/0032926 A1 | 2/2006 | Baba et al. | |
| 2006/0044192 A1 | 3/2006 | Egbert | |
| 2006/0055531 A1 | 3/2006 | Cook et al. | |
| 2006/0055601 A1 | 3/2006 | Kameda et al. | |
| 2006/0071084 A1 | 4/2006 | Detig et al. | |
| 2006/0109185 A1 | 5/2006 | Iwai et al. | |
| 2006/0145872 A1 | 7/2006 | Tanaka et al. | |
| 2006/0158380 A1 | 7/2006 | Son et al. | |
| 2006/0170606 A1 | 8/2006 | Yamagajo et al. | |
| 2006/0214801 A1 | 9/2006 | Murofushi et al. | |
| 2006/0220871 A1 | 10/2006 | Baba et al. | |
| 2006/0244568 A1 | 11/2006 | Tong et al. | |
| 2006/0244676 A1 | 11/2006 | Uesaka | |
| 2006/0267138 A1 | 11/2006 | Kobayashi | |
| 2007/0004028 A1 | 1/2007 | Lair et al. | |
| 2007/0018893 A1 | 1/2007 | Kai et al. | |
| 2007/0040028 A1 | 2/2007 | Kawamata | |
| 2007/0052613 A1 | 3/2007 | Gallschuetz et al. | |
| 2007/0057854 A1 | 3/2007 | Oodachi et al. | |
| 2007/0069037 A1 | 3/2007 | Kawai | |
| 2007/0132591 A1 | 6/2007 | Khatri | |
| 2007/0164414 A1 | 7/2007 | Dokai et al. | |
| 2007/0200782 A1 | 8/2007 | Hayama et al. | |
| 2007/0229276 A1 | 10/2007 | Yamagajo et al. | |
| 2007/0247387 A1 | 10/2007 | Kubo et al. | |
| 2007/0252700 A1 | 11/2007 | Ishihara et al. | |
| 2007/0252703 A1 | 11/2007 | Kato et al. | |
| 2007/0252763 A1 | 11/2007 | Martin | |
| 2007/0285335 A1 | 12/2007 | Bungo et al. | |
| 2007/0290928 A1 | 12/2007 | Chang et al. | |
| 2008/0024156 A1 | 1/2008 | Arai et al. | |
| 2008/0068132 A1 | 3/2008 | Kayanakis et al. | |
| 2008/0070003 A1 | 3/2008 | Nakatani et al. | |
| 2008/0087990 A1 | 4/2008 | Kato et al. | |
| 2008/0143630 A1 | 6/2008 | Kato et al. | |
| 2008/0169905 A1 | 7/2008 | Slatter | |
| 2008/0184281 A1 | 7/2008 | Ashizaki et al. | |
| 2008/0272885 A1 | 11/2008 | Atherton | |
| 2009/0002130 A1 | 1/2009 | Kato | |
| 2009/0009007 A1 | 1/2009 | Kato et al. | |
| 2009/0021352 A1 | 1/2009 | Kataya et al. | |
| 2009/0021446 A1 | 1/2009 | Kataya et al. | |
| 2009/0065594 A1 | 3/2009 | Kato et al. | |
| 2009/0109102 A1 | 4/2009 | Dokai et al. | |
| 2009/0160719 A1 | 6/2009 | Kato et al. | |
| 2009/0201116 A1 | 8/2009 | Orihara | |
| 2009/0224061 A1 | 9/2009 | Kato et al. | |
| 2009/0231106 A1 | 9/2009 | Okamura | |
| 2009/0262041 A1 | 10/2009 | Ikemoto et al. | |
| 2009/0266900 A1 | 10/2009 | Ikemoto et al. | |
| 2009/0278687 A1 | 11/2009 | Kato | |
| 2009/0321527 A1 | 12/2009 | Kato et al. | |
| 2010/0103058 A1 | 4/2010 | Kato et al. | |
| 2010/0182210 A1 | 7/2010 | Ryou et al. | |
| 2010/0308118 A1 | 12/2010 | Kataya et al. | |
| 2011/0031320 A1 | 2/2011 | Kato et al. | |
| 2011/0063184 A1 | 3/2011 | Furumura et al. | |

FOREIGN PATENT DOCUMENTS

| | | |
|---|---|---|
| DE | 10 2006 057 369 A1 | 6/2008 |
| EP | 0 694 874 A2 | 1/1996 |
| EP | 0 704 928 A2 | 4/1996 |
| EP | 0 848 448 A2 | 6/1998 |
| EP | 0 948 083 A2 | 10/1999 |
| EP | 0 977 145 A2 | 2/2000 |

(56) References Cited

FOREIGN PATENT DOCUMENTS

| | | |
|---|---|---|
| EP | 1 010 543 A1 | 6/2000 |
| EP | 1 085 480 A1 | 3/2001 |
| EP | 1 160 915 A2 | 12/2001 |
| EP | 1 170 795 A2 | 1/2002 |
| EP | 1 193 793 A2 | 4/2002 |
| EP | 1 227 540 A1 | 7/2002 |
| EP | 1 280 232 A1 | 1/2003 |
| EP | 1 280 350 A1 | 1/2003 |
| EP | 1 343 223 A1 | 9/2003 |
| EP | 1 357 511 A2 | 10/2003 |
| EP | 1 547 753 A1 | 6/2005 |
| EP | 1 548 872 A1 | 6/2005 |
| EP | 1 626 364 A2 | 2/2006 |
| EP | 1 701 296 A1 | 9/2006 |
| EP | 1 703 589 A1 | 9/2006 |
| EP | 1 742 296 A1 | 1/2007 |
| EP | 1 744 398 A1 | 1/2007 |
| EP | 1 840 802 A1 | 10/2007 |
| EP | 1 841 005 A1 | 10/2007 |
| EP | 1 865 574 A1 | 12/2007 |
| EP | 1 887 652 A1 | 2/2008 |
| EP | 1 976 056 A1 | 10/2008 |
| EP | 1 988 491 A1 | 11/2008 |
| EP | 1 988 601 A1 | 11/2008 |
| EP | 1 993 170 A1 | 11/2008 |
| EP | 2 009 738 A1 | 12/2008 |
| EP | 2 012 258 A1 | 1/2009 |
| EP | 2 096 709 A1 | 9/2009 |
| EP | 2 148 449 A1 | 1/2010 |
| EP | 2 166 617 A1 | 3/2010 |
| EP | 2 251 934 A1 | 11/2010 |
| EP | 2 256 861 A1 | 12/2010 |
| EP | 2 330 684 A1 | 6/2011 |
| GB | 2 305 075 A | 3/1997 |
| GB | 2461443 A | 1/2010 |
| JP | 50-143451 A | 11/1975 |
| JP | 61-284102 A | 12/1986 |
| JP | 62-127140 U | 8/1987 |
| JP | 01-212035 A | 8/1989 |
| JP | 02-164105 A | 6/1990 |
| JP | 02-256208 A | 10/1990 |
| JP | 3-171385 A | 7/1991 |
| JP | 03-503467 A | 8/1991 |
| JP | 03-262313 A | 11/1991 |
| JP | 04-150011 A | 5/1992 |
| JP | 04-167500 A | 6/1992 |
| JP | 04-096814 U | 8/1992 |
| JP | 04-101168 U | 9/1992 |
| JP | 04-134807 U | 12/1992 |
| JP | 05-226926 A | 9/1993 |
| JP | 05-327331 A | 12/1993 |
| JP | 6-53733 A | 2/1994 |
| JP | 06-077729 A | 3/1994 |
| JP | 06-029215 U | 4/1994 |
| JP | 06-177635 A | 6/1994 |
| JP | 6-260949 A | 9/1994 |
| JP | 07-183836 A | 7/1995 |
| JP | 08-055725 A | 2/1996 |
| JP | 08-056113 A | 2/1996 |
| JP | 8-87580 A | 4/1996 |
| JP | 08-88586 A | 4/1996 |
| JP | 08-088586 A | 4/1996 |
| JP | 08-176421 A | 7/1996 |
| JP | 08-180160 A | 7/1996 |
| JP | 08-279027 A | 10/1996 |
| JP | 08-307126 A | 11/1996 |
| JP | 08-330372 A | 12/1996 |
| JP | 09-014150 A | 1/1997 |
| JP | 09-035025 A | 2/1997 |
| JP | 9-93029 A | 4/1997 |
| JP | 09-093029 A | 4/1997 |
| JP | 09-245381 A | 9/1997 |
| JP | 09-252217 A | 9/1997 |
| JP | 09-270623 A | 10/1997 |
| JP | 09-284038 A | 10/1997 |
| JP | 9-512367 A | 12/1997 |
| JP | 10-069533 A | 3/1998 |
| JP | 10-69533 A | 3/1998 |
| JP | 10-505466 A | 5/1998 |
| JP | 10-171954 A | 6/1998 |
| JP | 10-173427 A | 6/1998 |
| JP | 10-193849 A | 7/1998 |
| JP | 10-193851 A | 7/1998 |
| JP | 10-242742 A | 9/1998 |
| JP | 10-293828 A | 11/1998 |
| JP | 10-334203 A | 12/1998 |
| JP | 11-025244 A | 1/1999 |
| JP | 11-039441 A | 2/1999 |
| JP | 11-075329 A | 3/1999 |
| JP | 11-085937 A | 3/1999 |
| JP | 11-88241 A | 3/1999 |
| JP | 11-102424 A | 4/1999 |
| JP | 11-103209 A | 4/1999 |
| JP | 11-149536 A | 6/1999 |
| JP | 11-149537 A | 6/1999 |
| JP | 11-149538 A | 6/1999 |
| JP | 11-175678 A | 7/1999 |
| JP | 11-219420 A | 8/1999 |
| JP | 11-220319 A | 8/1999 |
| JP | 11-282993 A | 10/1999 |
| JP | 11-328352 A | 11/1999 |
| JP | 11-331014 A | 11/1999 |
| JP | 11-346114 A | 12/1999 |
| JP | 11-515094 A | 12/1999 |
| JP | 2000-21128 A | 1/2000 |
| JP | 2000-021639 A | 1/2000 |
| JP | 2000-022421 A | 1/2000 |
| JP | 2000-059260 A | 2/2000 |
| JP | 2000-085283 A | 3/2000 |
| JP | 2000-090207 A | 3/2000 |
| JP | 2000-132643 A | 5/2000 |
| JP | 2000-137778 A | 5/2000 |
| JP | 2000-137779 A | 5/2000 |
| JP | 2000-137785 A | 5/2000 |
| JP | 2000-148948 A | 5/2000 |
| JP | 2000-172812 A | 6/2000 |
| JP | 2000-209013 A | 7/2000 |
| JP | 2000-222540 A | 8/2000 |
| JP | 2000-510271 A | 8/2000 |
| JP | 2000-242754 A | 9/2000 |
| JP | 2000-243797 A | 9/2000 |
| JP | 2000-251049 A | 9/2000 |
| JP | 2000-261230 A | 9/2000 |
| JP | 2000-276569 A | 10/2000 |
| JP | 2000-286634 A | 10/2000 |
| JP | 2000-286760 A | 10/2000 |
| JP | 2000-311226 A | 11/2000 |
| JP | 2000-321984 A | 11/2000 |
| JP | 2000-349680 A | 12/2000 |
| JP | 2001-10264 A | 1/2001 |
| JP | 2001-028036 A | 1/2001 |
| JP | 2001-043340 A | 2/2001 |
| JP | 3075400 U | 2/2001 |
| JP | 2001-66990 A | 3/2001 |
| JP | 2001-76111 A | 3/2001 |
| JP | 2001-084463 A | 3/2001 |
| JP | 2001-101369 A | 4/2001 |
| JP | 2001-505682 A | 4/2001 |
| JP | 2001-168628 A | 6/2001 |
| JP | 2001-188890 A | 7/2001 |
| JP | 2001-209767 A | 8/2001 |
| JP | 2001-240046 A | 9/2001 |
| JP | 2001-240217 A | 9/2001 |
| JP | 2001-256457 A | 9/2001 |
| JP | 2001-257292 A | 9/2001 |
| JP | 2001-514777 A | 9/2001 |
| JP | 2001-291181 A | 10/2001 |
| JP | 2001-319380 A | 11/2001 |
| JP | 2001-331976 A | 11/2001 |
| JP | 2001-332923 A | 11/2001 |
| JP | 2001-338813 A | 12/2001 |
| JP | 2001-339226 A | 12/2001 |
| JP | 2001-344574 A | 12/2001 |
| JP | 2001-351083 A | 12/2001 |

(56) References Cited

FOREIGN PATENT DOCUMENTS

| | | |
|---|---|---|
| JP | 2001-351084 A | 12/2001 |
| JP | 2001-352176 A | 12/2001 |
| JP | 2001-358527 A | 12/2001 |
| JP | 2002-024776 A | 1/2002 |
| JP | 2002-026513 A | 1/2002 |
| JP | 2002-32731 A | 1/2002 |
| JP | 2002-042076 A | 2/2002 |
| JP | 2002-042083 A | 2/2002 |
| JP | 2002-063557 A | 2/2002 |
| JP | 2002-505645 A | 2/2002 |
| JP | 2002-076750 A | 3/2002 |
| JP | 2002-76750 A | 3/2002 |
| JP | 2002-111363 A | 4/2002 |
| JP | 2002-150245 A | 5/2002 |
| JP | 2002-157564 A | 5/2002 |
| JP | 2002-158529 A | 5/2002 |
| JP | 2002-175508 A | 6/2002 |
| JP | 2002-183676 A | 6/2002 |
| JP | 2002-183690 A | 6/2002 |
| JP | 2002-185358 A | 6/2002 |
| JP | 2002-204117 A | 7/2002 |
| JP | 2002-521757 A | 7/2002 |
| JP | 2002-522849 A | 7/2002 |
| JP | 2002-230128 A | 8/2002 |
| JP | 2002-232221 A | 8/2002 |
| JP | 2002-246828 A | 8/2002 |
| JP | 2002-252117 A | 9/2002 |
| JP | 2002-259934 A | 9/2002 |
| JP | 2002-280821 A | 9/2002 |
| JP | 2002-298109 A | 10/2002 |
| JP | 2002-308437 A | 10/2002 |
| JP | 2002-319008 A | 10/2002 |
| JP | 2002-319009 A | 10/2002 |
| JP | 2002-319812 A | 10/2002 |
| JP | 2002-362613 A | 12/2002 |
| JP | 2002-366917 A | 12/2002 |
| JP | 2002-373029 A | 12/2002 |
| JP | 2002-373323 A | 12/2002 |
| JP | 2002-374139 A | 12/2002 |
| JP | 2003-006599 A | 1/2003 |
| JP | 2003-016412 A | 1/2003 |
| JP | 2003-022912 A | 1/2003 |
| JP | 2003-026177 A | 1/2003 |
| JP | 2003-030612 A | 1/2003 |
| JP | 2003-037861 A | 2/2003 |
| JP | 2003-44789 A | 2/2003 |
| JP | 2003-046318 A | 2/2003 |
| JP | 2003-58840 A | 2/2003 |
| JP | 2003-067711 A | 3/2003 |
| JP | 2003-069335 A | 3/2003 |
| JP | 2003-076947 A | 3/2003 |
| JP | 2003-76963 A | 3/2003 |
| JP | 2003-78333 A | 3/2003 |
| JP | 2003-078336 A | 3/2003 |
| JP | 2003-085501 A | 3/2003 |
| JP | 2003-085520 A | 3/2003 |
| JP | 2003-87008 A | 3/2003 |
| JP | 2003-87044 A | 3/2003 |
| JP | 2003-099184 A | 4/2003 |
| JP | 2003-099720 A | 4/2003 |
| JP | 2003-099721 A | 4/2003 |
| JP | 2003-110344 A | 4/2003 |
| JP | 2003-132330 A | 5/2003 |
| JP | 2003-134007 A | 5/2003 |
| JP | 2003-155062 A | 5/2003 |
| JP | 2003-158414 A | 5/2003 |
| JP | 2003-168760 A | 6/2003 |
| JP | 2003-179565 A | 6/2003 |
| JP | 2003-187207 A | 7/2003 |
| JP | 2003-187211 A | 7/2003 |
| JP | 2003-188338 A | 7/2003 |
| JP | 2003-188620 A | 7/2003 |
| JP | 2003-198230 A | 7/2003 |
| JP | 2003-209421 A | 7/2003 |
| JP | 2003-216919 A | 7/2003 |
| JP | 2003-218624 A | 7/2003 |
| JP | 2003-233780 A | 8/2003 |
| JP | 2003-242471 A | 8/2003 |
| JP | 2003-243918 A | 8/2003 |
| JP | 2003-249813 A | 9/2003 |
| JP | 2003-529163 A | 9/2003 |
| JP | 2003-288560 A | 10/2003 |
| JP | 2003-309418 A | 10/2003 |
| JP | 2003-317060 A | 11/2003 |
| JP | 2003-331246 A | 11/2003 |
| JP | 2003-332820 A | 11/2003 |
| JP | 2003-536302 A | 12/2003 |
| JP | 2004-040579 A | 2/2004 |
| JP | 2004-040597 A | 2/2004 |
| JP | 2004-505481 A | 2/2004 |
| JP | 2004-082775 A | 3/2004 |
| JP | 2004-88218 A | 3/2004 |
| JP | 2004-93693 A | 3/2004 |
| JP | 2004-096566 A | 3/2004 |
| JP | 2004-096618 A | 3/2004 |
| JP | 2004-126750 A | 4/2004 |
| JP | 2004-127230 A | 4/2004 |
| JP | 2004-140513 A | 5/2004 |
| JP | 2004-163134 A | 6/2004 |
| JP | 2004-213582 A | 7/2004 |
| JP | 2004-519916 A | 7/2004 |
| JP | 2004-234595 A | 8/2004 |
| JP | 2004-253858 A | 9/2004 |
| JP | 2004-527864 A | 9/2004 |
| JP | 2004-280390 A | 10/2004 |
| JP | 2004-282403 A | 10/2004 |
| JP | 2004-287767 A | 10/2004 |
| JP | 2004-295297 A | 10/2004 |
| JP | 2004-297249 A | 10/2004 |
| JP | 2004-297681 A | 10/2004 |
| JP | 2004-304370 A | 10/2004 |
| JP | 2004-319848 A | 11/2004 |
| JP | 2004-326380 A | 11/2004 |
| JP | 2004-334268 A | 11/2004 |
| JP | 2004-336250 A | 11/2004 |
| JP | 2004-343000 A | 12/2004 |
| JP | 2004-362190 A | 12/2004 |
| JP | 2004-362341 A | 12/2004 |
| JP | 2004-362602 A | 12/2004 |
| JP | 2005-5866 A | 1/2005 |
| JP | 2005-18156 A | 1/2005 |
| JP | 2005-033461 A | 2/2005 |
| JP | 2005-064799 A | 3/2005 |
| JP | 2005-124061 A | 5/2005 |
| JP | 2005-128592 A | 5/2005 |
| JP | 2005-129019 A | 5/2005 |
| JP | 2005-135132 A | 5/2005 |
| JP | 2005-136528 A | 5/2005 |
| JP | 2005-137032 A | 5/2005 |
| JP | 3653099 B2 | 5/2005 |
| JP | 2005-165839 A | 6/2005 |
| JP | 2005-167327 A | 6/2005 |
| JP | 2005-167813 A | 6/2005 |
| JP | 2005-190417 A | 7/2005 |
| JP | 2005-191705 A | 7/2005 |
| JP | 2005-192124 A | 7/2005 |
| JP | 2005-204038 A | 7/2005 |
| JP | 2005-210223 A | 8/2005 |
| JP | 2005-210676 A | 8/2005 |
| JP | 2005-210680 A | 8/2005 |
| JP | 2005-217822 A | 8/2005 |
| JP | 2005-229474 A | 8/2005 |
| JP | 2005-236339 A | 9/2005 |
| JP | 2005-244778 A | 9/2005 |
| JP | 2005-252853 A | 9/2005 |
| JP | 2005-275870 A | 10/2005 |
| JP | 2005-284352 A | 10/2005 |
| JP | 2005-284455 A | 10/2005 |
| JP | 2005-293537 A | 10/2005 |
| JP | 2005-295135 A | 10/2005 |
| JP | 2005-311205 A | 11/2005 |
| JP | 2005-321305 A | 11/2005 |
| JP | 2005-322119 A | 11/2005 |
| JP | 2005-335755 A | 12/2005 |

(56) References Cited

FOREIGN PATENT DOCUMENTS

| | | |
|---|---|---|
| JP | 2005-340759 A | 12/2005 |
| JP | 2005-345802 A | 12/2005 |
| JP | 2005-346820 A | 12/2005 |
| JP | 2005-352858 A | 12/2005 |
| JP | 2006-13976 A | 1/2006 |
| JP | 2006-013976 A | 1/2006 |
| JP | 2006-025390 A | 1/2006 |
| JP | 2006-031766 A | 2/2006 |
| JP | 2006-033312 A | 2/2006 |
| JP | 2006-39902 A | 2/2006 |
| JP | 2006-039947 A | 2/2006 |
| JP | 2006-42059 A | 2/2006 |
| JP | 2006-42097 A | 2/2006 |
| JP | 2006-050200 A | 2/2006 |
| JP | 2006-053833 A | 2/2006 |
| JP | 2006-67479 A | 3/2006 |
| JP | 2006-72706 A | 3/2006 |
| JP | 2006-074348 A | 3/2006 |
| JP | 2006-80367 A | 3/2006 |
| JP | 2006-92630 A | 4/2006 |
| JP | 2006-102953 A | 4/2006 |
| JP | 2006-107296 A | 4/2006 |
| JP | 2006-513594 A | 4/2006 |
| JP | 2006-148462 A | 6/2006 |
| JP | 2006-148518 A | 6/2006 |
| JP | 2006-151402 A | 6/2006 |
| JP | 2006-174151 A | 6/2006 |
| JP | 2006-195795 A | 7/2006 |
| JP | 2006-203187 A | 8/2006 |
| JP | 2006-203852 A | 8/2006 |
| JP | 2006-217000 A | 8/2006 |
| JP | 2006-232292 A | 9/2006 |
| JP | 2006-237674 A | 9/2006 |
| JP | 2006-238282 A | 9/2006 |
| JP | 2006-246372 A | 9/2006 |
| JP | 2006-270212 A | 10/2006 |
| JP | 2006-270681 A | 10/2006 |
| JP | 2006-270766 A | 10/2006 |
| JP | 2006-285911 A | 10/2006 |
| JP | 2006-287659 A | 10/2006 |
| JP | 2006-295879 A | 10/2006 |
| JP | 2006-302219 A | 11/2006 |
| JP | 2006-309401 A | 11/2006 |
| JP | 2006-311239 A | 11/2006 |
| JP | 2006-323481 A | 11/2006 |
| JP | 2006-339964 A | 12/2006 |
| JP | 2007-007888 A | 1/2007 |
| JP | 2007-13120 A | 1/2007 |
| JP | 2007-18067 A | 1/2007 |
| JP | 2007-019905 A | 1/2007 |
| JP | 2007-28002 A | 2/2007 |
| JP | 2007-040702 A | 2/2007 |
| JP | 2007-043535 A | 2/2007 |
| JP | 2007-048126 A | 2/2007 |
| JP | 2007-65822 A | 3/2007 |
| JP | 2007-79687 A | 3/2007 |
| JP | 2007-81712 A | 3/2007 |
| JP | 2007-096768 A | 4/2007 |
| JP | 2007-102348 A | 4/2007 |
| JP | 2007-116347 A | 5/2007 |
| JP | 2007-122542 A | 5/2007 |
| JP | 2007-150642 A | 6/2007 |
| JP | 2007-150868 A | 6/2007 |
| JP | 2007-159083 A | 6/2007 |
| JP | 2007-159129 A | 6/2007 |
| JP | 2007-166133 A | 6/2007 |
| JP | 3975918 B2 | 6/2007 |
| JP | 2007-172369 A | 7/2007 |
| JP | 2007-172527 A | 7/2007 |
| JP | 2007-524942 A | 8/2007 |
| JP | 2007-228254 A | 9/2007 |
| JP | 2007-228325 A | 9/2007 |
| JP | 2007-233597 A | 9/2007 |
| JP | 2007-241789 A | 9/2007 |
| JP | 2007-266999 A | 10/2007 |
| JP | 2007-272264 A | 10/2007 |
| JP | 2007-287128 A | 11/2007 |
| JP | 2007-295557 A | 11/2007 |
| JP | 2007-312350 A | 11/2007 |
| JP | 2007-324865 A | 12/2007 |
| JP | 2008-033716 A | 2/2008 |
| JP | 2008-042910 A | 2/2008 |
| JP | 2008-72243 A | 3/2008 |
| JP | 2008-083867 A | 4/2008 |
| JP | 2008-092131 A | 4/2008 |
| JP | 2008-097426 A | 4/2008 |
| JP | 2008-098993 A | 4/2008 |
| JP | 4069958 B2 | 4/2008 |
| JP | 2008-103691 A | 5/2008 |
| JP | 2008-107947 A | 5/2008 |
| JP | 2008-513888 A | 5/2008 |
| JP | 2008-148345 A | 6/2008 |
| JP | 2008-519347 A | 6/2008 |
| JP | 2008-160874 A | 7/2008 |
| JP | 2008-167190 A | 7/2008 |
| JP | 2008-197714 A | 8/2008 |
| JP | 2008-535372 A | 8/2008 |
| JP | 2008-207875 A | 9/2008 |
| JP | 2008-217406 A | 9/2008 |
| JP | 2008-288915 A | 11/2008 |
| JP | 2009-017284 A | 1/2009 |
| JP | 2009-021970 A | 1/2009 |
| JP | 2009-25870 A | 2/2009 |
| JP | 2009-27291 A | 2/2009 |
| JP | 2009-044647 A | 2/2009 |
| JP | 2009-044715 A | 2/2009 |
| JP | 3148168 U | 2/2009 |
| JP | 2009-110144 A | 5/2009 |
| JP | 2009-153166 A | 7/2009 |
| JP | 2009-182630 A | 8/2009 |
| JP | 2009-213169 A | 9/2009 |
| JP | 2010-009196 A | 1/2010 |
| JP | 2010-050844 A | 3/2010 |
| JP | 2010-081571 | 4/2010 |
| JP | 4609604 B2 | 1/2011 |
| NL | 9100176 A | 3/1992 |
| NL | 9100347 A | 3/1992 |
| WO | 98/33142 A1 | 7/1998 |
| WO | 99/67754 A1 | 12/1999 |
| WO | 00/10122 A2 | 2/2000 |
| WO | 01/73675 A2 | 10/2001 |
| WO | 01/95242 A2 | 12/2001 |
| WO | 02/07085 A1 | 1/2002 |
| WO | 02/48980 A1 | 6/2002 |
| WO | 02/061675 A1 | 8/2002 |
| WO | 02/097723 A1 | 12/2002 |
| WO | 03/079305 A1 | 9/2003 |
| WO | 2004/036772 A2 | 4/2004 |
| WO | 2004/070879 A | 8/2004 |
| WO | 2004/072892 A2 | 8/2004 |
| WO | 2005/073937 A | 8/2005 |
| WO | 2005/091434 A1 | 9/2005 |
| WO | 2005/115849 A1 | 12/2005 |
| WO | 2006/045682 A | 5/2006 |
| WO | 2006/048663 A1 | 5/2006 |
| WO | 2006/114821 A1 | 11/2006 |
| WO | 2007/083574 A1 | 7/2007 |
| WO | 2007/083575 A1 | 7/2007 |
| WO | 2007/086130 A1 | 8/2007 |
| WO | 2007/094494 A1 | 8/2007 |
| WO | 2007/097385 A1 | 8/2007 |
| WO | 2007/102360 A1 | 9/2007 |
| WO | 2007/105348 A1 | 9/2007 |
| WO | 2007/119310 A1 | 10/2007 |
| WO | 2007/125683 A1 | 11/2007 |
| WO | 2007/132094 A1 | 11/2007 |
| WO | 2007/138857 A1 | 12/2007 |
| WO | 2008/007606 A | 1/2008 |
| WO | 2008/081699 A1 | 7/2008 |
| WO | 2008/126458 A1 | 10/2008 |
| WO | 2008/133018 A1 | 11/2008 |
| WO | 2008/140037 A1 | 11/2008 |
| WO | 2008/142957 A1 | 11/2008 |
| WO | 2009/008296 A1 | 1/2009 |

(56) References Cited

FOREIGN PATENT DOCUMENTS

| | | | |
|---|---|---|---|
| WO | 2009/011144 A1 | 1/2009 |
| WO | 2009/011376 A1 | 1/2009 |
| WO | 2009/011400 A1 | 1/2009 |
| WO | 2009/011423 A1 | 1/2009 |
| WO | 2009/081719 A1 | 7/2009 |
| WO | 2009/110381 A1 | 9/2009 |
| WO | 2009/119548 A1 | 10/2009 |
| WO | 2009/128437 A1 | 10/2009 |
| WO | 2010/026939 A1 | 3/2010 |

OTHER PUBLICATIONS

Official communication issued in counterpart Japanese Application No. 2008-103741, mailed on May 26, 2009.
Official communication issued in counterpart Japanese Application No. 2008-103742, mailed on May 26, 2009.
Official communication issued in International Application No. PCT/JP2008/050358, mailed on Mar. 25, 2008.
Official communication issued in International Application No. PCT/JP2008/050356, mailed on Mar. 25, 2008.
Osamura et al.: "Packaging Material With Electromagnetic Coupling Module," U.S. Appl. No. 12/536,669, filed Aug. 6, 2009.
Osamura et al.: "Packaging Material With Electromagentic Coupling Module," U.S. Appl. No. 12/536,669, filed Aug. 6, 2009.
Dokai et al.: "Wireless IC Device and Component for Wireless IC Device," U.S. Appl. No. 12/543,553, filed Aug. 19, 2009.
Shioya et al.: "Wireless IC Device," U.S. Appl. No. 12/551,037, filed Aug. 31, 2009.
Ikemoto: "Wireless IC Device and Manufacturing Method Thereof," U.S. Appl. No. 12/579,672, filed Oct. 15, 2009.
Official communication issued in International Application No. PCT/JP2008/058614, mailed on Jun. 10, 2008.
Official Communication issued in corresponding European Patent Application No. 10166024.9, mailed on Jul. 5, 2013.
Official communication issued in counterpart International Application No. PCT/JP2008/071502, mailed Feb. 24, 2009.
Kato et al.: "Wireless IC Device and Manufacturing Method Thereof," U.S. Appl. No. 12/432,854, filed Apr. 30, 2009.
Official communication issued in counterpart International Application No. PCT/JP2008/058168, mailed Aug. 12, 2008.
Official communication issued in counterpart International Application No. PCT/JP2008/062886, mailed Oct. 21, 2008.
Kato et al.: "Wireless IC Device," U.S. Appl. No. 12/469,896, filed May 21, 2009.
Ikemoto et al.: "Wireless IC Device," U.S. Appl. No. 12/496,709, filed Jul. 2, 2009.
Official communication issued in counterpart International Application No. PCT/JP2008/062947, mailed Aug. 19, 2008.
Official communication issued in counterpart International Application No. PCT/JP2008/056026, mailed Jul. 1, 2008.
Ikemoto et al.: "Wireless IC Device and Electronic Apparatus," U.S. Appl. No. 12/503,188, filed Jul. 15, 2009.
Official communication issued in counterpart International Application No. PCT/JP2008/055567, mailed May 20, 2008.
Official communication issued in counterpart International Application No. PCT/JP2008/051853, mailed Apr. 22, 2008.
Official communication issued in counterpart International Application No. PCT/JP2008/057239, mailed Jul. 22, 2008.
Kimura et al.: "Wireless IC Device," U.S. Appl. No. 12/510,338, filed Jul. 28, 2009.
Kato et al.: "Wireless IC Device," U.S. Appl. No. 12/510,340, filed Jul. 28, 2009.
Kato: "Wireless IC Device," U.S. Appl. No. 12/510,344, filed Jul. 28, 2009.
Kato et al.: "Wireless IC Device," U.S. Appl. No. 12/510,347, filed Jul. 28, 2009.
Official Communication issued in International Patent Application No. PCT/JP2009/069486, mailed on Mar. 2, 2010.
Kato: "Radio IC Device"; U.S. Appl. No. 13/080,775, filed Apr. 6, 2011.
Kato et al.: "Antenna and Wireless IC Device"; U.S. Appl. No. 13/083,626, filed Apr. 11, 2011.
Official Communication issued in International Patent Application No. PCT/JP2009/070617, mailed on Mar. 16, 2010.
Nagai, "Mounting Technique of RFID by Roll-To-Roll Process", Material Stage, Technical Information Institute Co., Ltd, vol. 7, No. 9, 2007, pp. 4-12.
Dokai et al.: "Wireless IC Device"; U.S. Appl. No. 13/088,480, filed Apr. 18, 2011.
Kato et al.: "High-Frequency Device and Wireless IC Device"; U.S. Appl. No. 13/094,928, filed Apr. 27, 2011.
Dokai et al.: "Wireless IC Device"; U.S. Appl. No. 13/099,392, filed May 3, 2011.
Kato et al.: "Radio Frequency IC Device"; U.S. Appl. No. 13/163,803, filed Jun. 20, 2011.
Official Communication issued in International Patent Application No. PCT/JP2010/050170, mailed on Apr. 13, 2010.
Official Communication issued in International Patent Application No. PCT/JP2010/051205, mailed on May 11, 2010.
Kato: "Wireless IC Device, Wireless IC Module and Method of Manufacturing Wireless IC Module"; U.S. Appl. No. 13/169,067, filed Jun. 27, 2011.
Kato et al.: "Antenna and Wireless IC Device"; U.S. Appl. No. 13/190,670, filed Jul. 26, 2011.
Shiroki et al.: "RFIC Chip Mounting Structure"; U.S. Appl. No. 13/223,429, filed Sep. 1, 2011.
Official Communication issued in International Patent Application No. PCT/JP2010/056559, mailed on Jul. 27, 2010.
Taniguchi et al.: "Antenna Device and Radio Frequency IC Device"; U.S. Appl. No. 13/232,102, filed Sep. 14, 2011.
Official Communication issued in International Patent Application No. PCT/JP2009/066336, mailed on Dec. 22, 2009.
Official Communication issued in corresponding Japanese Patent Application No. 2010-509439, mailed on Jul. 6, 2010.
Official Communication issued in corresponding Japanese Patent Application No. 2011-032311, mailed on Mar. 29, 2011.
Official Communication issued in corresponding Japanese Patent Application No. 2009-525327, drafted on Sep. 22, 2010.
Official Communication issued in corresponding Japanese Patent Application No. 2011-032311, mailed on Aug. 2, 2011.
Official Communication issued in corresponding Japanese Patent Application No. 2011-032312, mailed on Aug. 2, 2011.
Official Communication issued in corresponding Japanese Patent Application No. 2011-032311, mailed on Aug. 23, 2011.
Kato et al.: "Wireless IC Device Component and Wireless IC Device"; U.S. Appl. No. 13/241,823, filed Sep. 23, 2011.
Kato et al.: "Antenna Device and Method of Setting Resonant Frequency of Antenna Device"; U.S. Appl. No. 13/272,365, filed Oct. 13, 2011.
Official Communication issued in International Patent Application No. PCT/JP2010/056812, mailed on Jul. 13, 2010.
Dokai et al.: "Optical Disc"; U.S. Appl. No. 13/295,153, filed Nov. 14, 2011.
Official Communication issued in International Patent Application No. PCT/JP2010/057668, mailed on Aug. 17, 2010.
Osamura et al.: "Radio Frequency IC Device and Method of Manufacturing the Same"; U.S. Appl. No. 13/308,575, filed Dec. 1, 2011.
Official Communication issued in International Patent Application No. PCT/JP2010/069417, mailed on Dec. 7, 2010.
Kato: "Wireless IC Device and Coupling Method for Power Feeding Circuit and Radiation Plate"; U.S. Appl. No. 13/325,273, filed Dec. 14, 2011.
Official Communication issued in International Patent Application No. PCT/JP2010/053496, mailed on Jun. 1, 2010.
Ikemoto: "Wireless IC Tag, Reader-Writer, and Information Processing System"; U.S. Appl. No. 13/329,354, filed Dec. 19, 2011.
Kato et al.: "Antenna and Antenna Module"; U.S. Appl. No. 13/334,462, filed Dec. 22, 2011.
Official Communication issued in International Patent Application No. PCT/JP2010/069418, mailed on Feb. 8, 2011.
Official Communication issued in International Patent Application No. PCT/JP2010/063082, mailed on Nov. 16, 2010.

(56) References Cited

OTHER PUBLICATIONS

Ikemoto: "Communication Terminal and Information Processing System"; U.S. Appl. No. 13/412,772, filed Mar. 6, 2012.
"Antenna Engineering Handbook", The Institute of Electronics and Communication Engineers, Mar. 5, 1999, pp. 20-21.
Official Communication issued in International Patent Application No. PCT/JP2010/066714, mailed on Dec. 14, 2010.
Nomura et al.: "Antenna and Wireless IC Device"; U.S. Appl. No. 13/419,454, filed Mar. 14, 2012.
Official Communication issued in International Patent Application No. PCT/JP2010/070607, mailed on Feb. 15, 2011.
Ito: "Wireless IC Device and Method of Detecting Environmental State Using the Device"; U.S. Appl. No. 13/421,889, filed Mar. 16, 2012.
Official Communication issued in International Patent Application No. PCT/JP2011/053654, mailed on Mar. 29, 2011.
Kato et al.: "Antenna Device and Mobile Communication Terminal"; U.S. Appl. No. 13/425,505, filed Mar. 21, 2012.
Official Communication issued in International Patent Application No. PCT/JP2010/069416, mailed on Feb. 8, 2011.
Kato et al.: "Wireless Communication Device and Metal Article"; U.S. Appl. No. 13/429,465, filed Mar. 26, 2012.
Official Communication issued in International Patent Application No. PCT/JP2011/055344, mailed on Jun. 14, 2011.
Kubo et al.: "Antenna and Mobile Terminal"; U.S. Appl. No. 13/452,972, filed Apr. 23, 2012.
Ikemoto: "RFID System"; U.S. Appl. No. 13/457,525, filed Apr. 27, 2012.
Ikemoto et al.: "Wireless IC Device and Electronic Apparatus"; U.S. Appl. No. 13/468,058, filed May 10, 2012.
English translation of NL9100176, published on Mar. 2, 1992.
English translation of NL9100347, published on Mar. 2, 1992.
Kato et al.: "Antenna"; U.S. Appl. No. 11/928,502, filed Oct. 30, 2007.
Kato et al.: "Wireless IC Device"; U.S. Appl. No. 12/211,117, filed Sep. 16, 2008.
Kato et al.: "Antenna"; U.S. Appl. No. 11/688,290, filed Mar. 20, 2007.
Kato et al.: "Electromagnetic-Coupling-Module-Attached Article"; U.S. Appl. No. 11/740,509, filed Apr. 26, 2007.
Kato et al.: "Product Including Power Supply Circuit Board"; U.S. Appl. No. 12/234,949, filed Sep. 22, 2008.
Kato et al.: "Data Coupler"; U.S. Appl. No. 12/252,475, filed Oct. 16, 2008.
Kato et al.; "Information Terminal Device"; U.S. Appl. No. 12/267,666, filed Nov. 10, 2008.
Kato et al.: "Wireless IC Device and Wireless IC Device Composite Component"; U.S. Appl. No. 12/276,444, filed Nov. 24, 2008.
Dokai et al.: "Optical Disc"; U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System"; U.S. Appl. No. 12/274,400, filed Nov. 20, 2008.
Kato: "Wireless IC Device"; U.S. Appl. No. 11/964,185, filed Dec. 26, 2007.
Kato et al.: "Radio Frequency IC Device"; U.S. Appl. No. 12/336,629, filed Dec. 17, 2008.
Kato et al.: "Wireless IC Device and Component for Wireless IC Device"; U.S. Appl. No. 12/339,198, filed Dec. 19, 2008.
Ikemoto et al.: "Wireless IC Device"; U.S. Appl. No. 11/851,651, filed Sep. 7, 2007.
Kataya et al.: "Wireless IC Device and Electronic Device"; U.S. Appl. No. 11/851,661, filed Sep. 7, 2007.
Dokai et al.: "Antenna and Radio IC Device"; U.S. Appl. No. 12/350,307, filed Jan. 8, 2009.
Official Communication issued in International Application No. PCT/JP2007/066007, mailed on Nov. 27, 2007.
Dokai et al.: "Wireless IC Device and Component for Wireless IC Device"; U.S. Appl. No. 12/359,690, filed Jan. 26, 2009.
Dokai et al.: "Test System for Radio Frequency IC Devices and Method of Manufacturing Radio Frequency IC Devices Using the Same"; U.S. Appl. No. 12/388,826, filed Feb. 19, 2009.
Official Communication issued in International Application No. PCT/JP2008/061955, mailed on Sep. 30, 2008.
Official Communication issued in International Application No. PCT/JP2007/066721, mailed on Nov. 27, 2007.
Official Communication issued in International Application No. PCT/JP2007/070460, mailed on Dec. 11, 2007.
Kato et al.: "Wireless IC Device"; U.S. Appl. No. 12/390,556, filed Feb. 23, 2009.
Kato et al.: "Inductively Coupled Module and Item With Inductively Coupled Module"; U.S. Appl. No. 12/398,497, filed Mar. 5, 2009.
Official Communication issued in International Patent Application No. PCT/JP2008/050945, mailed on May 1, 2008.
Kato et al.: "Article Having Electromagnetic Coupling Module Attached Thereto"; U.S. Appl. No. 12/401,767, filed Mar. 11, 2009.
Taniguchi et al.: "Antenna Device and Radio Frequency IC Device"; U.S. Appl. No. 12/326,117, filed Dec. 2, 2008.
Official Communication issued in International Patent Application No. PCT/JP2008/061442, mailed on Jul. 22, 2008.
Kato et al.: "Container With Electromagnetic Coupling Module"; U.S. Appl. No. 12/426,369, filed Apr. 20, 2009.
Kato: "Wireless IC Device"; U.S. Appl. No. 12/429,346, filed Apr. 24, 2009.
Official communication issued in Japanese Application No. 2007-531524, mailed on Sep. 11, 2007.
Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Mukku-Sha, "Musen IC Tagu Katsuyo-no Subete" "(All About Wireless IC Tags"), RFID, pp. 112-126.
Dokai et al.: "Wireless IC Device and Component for Wireless IC Device"; U.S. Appl. No. 11/624,382, filed Jan. 18, 2007.
Dokai et al.: "Wireless IC Device, and Component for Wireless IC Device"; U.S. Appl. No. 11/930,818, filed Oct. 31, 2007.
Kato et al.: "Wireless IC Device"; U.S. Appl. No. 12/042,399, filed Mar. 5, 2008.
Official communication issued in related U.S. Appl. No. 12/042,399; mailed on Aug. 25, 2008.
Official Communication issued in International Patent Application No. PCT/JP2010/066291, mailed on Dec. 28, 2010.
Ikemoto: "Communication Terminal and Information Processing System"; U.S. Appl. No. 13/432,002, filed Mar. 28, 2012.
Official Communication issued in International Patent Application No. PCT/JP2010/070767, mailed on Feb. 22, 2011.
Ieki et al.: "Transceiver and Radio Frequency Identification Tag Reader"; U.S. Appl. No. 13/437,978, filed Apr. 3, 2012.
Official Communication issued in International Patent Application No. PCT/JP2011/065431, mailed on Oct. 18, 2011.
Kato et al.: "Wireless IC Device"; U.S. Appl. No. 13/470,486, filed May 14, 2012.
Kato: "Wirless IC Device"; U.S. Appl. No. 12/789,610, filed May 28, 2010.
Kato: "Antenna and RFID Device"; U.S. Appl. No. 13/472,520, filed May 16, 2012.
Kato et al.: "Wireless IC Device and Component for Wireless IC Device"; U.S. Appl. No. 13/540,694, filed Jul. 3, 2012.
Dokai et al.: "Wireless IC Device and Component for Wireless IC Device"; U.S. Appl. No. 13/567,109, filed Aug. 6, 2012.
Official Communication issued in International Patent Application No. PCT/JP2009/056934, mailed on Jun. 30, 2009.
Kato et al.: "Wireless IC Device"; U.S. Appl. No. 12/903,242, filed Oct. 13, 2010.
Kato et al.: "Wireless IC Device"; U.S. Appl. No. 12/940,103, filed Nov. 5, 2010.
Kato et al.: "Wireless IC Device System and Method of Determining Authenticity of Wireless IC Device"; U.S. Appl. No. 12/940,105, filed Nov. 5, 2010.

(56) References Cited

OTHER PUBLICATIONS

Official Communication issued in International Patent Application No. PCT/JP2009/059669, mailed on Aug. 25, 2009.
Official Communication issued in International Patent Application No. PCT/JP2009/062181, mailed on Oct. 13, 2009.
Official Communication issued in corresponding Japanese Application No. 2010-501323, mailed on Apr. 6, 2010.
Kato et al.: "Component of Wireless IC Device and Wireless IC Device"; U.S. Appl. No. 12/944,099; filed Nov. 11, 2010.
Kato et al.: Wireless IC Device and Manufacturing Method Thereof; U.S. Appl. No. 12/961,599, filed Dec. 7, 2010.
Kataya et al.: "Radio Frequency IC Device and Electronic Apparatus"; U.S. Appl. No. 12/959,454, filed Dec. 3, 2010.
Ikemoto et al.:"Radio IC Device"; U.S. Appl. No. 12/981,582, filed Dec. 30, 2010.
Official Communication issued in International Patent Application No. PCT/JP2009/062801, mailed on Oct. 27, 2009.
Ikemoto et al.: "Wireless IC Device and Electronic Apparatus"; U.S. Appl. No. 13/022,695, filed Feb. 8, 2011.
Official Communication issued in International Patent Application No. PCT/JP2009/067778, mailed on Jan. 26, 2010.
Kato: "Wireless IC Device and Method for Manufacturing Same"; U.S. Appl. No. 13/022,693, filed Feb. 8, 2011.
Kato: "Wireless IC Device"; U.S. Appl. No. 13/080,781, filed Apr. 6, 2011.
Official Communication issued in International Patent Application No. PCT/JP2008/063025, mailed on Aug. 12, 2008.
Kato et al.: "Wireless IC Device," U.S. Appl. No. 12/603,608, filed Oct. 22, 2009.
Kato et al.: "Wireless IC Device," U.S. Appl. No. 12/688,072, filed Jan. 15, 2010.
Official Communication issued in International Patent Application No. PCT/JP2009/053693, mailed on Jun. 9, 2009.
Kato: "Composite Antenna," U.S. Appl. No. 12/845,846, filed Jul. 29, 2010.
Official Communication issued in International Patent Application No. PCT/JP2009/053690, mailed on Jun. 2, 2009.
Kato et al.: "Radio Frequency IC Device and Radio Communication System," U.S. Appl. No. 12/859,340, filed Aug. 19, 2010.
Official Communication issued in International Patent Application No. PCT/JP2009/055758, mailed on Jun. 23, 2009.
Kato et al.: "Wireless IC Device," U.S. Appl. No. 12/859,880, filed Aug. 20, 2010.
Official Communication issued in International Patent Application No. PCT/JP2009/057482, mailed on Jul. 21, 2009.
Kataya et al.: "Wireless IC Device, Electronic Apparatus, and Method for Adjusting Resonant Frequency of Wireless IC Device," U.S. Appl. No. 12/861,945, filed Aug. 24, 2010.
Kato: "Wireless IC Device and Electromagnetic Coupling Module," U.S. Appl. No. 12/890,895, filed Sep. 27, 2010.
Official Communication issued in International Patent Application No. PCT/JP2009/059410, mailed on Aug. 4, 2009.
Kato et al.: "Wireless IC Device" U.S. Appl. No. 12/902,174, filed Oct. 12, 2010.
Official Communication issued in International Patent Application No. PCT/JP2009/059259, mailed on Aug. 11, 2009.
Official Communication issued in corresponding Japanese Patent Application No. 2010-506742, mailed on Apr. 6, 2010.
Official Communication issued in International Patent Application No. PCT/JP2009/056698, mailed on Jul. 7, 2009.

* cited by examiner

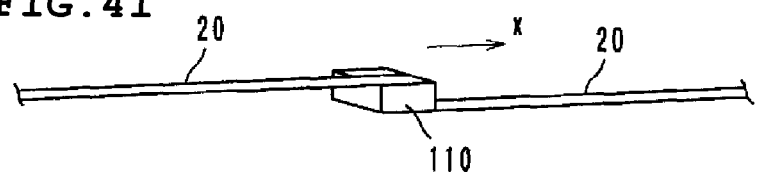
FIG. 41
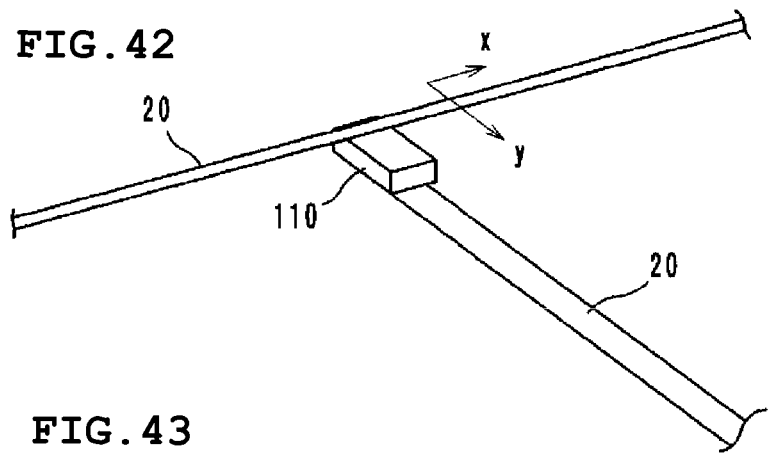
FIG. 42
FIG. 43
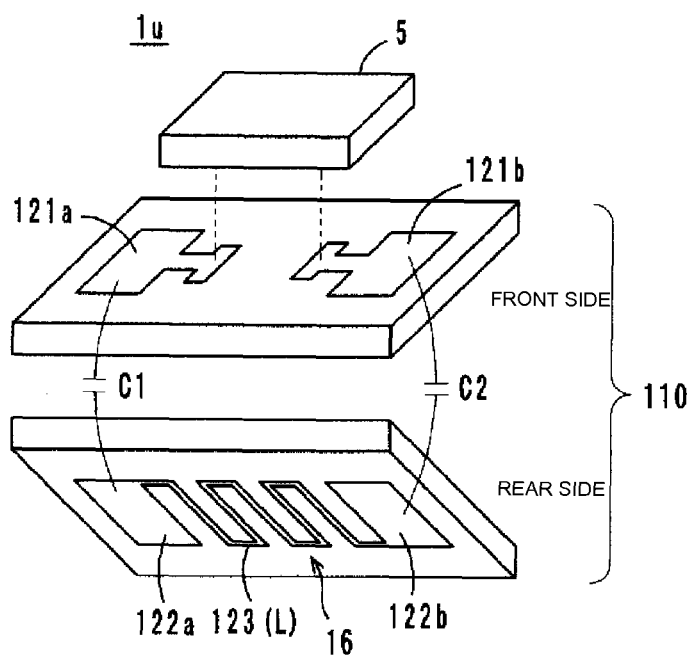

RADIATION PATTERN SIDE

RADIATION PATTERN SIDE

WIRELESS IC DEVICE AND COMPONENT FOR WIRELESS IC DEVICE

BACKGROUND OF THE INVENTION

1. Field of the Invention

The present invention relates to a wireless IC device, and particularly, to a wireless IC device used for an RFID (Radio Frequency Identification) system, and a component used for the wireless IC device.

2. Description of the Related Art

In recent years, for an inventory item management system, an RFID system has been developed which includes a reader/writer for generating a dielectric magnetic field and an IC tag (hereafter, referred to as wireless IC device) for storing predetermined information about an inventory item which communicate with one another via a non-contact method, thereby transmitting information. Known wireless IC devices used in RFID systems are described in Japanese Unexamined Patent Application Publication No. 2005-136528 (Patent Document 1) and Japanese Unexamined Patent Application Publication No. 2005-244778 (Patent Document 2), for example.

The wireless IC device shown in FIG. 59 includes an antenna pattern 301 provided on a plastic film 300, and a wireless IC chip 310 is attached to one end of the antenna pattern 301, and the wireless IC device shown in FIG. 60 includes an antenna pattern 321 and a radiation electrode 322 provided on a plastic film 320, and a wireless IC chip 310 is attached to a predetermined portion of the antenna pattern 321.

However, with the conventional wireless IC devices, the wireless IC chip 310 is connected to and mounted on the antenna pattern 301 or 321 using an Au bump in a DC manner. Thus, it is necessary to determine the position of the small wireless IC chip 310 on the film 300 or 320 having a large area. However, it is extremely difficult to mount the wireless IC chip 310 on the large-area film 300 or 320. Thus, positional deviation at the time of mounting causes the resonant frequency properties at the antenna to be changed. The resonant frequency properties at the antenna are also changed by the antenna pattern 301 or 321 being rounded, or being sandwiched between dielectric members (e.g., inserted into a book).

SUMMARY OF THE INVENTION

To overcome the problems described above, preferred embodiments of the present invention provide a wireless IC device having stable frequency properties, and components which can be used for the wireless IC device.

A wireless IC device according to a first preferred embodiment of the present invention includes a wireless IC chip, a power supply circuit board connected to the wireless IC chip and including a power supply circuit which includes a resonant circuit having a predetermined resonant frequency, a radiation pattern, to which the power supply circuit board is attached or disposed adjacent, the radiation pattern being arranged to radiate a transmission signal supplied from the power supply circuit, and/or to receive a reception signal and supply the reception signal to the power supply circuit.

With the wireless IC device according to the first preferred embodiment, the wireless IC chip and the power supply circuit board are disposed on a wiring board so as to be substantially parallel to one another, and are connected via a conductor disposed on the wiring board.

A wireless IC device according to a second preferred embodiment includes a wireless IC chip, a power supply circuit board upon which the wireless IC chip is mounted and having a power supply circuit which includes a resonant circuit having a predetermined resonant frequency, and a radiation pattern to which the power supply circuit board is attached or disposed adjacent, the radiation pattern being arranged to radiate a transmission signal supplied from the power supply circuit, and/or to receive a reception signal and supply the reception signal to the power supply circuit.

With the wireless IC devices according to the first and second preferred embodiments of the present invention, the frequency of the transmission signal radiated from the radiation pattern, and the frequency of the reception signal supplied to the wireless IC chip are substantially determined by the resonant frequency of the resonant circuit in the power supply circuit board. The term "substantially determined" is used due to the frequency being minutely shifted due to the positional relationship between the power supply circuit board and the radiation pattern in some cases. That is to say, the frequencies of the transmission and reception signals are determined by the power supply circuit board, so that the frequency properties thereof are not changed regardless of the shape, size, and placement position of the radiation pattern, e.g., even if the wireless IC device is rounded, or sandwiched between dielectric members. Consequently, stable frequency properties are obtained.

With the wireless IC device according to the second preferred embodiment, the wireless IC chip is mounted on the power supply circuit board, and provided on the radiation pattern via the power supply circuit board. The power supply circuit board is considerably smaller in area as compared to the radiation pattern, such that the wireless IC chip can be mounted on the power supply circuit board with extremely high precision.

With the wireless IC devices according to the first and second preferred embodiments, the radiation pattern may be disposed on both sides of the power supply circuit board. Energy radiated from the power supply circuit can be propagated along both sides of the radiation pattern by sandwiching the power supply circuit board with the two radiation patterns, thereby improving gain.

The resonant circuit may be a distributed-constant-type resonant circuit, or a concentrated-constant-type resonant circuit including a capacitor pattern and an inductor pattern. The distributed-constant-type resonant circuit includes an inductor defined by a strip line or other suitable structure. Particularly, design of the resonant circuit is facilitated when the transmission and reception signals are included in a high-frequency band not less than 5 GHz. Therefore, the distributed-constant-type resonant circuit is advantageous.

The concentrated-constant-type resonant circuit may be an LC series resonant circuit or LC parallel resonant circuit, or may be configured so as to include multiple LC series resonant circuits or multiple LC parallel resonant circuits. When the resonant circuit is defined by the concentrated-constant-type resonant circuit including a capacitor pattern and an inductor pattern, the resonant circuit can be readily designed in a low-frequency band not greater than 5 GHz where the transmission and reception signals are included, and the resonant circuit is not affected by influences from other devices, such as a radiation pattern. When the resonant circuit includes multiple resonant circuits, the respective resonant circuits are coupled, thereby widening the bandwidth of the transmission signal.

Also, when the capacitor pattern is disposed downstream of the wireless IC chip and between the wireless IC chip and the inductor pattern, surge resistance improves. A surge is a low-frequency current up to about 200 MHz, which can be reduced by a capacitor or other suitable element, and the surge breakdown of the wireless IC chip can be prevented.

The capacitor pattern and the inductor pattern may be arranged substantially in parallel to the radiation pattern. That is to say, the capacitor pattern and the inductor pattern are not disposed along a straight line on which the radiation pattern is disposed, such that the electric field formed by the capacitor pattern, and the magnetic field formed by the inductor pattern are directly applied to the radiation pattern, and thus, the magnetic field formed by the inductor pattern is not obstructed by the capacitor pattern, whereby radiant efficiency from the inductor pattern is improved. Further, a reflector and/or wave director may be disposed at a portion where the magnetic field is formed by the inductor pattern. Thus, the radiation properties and directivity from the power supply circuit to the radiation pattern are easily adjusted, and external electromagnetic influence is eliminated to the greatest extent possible so as to obtain stability of the resonant properties.

The power supply circuit board may be a multilayer board in which multiple dielectric layers or multiple magnetic layers are stacked, and the capacitor pattern and the inductor pattern are disposed on the surface and/or inside the multilayer board. The resonant circuit includes a multilayer board, whereby the devices (electrode patterns, etc.) defining the resonant circuit can be provided not only on the surface but also inside of the board. Thus, the size of the board can be reduced. In addition, flexibility of the layout of the resonant circuit device is improved, and the capabilities of the resonant circuit are enhanced. The multilayer board may be a resin multilayer board including multiple stacked resin layers, or may be a ceramic multilayer board including multiple stacked ceramic layers. The multilayer board may be a thin-film multilayer board using a thin-film forming technology. When using the ceramic multilayer board, ceramic layers are preferably made of a low-temperature sintering ceramic material, such that silver or copper having low resistance values can be used as a resonant circuit member.

On the other hand, the power supply circuit board may be a dielectric or magnetic single-layer board, and the capacitor pattern and/or inductor pattern are provided on the surface of the single-layer board. The material of the single-layer board may be a resin or ceramic. The capacitance by the capacitor pattern may be provided between the plane-shaped electrodes provided on both sides of the single-layer board, or may be provided between the electrodes disposed substantially in parallel on one side of the single-layer board.

The power supply circuit board is preferably a rigid board. With a rigid board, even if the wireless IC device is adhered to any shaped inventory item, the frequency of the transmission signal is stabilized. Moreover, the wireless IC chip can be mounted on a rigid board in a stabilized manner. On the other hand, the radiation pattern is preferably made of a flexible metal film. The wireless IC device can be adhered to any shaped articles as long as the radiation pattern is flexible.

Furthermore, when the flexible metal film is retained in a flexible resin film, the wireless IC device itself is easily handled. Particularly, when the wireless IC chip, power supply circuit board, and radiation pattern are covered by the film, these components are protected from the external environment.

Incidentally, the electric length of the radiation pattern is preferably an integer multiple of a half wavelength of the resonant frequency, whereby gain is increased to the greatest extent. However, the frequency is substantially determined by the resonant circuit, so that it is not required that the electric length of the radiation pattern be an integer multiple of a half wavelength of the resonant frequency. This is an advantage as compared to a wireless ID device in which the radiation pattern is an antenna device having a particular resonant frequency.

Also, various arrangements may be used for the connection between the wireless IC chip and the power supply circuit board. For example, an arrangement may be used in which the wireless IC chip is provided with a chip-side electrode pattern, the power supply circuit board is provided with a first-board-side electrode pattern, and the chip-side electrode pattern and the first-board-side electrode pattern are connected by DC connection. In this case, the connection may be made by soldering, an electroconductive resin, or gold bump, for example.

Alternatively, the chip-side electrode pattern and the first-board-side electrode pattern may be connected with capacitive coupling or magnetic coupling. When the connection is with capacitive coupling or magnetic coupling, soldering or an electroconductive resin is not required, but an adhesive agent such as a resin or other suitable agent is preferably used for adhesion. In this case, the chip-side electrode pattern and the first-board-side electrode pattern need not be formed on the surface of the wireless IC chip, and on the surface of the power supply circuit board. For example, a resin film may be formed on the surface of the chip-side electrode pattern, or the first-board-side electrode pattern may be formed on an inner layer of the multilayer board.

With capacitive coupling, the area of the first-board-side electrode pattern is preferably greater than the area of the chip-side electrode pattern. Even if the positional accuracy varies somewhat at the time of mounting the wireless IC chip on the power supply circuit board, variations in capacitance between both electrode patterns are greatly reduced. Moreover, it is difficult to form an electrode pattern having a large area on the small wireless IC chip. However, the power supply circuit board is relatively large. Thus, an electrode pattern having a large area can be formed without any obstructions.

With magnetic coupling, the required accuracy for mounting the wireless IC chip to the power supply circuit board is not as high as that with capacitive coupling, which further facilitates mounting. Also, the chip-side electrode pattern and the first-board-side electrode pattern are preferably coil-shaped electrode patterns. In this case, a coil-shaped electrode pattern such, as spiral, helical or other suitable shape facilitates design. With a high frequency, a meander-shaped electrode pattern is preferable.

On the other hand, various types of arrangements may be used for the connection between the power supply circuit board and the radiation pattern. For example, the power supply circuit board may be provided with a second-board-side electrode pattern, and the second-board-side electrode pattern and the radiation pattern may be connected by DC connection. In this case, connection can be made using soldering, an electroconductive resin, gold bump, or other suitable method.

Alternatively, the second-board-side electrode pattern and the radiation pattern may be connected with capacitive coupling or magnetic coupling. With capacitive coupling or magnetic coupling, it is not necessary to use soldering or an electroconductive resin, however an adhesive agent such as a resin or other suitable agent must be used for adhesion. In this case, it is also unnecessary for the second-board-side electrode pattern to be formed on the surface of the power supply circuit board. For example, the second-board-side electrode pattern may be formed on an inner layer of the multilayer board.

With magnetic coupling, the second-board-side electrode pattern is preferably a coil-shaped electrode pattern. A coil-shaped electrode pattern, such as spiral, helical, or other suitable shape facilitates control of magnetic flux, thereby facilitating design. With a high frequency, a meander-shaped electrode pattern may be provided. With magnetic coupling, it is preferable not to obstruct variations of magnetic flux that occur at the second-board-side electrode pattern (coil-shaped electrode pattern), for example, it is preferable to provide an opening portion in the radiation pattern. Thus, the propagation efficiency of signal energy is improved, and a frequency shift due to adhesion between the power supply circuit board and the radiation pattern is reduced.

When the second-board-side electrode pattern is a coil-shaped electrode pattern, the winding axis thereof may be arranged substantially parallel or substantially perpendicular to the radiation pattern. With the latter, the winding width of the coil-shaped electrode pattern is preferably configured so as to gradually increase toward the radiation pattern.

With the wireless IC devices according to the first and second preferred embodiments, if the radiation pattern is a both-side (both-end) open type radiation pattern including a radiation portion for performing exchange of external transmission/reception signals, and a power supply portion for performing exchange of a transmission/reception signal with the power supply circuit (resonant circuit), antenna gain is improved by the radiation portion, whereby even a small power supply circuit pattern obtains sufficient gain, the wireless IC device operates with at a sufficient distance from the reader/writer, and even a frequency band not less than the UHF band is sufficient for use. Also, the resonant frequency is primarily determined by the power supply circuit pattern, the shape of the radiation portion can be varied, gain can be adjusted by the size of the radiation portion, and the center frequency can be finely adjusted with the shape of the radiation portion.

In addition, at least a portion of the power supply portion of the radiation pattern is arranged so as to be disposed within the projection plane of the power supply circuit pattern, and the area of the power supply portion may be less than the area of the projection plane of the power supply circuit pattern. Here, the term "projection plane" means a plane surrounded by the outline of the power supply circuit pattern, and the term "the area of the power supply portion" means the area of the metal portion of the radiation pattern. When the power supply portion of the radiation pattern and the power supply circuit pattern are coupled via magnetic field, when the area of the power supply portion is less than the area of the projection plane of the power supply circuit pattern, a portion obstructing the magnetic flux of the power supply circuit pattern is reduced, whereby the propagation efficiency of signals improves.

Furthermore, with the power supply portion, the length of the longitudinal direction thereof may be arranged, for example, in a straight-line shape so as to cross the projection plane of the power supply circuit pattern. The radiation portion of the radiation pattern may be provided on both end sides of the power supply portion, or may be provided on one end side of the power supply portion. When the radiation portion is provided on both end sides of the power supply portion, the capacitive connectivity to the power supply circuit pattern is strong. When the radiation portion is provided on only one end side of the power supply portion, the magnetic connectivity to the power supply circuit pattern is strong, and gain increases.

Also, multiple power supply circuit patterns may be formed on the power supply circuit board, and the power supply portion of the radiation pattern is preferably disposed between the respective projection planes of the multiple power supply patterns. With the power supply portion, the length of the longitudinal direction thereof may be formed, for example, in a straight-line shape so as to cross the respective projection planes of the multiple power supply circuit patterns. When the power supply portion is disposed between the multiple power supply circuit patterns, the amount of electric power supply between the power supply portion and the power supply circuit pattern increases.

The radiation pattern may be formed within a x-y plane, and may include the radiation portion extending in the X-axis direction and Y-axis direction. Thus, circularly-polarized waves can be received, and antenna gain improves. On the other hand, the radiation pattern may include the radiation portion extending in the X-axis direction, Y-axis direction, and Z-axis direction, in an x-y-z space. In the event that the radiation portion extends three-dimensionally, transmission/reception can be performed effectively in any direction.

Also, the radiation portion of the radiation pattern may extend in a substantially perpendicular direction relative to the plane of the power supply circuit pattern. That is to say, the power supply portion may be provided within a plane which is the tip of the needle-shaped radiation portion, and is substantially perpendicular to the radiation portion, and this power supply portion and the power supply circuit pattern may be connected via electric field or magnetic field. Thus, the wireless IC device can be attached to an article such that the needle-shaped radiation portion is inserted into the inventory item.

The power supply portion and the power supply circuit pattern may be covered with a magnetic member. Thus, leakage of electromagnetic energy is prevented, and the coupling between the power supply portion and the power supply circuit pattern is improved, which produces improved antenna gain.

A component for a wireless IC device according to a third preferred embodiment includes a wireless IC chip, and a power supply circuit board including a power supply circuit, the power supply circuit board being connected to the wireless IC chip, and including a resonant circuit having a predetermined resonant frequency.

A component for a wireless IC device according to a fourth preferred embodiment includes a wireless IC chip, and a power supply circuit board mounting the wireless IC chip, the power supply circuit board including a power supply circuit and a resonant circuit having a predetermined resonant frequency.

According to the first and second preferred embodiments, the wireless IC chip can be mounted on the wiring board or power supply circuit board with extremely high precision. Also, the frequency of a transmission or reception signal is determined by the power supply circuit provided on the power supply circuit board, whereby stable frequency properties are obtained without changing the frequency properties, even if the wireless IC device is rounded, or sandwiched between dielectric members.

According to the third and fourth preferred embodiments, the wireless IC devices according to the first and second preferred embodiments are appropriately configured.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIGS. 9A and 9B illustrate a third preferred embodiment of the wireless IC device according to the present invention, wherein FIG. 9A is a plan view in a developed state, and FIG. 9B is a perspective view at the time of usage.

FIG. 34A is a bottom view, and FIG. 34B is an enlarged cross-sectional view.

FIG. 41 is a perspective view illustrating a first arrangement with the modification example illustrated in FIG. 40.

FIG. 42 is a perspective view illustrating a second arrangement with the modification example illustrated in FIG. 40.

FIG. 43 is an exploded perspective view illustrating a twenty-first preferred embodiment of the wireless IC device according to the present invention.

DETAILED DESCRIPTION OF PREFERRED EMBODIMENTS

Figure 1:
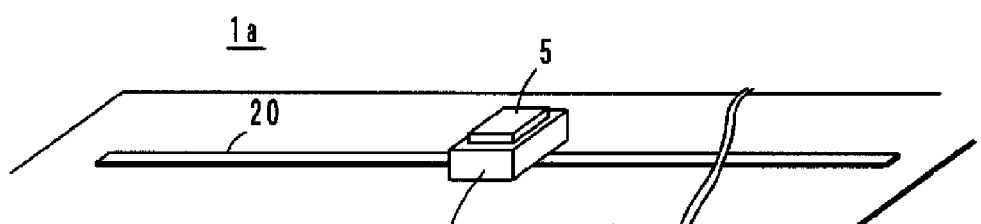
FIG. 1 is a perspective view illustrating a first preferred embodiment of the wireless IC device according to the present invention.

Description will be made below regarding preferred embodiments of the wireless IC device according to the present invention with reference to the drawings. Note that the common parts and portions of each of the preferred embodiments described below are denoted with the same reference numerals, and redundant description thereof will be omitted.

First Preferred Embodiment

Figure 2:
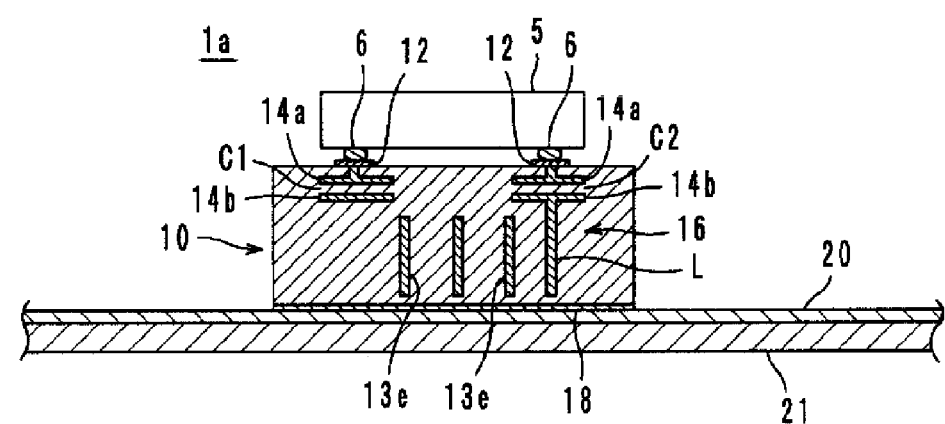
FIG. 2 is a cross-sectional view of the first preferred embodiment of the present invention.

A wireless IC device 1a according to the first preferred embodiment is a monopole type, as illustrated in FIG. 1 and FIG. 2, and includes a wireless IC chip 5, a power supply circuit board 10 mounted on the wireless IC chip 5, and a radiation pattern 20 bonding the power supply circuit board 10. The wireless IC chip 5 includes a clock circuit, a logic circuit, and a memory circuit, stores necessary information therein, and is subjected to direct DC connection with a power supply circuit 16 provided in the power supply circuit board 10.

The power supply circuit 16 is a circuit for supplying a transmission signal having a predetermined frequency to the radiation pattern 20, and/or a circuit for selecting a reception signal having a predetermined frequency from signals received at the radiation pattern 20, and supplying it to the wireless IC chip 5, and includes a resonant circuit for resonating with the frequency of a transmission/reception signal.

Figure 3:
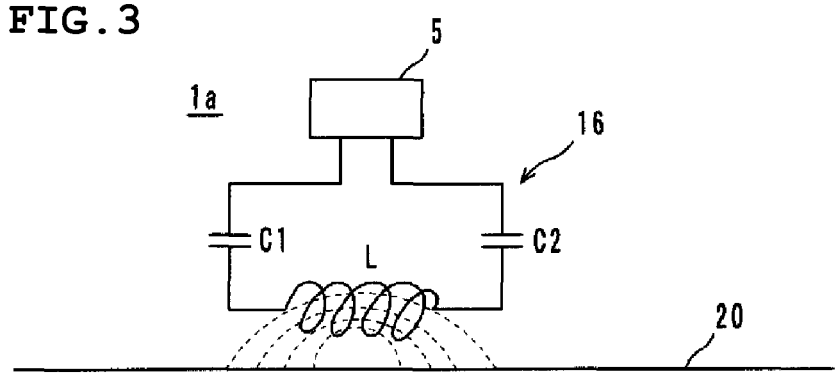
FIG. 3 is an equivalent circuit diagram of the first preferred embodiment of the present invention.
Figure 4:
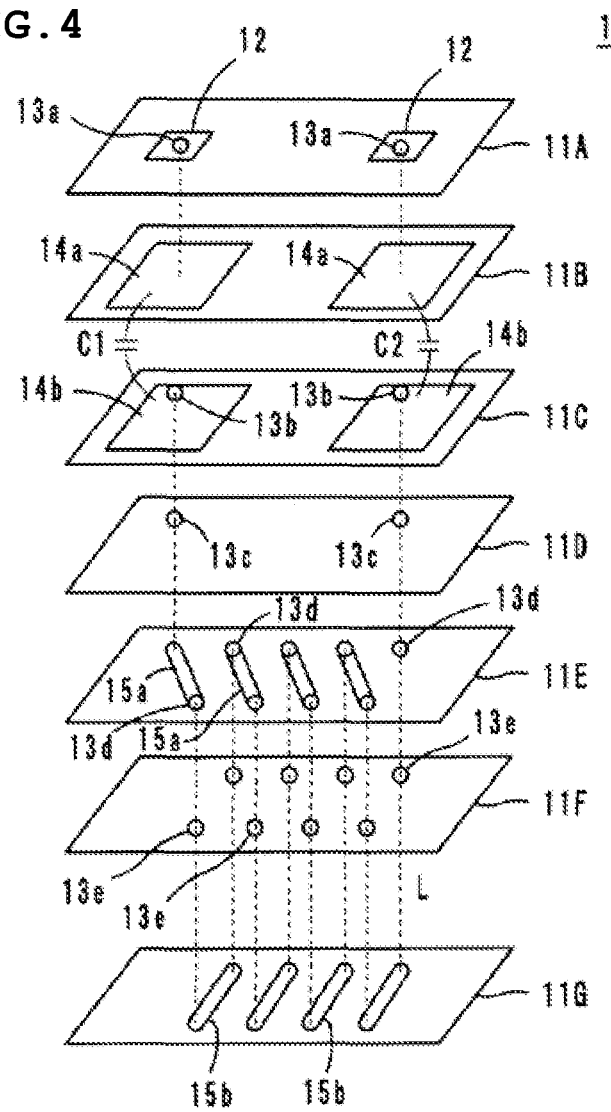
FIG. 4 is an exploded perspective view illustrating the power supply circuit board of the first preferred embodiment of the present invention.

As illustrated in FIG. 2 and FIG. 3, the power supply circuit board 10 includes the power supply circuit 16 built therein defined by a concentrated-constant-type LC series resonant circuit including a helical-type inductor device L and capacitance devices C1 and C2. Specifically, as illustrated in FIG. 4, the power supply circuit board 10 is obtained by layering, pressure-bonding, and sintering ceramic sheets 11A through 11G each having a dielectric member, and includes the sheet 11A forming electrodes for connection 12, and via hole conductors 13a, the sheet 11B forming capacitance electrodes 14a, the sheet 11C forming capacitor electrodes 14b and via hole conductors 13b, the sheet 11D forming via hole conductors 13c, the sheet 11E forming conductor patterns 15a and via hole conductors 13d, the sheet 11F forming via hole conductors 13e (one sheet or multiple sheets), and the sheet 11G forming conductor patterns 15b. Note that each of the ceramic sheets 11A through 11G may be a sheet made of a magnetic ceramic material, and the power supply circuit board 10 can be easily obtained using a multilayer board manufacturing process, such as a sheet layering method, a thick-film printing method, or the like, which have been conventionally used.

The sheets 11A through 11G are layered, thereby forming the inductance device L of which a helical winding axis is substantially parallel to the radiation pattern 20, and the capacitance devices C1 and C2 wherein the capacitor electrodes 14b are connected to both ends of the inductance device L, and the capacitor electrodes 14a are connected to the electrodes for connection 12 via the via hole conductors 13a. The electrodes for connection 12, which are board-side electrode patterns, are connected to the chip-side electrode pattern (not shown) of the wireless IC chip 5 via a soldering bump 6 using DC connection.

That is to say, of the devices of the power supply circuit 16, a transmission signal is fed from the inductance device L which is a coil-shaped electrode pattern to the radiation pattern 20 via magnetic filed, and also a reception signal from the radiation pattern 20 is fed to the inductance device L via magnetic field. Therefore, with the power supply circuit board 10, in the inductance device L and the capacitance devices C1 and C2, which make up the resonant circuit, it is preferable that the inductance device L is disposed so as to be closer to the radiation pattern 20.

The radiation pattern 20 is a long member made of a non-magnetic member such as aluminum foil, copper foil, or other suitable member, i.e., a both-end-open-type metal member, and is formed on an insulating flexible resin film 21, such as PET or other suitable resin film. With the power supply circuit board 10, the lower side thereof is adhered to the radiation pattern 20 via an insulating adhesive layer made of an adhesive agent 18.

To show one example from the perspective of sizes, the thickness of the wireless IC chip 5 is about 50 μm to about 100 μm, the thickness of the soldering bump 6 is about 20 μm, the thickness of the power supply circuit board 10 is about 200 μm to about 500 μm, the thickness of the adhesive agent 18 is about 0.1 μm to about 10 μm, the thickness of the radiation pattern 20 is about 1 μm to about 50 μm, and the thickness of the film 21 is about 10 μm to about 100 μm. Also, the area of the wireless IC chip 5 can be varied, such as 0.4 mm×0.4 mm, 0.9 mm×0.8 mm, and so forth. The area of the power supply circuit board 10 can be from approximately the same size as the wireless IC chip 5 to about 3 mm×3 mm.

Figure 5A:
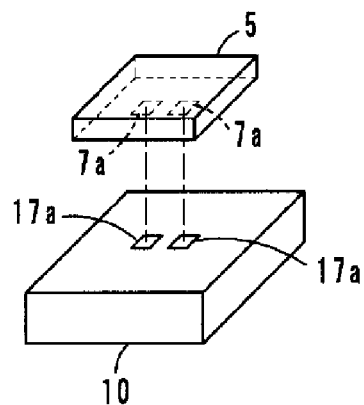
FIGS. 5A and 5B are perspective views illustrating connection arrangements between a wireless IC chip and the power supply circuit board.
Figure 5B:
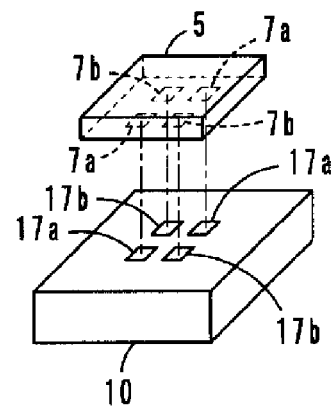

FIGS. 5A and 5B illustrate connection arrangements between the wireless IC chip 5 and the power supply circuit board 10. FIG. 5A illustrates a connection arrangement wherein one pair of antenna (balance) terminals 7a and 17a are provided on the rear side of the wireless IC chip 5 and the front side of the power supply circuit board 10 respectively. FIG. 5B illustrates another connection arrangement wherein ground terminals 7b and 17b are provided at the rear side of the wireless IC chip 5 and the front side of the power supply circuit board 10, respectively, in addition to the pair of antenna (balance) terminals 7a and 17a. However, the ground terminals 17b of the power supply circuit board 10 are terminated, and are not connected to another device of the power supply circuit board 10.

Figure 6:
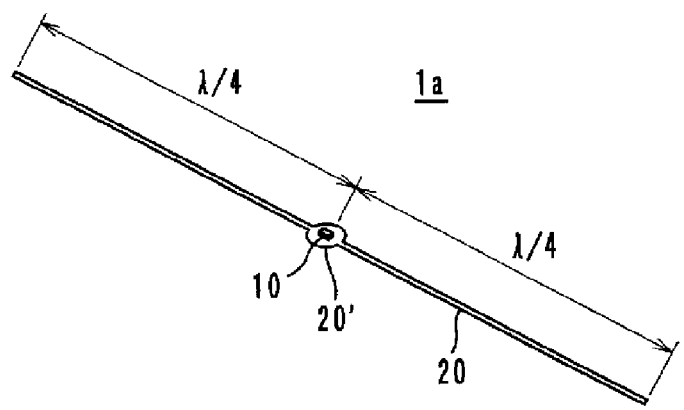
FIG. 6 is a perspective view illustrating modification example 1 of the radiation pattern.
Figure 7:
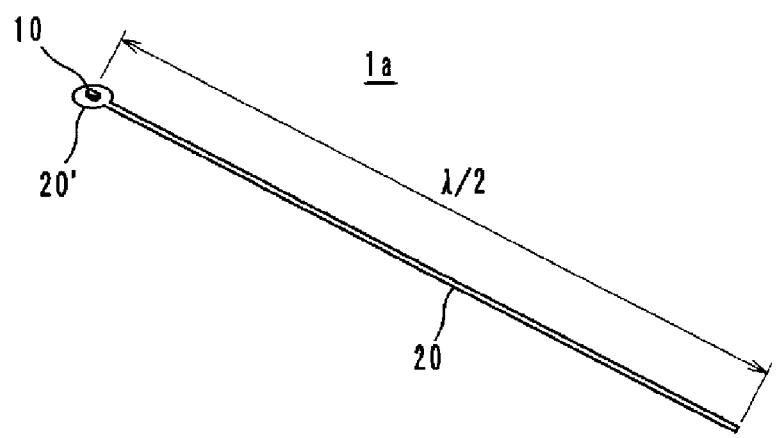
FIG. 7 is perspective view illustrating modification example 2 of the radiation pattern.

Also, as illustrated in FIG. 6 and FIG. 7, it is preferable that the radiation pattern 20 has a slender shape, and the area of a portion 20' to which the power supply circuit board 10 is adhered is greater than the board 10. It is not necessary to determine precise positional accuracy at the time of adhesion, and stable electric properties can be obtained.

FIG. 3 illustrates the equivalent circuit of the wireless IC chip device 1a. With this wireless IC device 1a, a high-frequency signal (e.g., UHF frequency band) radiated from the unshown reader/writer is received at the radiation pattern 20, the power supply circuit 16 (the LC series resonant circuit including the inductance device L and the capacitance devices C1 and C2) that is primarily magnetically-coupled with the radiation pattern 20 is resonated, and only the reception signal having a predetermined frequency band is supplied to the wireless IC chip 5. On the other hand, predetermined energy is extracted from this reception signal, the information stored in the wireless IC chip 5 is received as an input signal, and reflection modulation is performed on this input signal with that energy as a driving source to obtain a transmission signal, and the transmission signal is subjected to matching with a predetermined frequency at the power supply circuit 16, following the transmission signal is propagated from the inductance device L of the power supply circuit 16 to the radiation pattern 20 via magnetic coupling, and is transmitted and transferred from the radiation pattern 20 to the reader/writer.

Note that coupling between the power supply circuit 16 and the radiation pattern 20 is primarily coupling via magnetic field, but coupling via electric field may be provided (electromagnetic coupling).

With the wireless IC device 1a according to the first preferred embodiment, the wireless IC chip 5 is directly DC-connected on the power supply circuit board 10 including the power supply circuit 16, the power supply circuit board 10 has substantially the same area as the wireless IC chip 5, and is rigid, so the wireless IC chip 5 can be precisely positioned and mounted thereupon as compared to mounting it on a flexible film having a wide area in the conventional manner. Moreover, the power supply circuit board 10 is preferably made of a ceramic material, and has thermal resistance, whereby the wireless IC chip 5 can be soldered to the power supply circuit board 10. That is to say, an expensive ultrasonic bonding method as is conventional is not used, and there is no danger that the wireless IC chip 5 is damaged with pressure applied during ultrasonic bonding. Instead, a self alignment operation using a soldering flow can be used.

With the power supply circuit 16, resonant frequency properties are determined by the resonant circuit including the inductance device L and the capacitance devices C1 and C2. The resonant frequency of the signal radiated from the radiation pattern 20 is substantially equivalent to the self resonant frequency of the power supply circuit 16, and the maximum gain of the signal is substantially determined by at least one of the size and shape of the power supply circuit 16, and the distance and medium between the power supply circuit 16 and the radiation pattern 20. Specifically, with the first preferred embodiment, the electric length of the radiation pattern 20 is set to approximately half of a resonant frequency $\lambda$. However, the electric length of the radiation pattern 20 may not be an integer multiple of $\lambda/2$. That is to say, with the present invention, the frequency of the signal radiated from the radiation pattern 20 is substantially determined by the resonant frequency of the resonant circuit (power supply circuit 16). Thus, frequency properties are not substantially dependent on the electric length of the radiation pattern 20. It is preferable that the electric length of the radiation pattern 20 be an integer multiple of $\lambda/2$ so as to maximize gain.

As described above, the resonant frequency properties of the power supply circuit 16 are determined by the resonant circuit including the inductance device L and the capacitance devices C1 and C2, which are disposed in the power supply circuit board 10, so the resonant frequency properties are not varied even if the wireless IC device 1a is inserted in a book. Also, the resonant frequency properties are not varied even if the wireless IC device 1a is rounded to change the shape of the radiation pattern 20, or the size of the radiation pattern 20 is changed. Also, with a coil-shaped electrode pattern defining the inductance device L, the winding axis thereof is substantially parallel to the radiation pattern 20, such that the center frequency is not varied. Also, the capacitance devices C1 and C2 are inserted downstream of the wireless IC chip 5, such that a low-frequency surge is prevented with these devices C1 and C2, and the wireless IC chip 5 is protected from a surge.

Further, the power supply circuit board 10 is a rigid multilayer board, so that it is easy to handle when soldering the wireless IC chip 5. Moreover, the radiation pattern 20 is made of a flexible metal film supported by the flexible film 21, so as to be easily adhered to a cylindrical member, for example, such as a plastic-film flexible bag or plastic bottle without any obstructions.

Note that with the present invention, the resonant circuit may also function as a matching circuit for performing matching between the impedance of the wireless IC chip and the impedance of the radiation pattern. Alternatively, the power supply circuit board may further include a matching circuit provided separately from the resonant circuit including the inductance device and the capacitance devices. When adding the function of the matching circuit to the resonant circuit, design of the resonant circuit is complex. By providing the matching circuit separately from the resonant circuit, the resonant circuit and the matching circuit can be independently designed.

Second Preferred Embodiment

Figure 8:
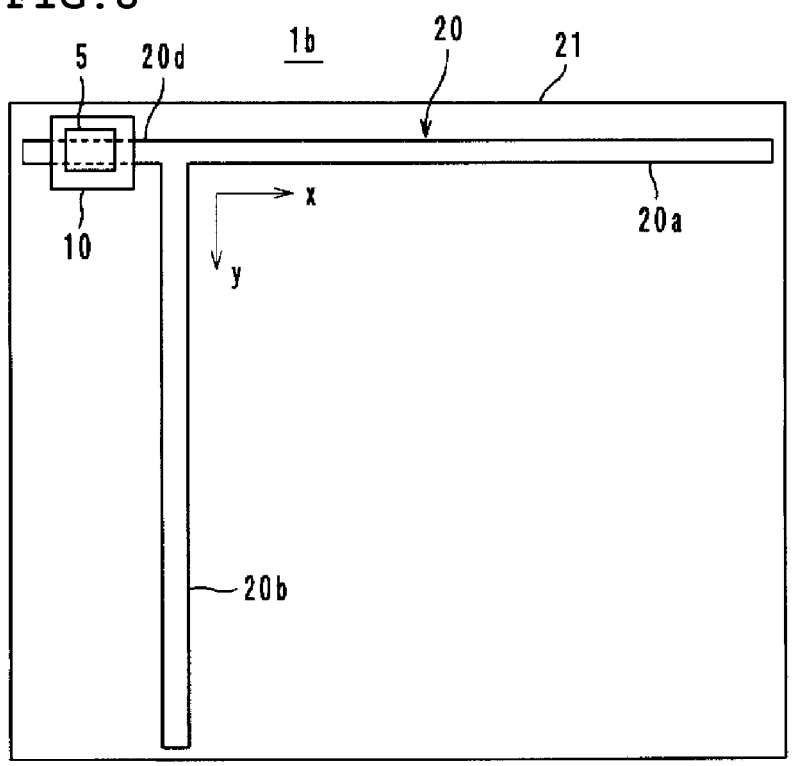
FIG. 8 is a plan view illustrating a second preferred embodiment of the wireless IC device according to the present invention.

A wireless IC device 1b according to a second preferred embodiment is obtained by branching the radiation pattern 20 ninety degrees as shown in FIG. 8. That is to say, the radiation pattern 20 includes a radiation portion 20a extending in the X-axis direction within an x-y plane, and a radiation portion 20b extending in the Y-axis direction, a portion above the extension of the radiation portion 20a defines a power supply portion 20d, and the power supply circuit board 10, on which the wireless IC chip 5 is mounted, is adhered to the power supply portion 20d.

Note that the internal configuration of the power supply circuit board 10 is preferably the same as that in the first preferred embodiment, and the operations and advantages of the present second preferred embodiment are substantially the same as those in the first preferred embodiment. Further, the radiation portions 20a and 20b extend in the X-axis direction and Y-axis direction, whereby circularly-polarized waves are received, and antenna gain is improved.

Third Preferred Embodiment

Figure 9A:
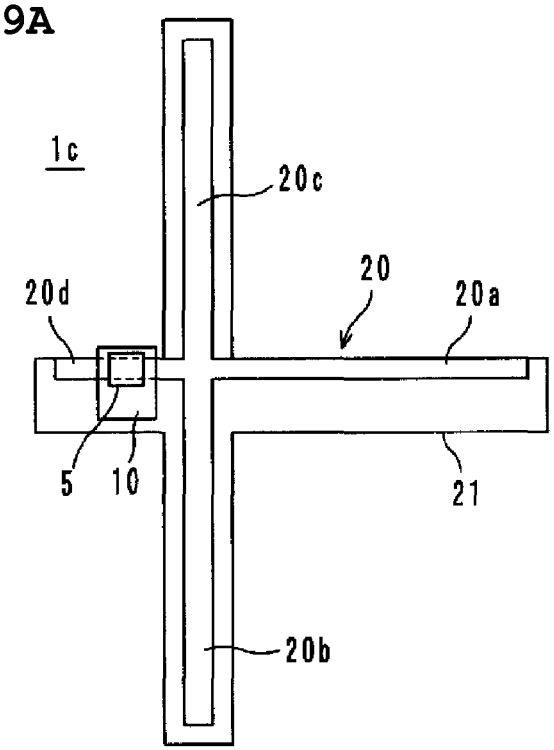
Figure 9B:
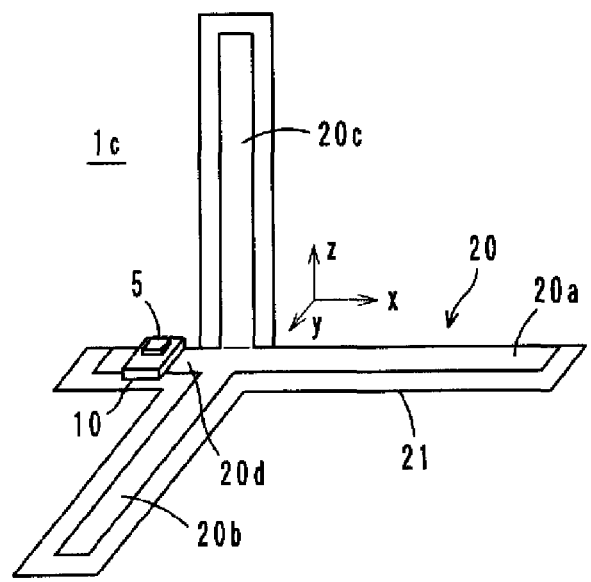

With a wireless IC device 1c according to a third preferred embodiment, as illustrated in FIGS. 9A and 9B, the radiation pattern 20 includes radiation portions 20a, 20b, and 20c extending in the X-axis direction, Y-axis direction, and Z-axis direction in x-y-z space, a portion above the extension of the radiation portion 20a defines a power supply portion 20d, and the power supply circuit board 10, on which the wireless IC chip 5 is mounted, is adhered to the power supply portion 20d.

The radiation pattern 20 of this wireless IC device 1c is adhered to a corner portion of a box-shaped article, the radiation portions 20a, 20b, and 20c extending three-dimensionally, so the directivity of the antenna is eliminated, and consequently, effective transmission/reception can be performed in any direction. Further, the other operations and advantages of the wireless IC device 1c are the same as those in the first preferred embodiment.

Fourth Preferred Embodiment

Figure 10:
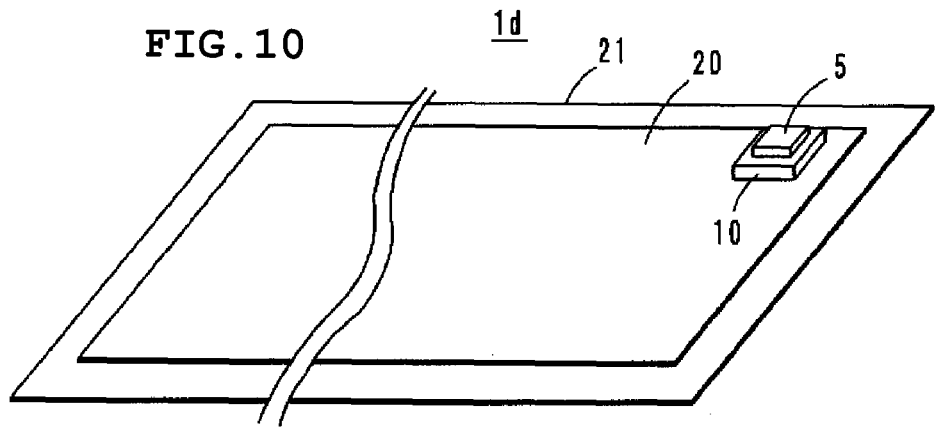
FIG. 10 is a perspective view illustrating a fourth preferred embodiment of the wireless IC device according to the present invention.

With a wireless IC device 1d according to a fourth preferred embodiment, as illustrated in FIG. 10, the radiation pattern 20 having a wide area and made of aluminum foil or other suitable material is disposed on a plastic film 21 having a wide area and flexible insulation, and the power supply circuit board 10, on which the wireless IC chip 5 is mounted, is adhered to an arbitrary portion of the radiation pattern 20.

Note that other configurations of the wireless IC device 1d, i.e., the internal configurations of the power supply circuit board 10 are the same as that in the first preferred embodiment. Accordingly, the operations and advantages of the present fourth preferred embodiment are substantially the same as those in the first preferred embodiment, and the present fourth preferred embodiment further includes an advantage wherein minimal accuracy regarding the adhesive position of the power supply circuit board 10 is required.

Fifth Preferred Embodiment

Figure 11:
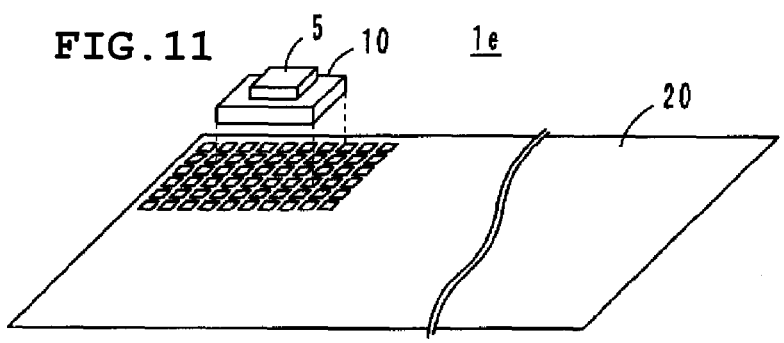
FIG. 11 is a perspective view illustrating a fifth preferred embodiment of the wireless IC device according to the present invention.

With a wireless IC device 1e according to a fifth preferred embodiment, as illustrated in FIG. 11, the radiation pattern 20 having a wide area and made of aluminum foil or other suitable material is preferably configured in a mesh shape. The mesh may be formed on the entire surface of the radiation pattern 20, or may be formed partially.

The other configurations are preferably the same as those in the fourth preferred embodiment, in addition to an advantage wherein high accuracy is not required regarding the adhesive position of the power supply circuit board 10, the magnetic flux of the coil-shaped electrode pattern is passing through opening portions, so variations of magnetic flux generated from the power supply circuit board 10 is reduced, many more magnetic fluxes can be passed through the radiation pattern 20. Accordingly, the propagation efficiency of signal energy is improved, and a frequency shift due to bonding is reduced.

Sixth Preferred Embodiment

Figure 12:
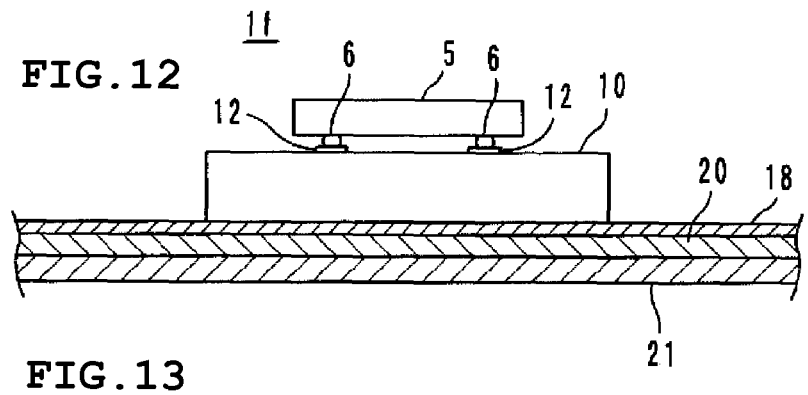
FIG. 12 is a cross-sectional view illustrating a sixth preferred embodiment of the wireless IC device according to the present invention.

With a wireless IC device 1f according to a sixth preferred embodiment, as illustrated in FIG. 12, an adhesive agent 18 is applied to the surface other than the bonding surface bonded to the power supply circuit board 10 (here, entire surface) on a film 21 via the radiation pattern 20. This adhesive agent 18 enables the wireless IC device if to be adhered to an arbitrary portion of an article.

Note that other configurations of the wireless IC device 1f, i.e., the internal configurations of the power supply circuit board 10 are substantially the same as those in the first preferred embodiment. Accordingly, the operations and advantages of the present sixth preferred embodiment are substantially the same as those in the first preferred embodiment.

Seventh Preferred Embodiment

Figure 13:
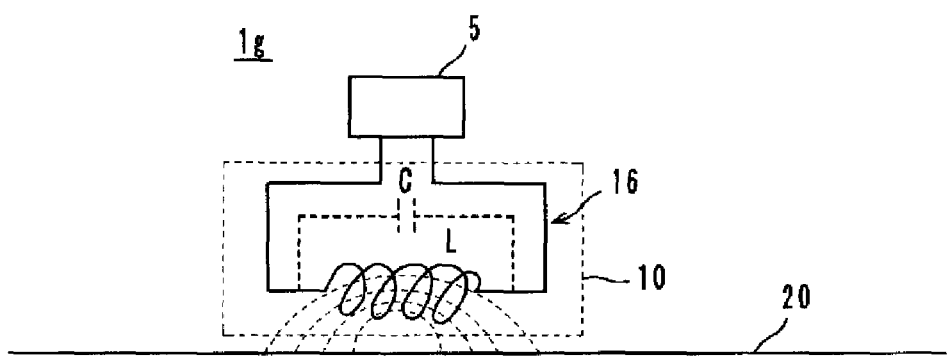
FIG. 13 is an equivalent circuit diagram illustrating a seventh preferred embodiment of the wireless IC device according to the present invention.

With a wireless IC device 1g according to a seventh preferred embodiment, as illustrated in FIG. 13 as an equivalent circuit, the inductance device L including a coil-shaped electrode pattern defining the power supply circuit 16 is disposed in the power supply circuit board 10. A capacitance device C defining a LC parallel resonant circuit is configured as a floating capacitance (distributed-constant-type capacitance) between the conductor patterns of the inductance device L.

That is to say, when even one coil-shaped electrode pattern has a self resonance, the L component of the coil-shaped electrode pattern itself and the C component which is a line floating capacitance function as an LC parallel resonant circuit, thereby functioning the power supply circuit 16. Accordingly, with this wireless IC device 1g, a high-frequency signal (e.g., UHF frequency band) radiated from the unshown reader/writer is received at the radiation pattern 20, the power supply circuit 16 (the LC parallel resonant circuit including the inductance device L and the capacitance device C) that is primarily magnetically-coupled with the radiation pattern 20 is resonated, and only the reception signal having a predetermined frequency band is supplied to the wireless IC chip 5. On the other hand, predetermined energy is extracted from the reception signal, the information stored in the wireless IC chip 5 provided as an input signal, and reflection modulation is provided as the input signal with that energy as a driving source to obtain a transmission signal, and the transmission signal is matched with a predetermined frequency at the power supply circuit 16, following the transmission signal is propagated from the inductance device L of the power supply circuit 16 to the radiation pattern 20 via magnetic coupling, and is transmitted and transferred from the radiation pattern 20 to the reader/writer.

Eighth Preferred Embodiment

Figure 14:
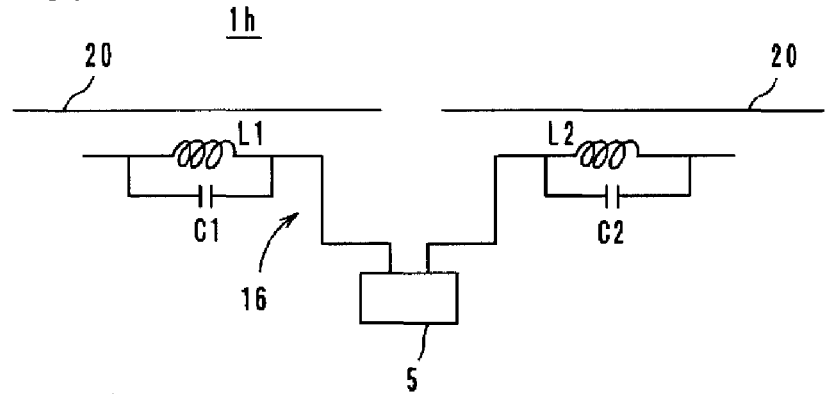
FIG. 14 is an equivalent circuit diagram illustrating an eighth preferred embodiment of the wireless IC device according to the present invention.

A wireless IC device 1h according to an eighth preferred embodiment, as illustrated in FIG. 14 as an equivalent circuit, includes a dipole-type power supply circuit 16, and the radiation pattern 20. The power supply circuit 16 includes two LC parallel resonant circuits disposed in a power supply circuit board. An inductance device L1 and a capacitance device C1 are connected to a first port side of the wireless IC chip 5, and an inductance device L2 and a capacitance device C2 are connected to a second port side of the wireless IC chip 5, each facing the radiation patterns 20 and 20. The end portions of the inductance device L1 and the capacitance device C1 are set to open ends. Note that a first port and a second port define the I/O ports of a difference circuit.

The operations and advantages of the present eighth preferred embodiment are substantially the same as those in the first preferred embodiment. That is to say, with this wireless IC device 1h, a high-frequency signal (e.g., UHF frequency band) radiated from the unshown reader/writer is received at the radiation pattern 20, the power supply circuit 16 (the LC parallel resonant circuit including the inductance device L1 and the capacitance device C1, and the LC parallel resonant circuit including of the inductance device L2 and the capacitance device C2) that are primarily magnetically-coupled with the radiation pattern 20 is resonated, and only the reception signal having a predetermined frequency band is supplied to the wireless IC chip 5. On the other hand, predetermined energy is extracted from this reception signal, the information stored in the wireless IC chip 5 is provided an input signal, and reflection modulation is provided as the input signal with that energy as a driving source to obtain a transmission signal, and the transmission signal is matched with a predetermined frequency at the power supply circuit 16, following the transmission signal is propagated from the inductance devices L1 and L2 of the power supply circuit 16 to the radiation pattern 20 via magnetic coupling, and is transmitted and transferred from the radiation pattern 20 to the reader/writer.

Ninth Preferred Embodiment

Figure 15:
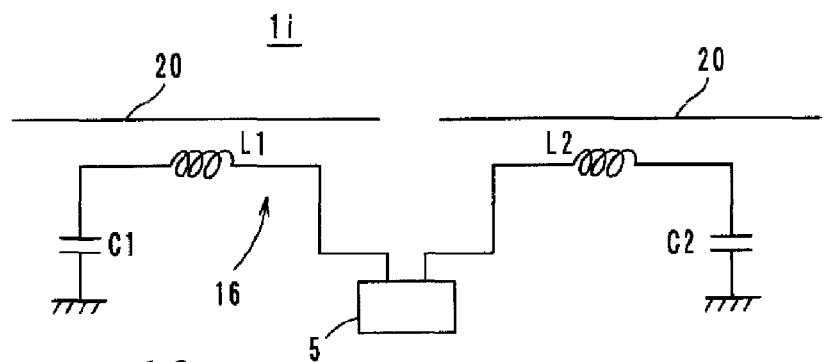
FIG. 15 is an equivalent circuit diagram illustrating a ninth preferred embodiment of the wireless IC device according to the present invention.

A wireless IC device 1i according to a ninth preferred embodiment, as illustrated in FIG. 15 as an equivalent circuit, is a device including a dipole-type power supply circuit 16, and the radiation pattern 20. The power supply circuit 16 includes two LC series resonant circuits disposed in a power supply circuit board. Respective inductance devices L1 and L2 face the radiation patterns 20 and 20, and respective capacitance devices C1 and C2 are connected to ground.

The operations and advantages of the present ninth preferred embodiment are substantially the same as those in the first preferred embodiment. That is to say, with this wireless IC device 1i, a high-frequency signal (e.g., UHF frequency band) radiated from the unshown reader/writer is received at the radiation pattern 20, the power supply circuit 16 (the LC series resonant circuit including the inductance device L1 and the capacitance device C1, and the LC series resonant circuit including the inductance device L2 and the capacitance device C2) that are primarily magnetically-coupled with the radiation pattern 20 is resonated, and only the reception signal having a predetermined frequency band is supplied to the wireless IC chip 5. On the other hand, predetermined energy is extracted from this reception signal, the information stored in the wireless IC chip 5 is provided as an input signal, and reflection modulation is applied to the input signal with that energy as a driving source to obtain a transmission signal, and the transmission signal is matched with a predetermined frequency at the power supply circuit 16, following the transmission signal is propagated from the inductance devices L1 and L2 of the power supply circuit 16 to the radiation pattern 20 via magnetic coupling, and is transmitted and transferred from the radiation pattern 20 to the reader/writer.

Tenth Preferred Embodiment

Figure 16:
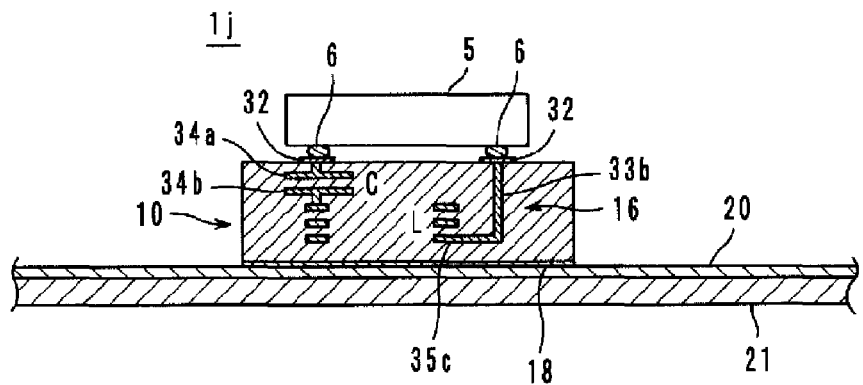
FIG. 16 is a cross-sectional view illustrating a tenth preferred embodiment of the wireless IC device according to the present invention.
Figure 17:
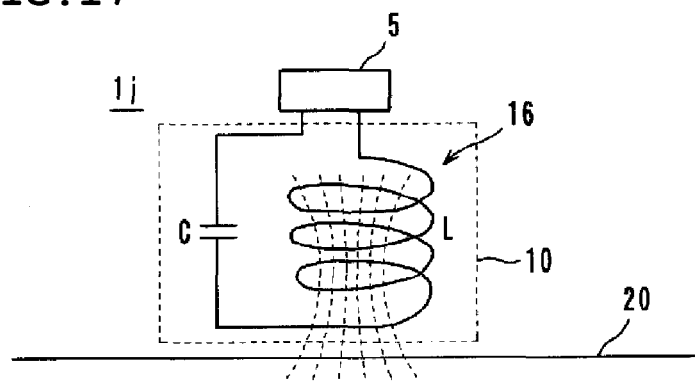
FIG. 17 is an equivalent circuit diagram of the tenth preferred embodiment of the present invention.

A wireless IC device 1j according to a tenth preferred embodiment, as illustrated in FIG. 16, is a monopole type, wherein an inductance device L and a capacitance device C disposed in the power supply circuit board 10 define the power supply circuit 16 as an LC series resonant circuit. As illustrated in FIG. 17, with a coil-shaped electrode pattern defining the inductance device L, the winding axis thereof is substantially perpendicular to the radiation portion 20, and the power supply circuit 16 is principally magnetically-coupled with the radiation portion 20.

Figure 18:
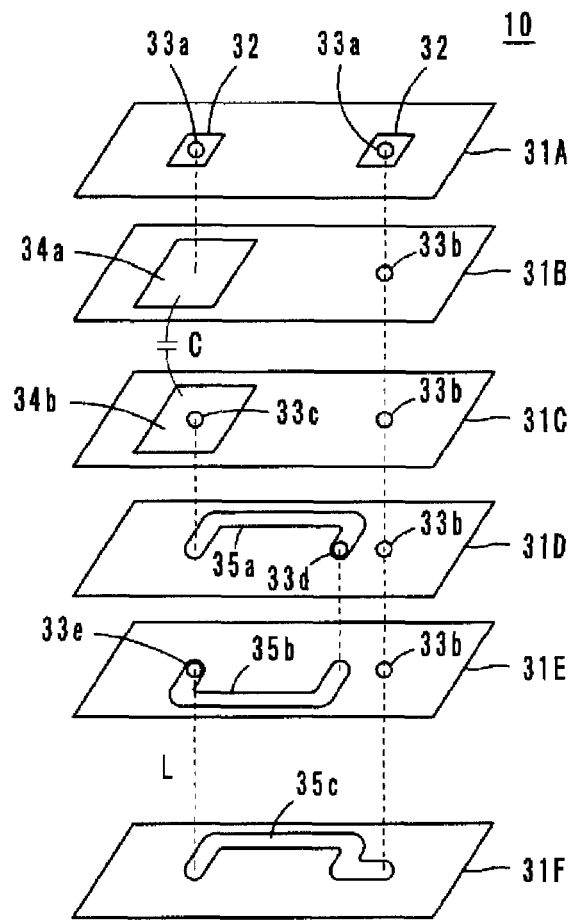
FIG. 18 is an exploded perspective view illustrating a power supply circuit board of the tenth preferred embodiment of the present invention.

The power supply circuit board 10 is, specifically, as illustrated in FIG. 18, preferably obtained by layering, pressure-bonding, and sintering ceramic sheets 31A through 31F each made up of a dielectric member, and includes the sheet 31A forming electrodes for connection 32 and via hole conductors 33a, the sheet 31B forming a capacitance electrode 34a and a via hole conductor 33b, the sheet 31C forming a capacitor electrode 34b and via hole conductors 33c and 33b, the sheet 31D (one sheet or multiple sheets) forming a conductor pattern 35a and via hole conductors 33d and 33b, the sheet 31E (one sheet or multiple sheets) forming a conductor pattern 35b and via hole conductors 33e and 33b, and the sheet 31F forming a conductor pattern 35c.

The above-described sheets 31A through 31F are layered, thereby obtaining the power supply circuit 16 defined by an LC series resonant circuit wherein the capacitance device C is serially connected to the inductance device L of which a helical winding axis is substantially perpendicular to the radiation pattern 20. The capacitance electrode 34a is connected to the electrode for connection 32 via the via hole conductor 33a, and further connected to the wireless IC chip 5 via the soldering bump 6. One end of the inductance device L is connected to the electrode for connection 32 via the via hole conductor 33b, and further connected to the wireless IC chip 5 via the soldering bump 6.

The operations and advantages of the present tenth preferred embodiment are substantially the same as those in the first preferred embodiment. That is to say, with this wireless IC device 1j, a high-frequency signal (e.g., UHF frequency band) radiated from the unshown reader/writer is received at the radiation pattern 20, the power supply circuit 16 (the LC series resonant circuit including the inductance device L and the capacitance device C) that is primarily magnetically-coupled with the radiation pattern 20 is resonated, and only the reception signal having a predetermined frequency band is supplied to the wireless IC chip 5. On the other hand, predetermined energy is extracted from this reception signal, the information stored in the wireless IC chip 5 is provided as an input signal, and reflection modulation is applied to this input signal with the energy as a driving source to obtain a transmission signal, and the transmission signal is matched with a predetermined frequency at the power supply circuit 16, following which the transmission signal is propagated from the inductance device L of the power supply circuit 16 to the radiation pattern 20 via magnetic coupling, and is transmitted and transferred from the radiation pattern 20 to the reader/writer.

Particularly, according to the present tenth preferred embodiment, with the coil-shaped electrode pattern, the winding axis thereof is substantially perpendicular to the radiation pattern 20, and accordingly, the present tenth preferred embodiment achieves advantages wherein the magnetic flux component increases as to the radiation pattern 20, propagation efficiency of signal energy improves, and gain also increases.

Eleventh Preferred Embodiment

Figure 19:
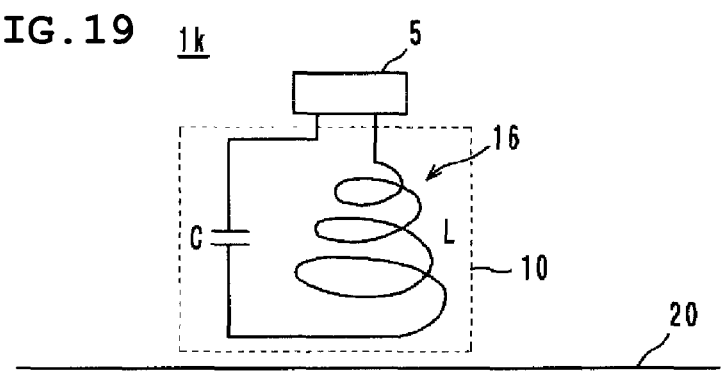
FIG. 19 is an equivalent circuit diagram illustrating an eleventh preferred embodiment of the wireless IC device according to the present invention.

With a wireless IC device 1k according to an eleventh preferred embodiment, as illustrated in FIG. 19 as an equivalent circuit, the winding width (coil diameter) of the coil-shaped electrode pattern of the inductance device L illustrated in the tenth preferred embodiment gradually increases toward the radiation pattern 20. The other configurations are substantially the same as those in the tenth preferred embodiment.

The present eleventh preferred embodiment has the same operations and advantages as those in the tenth preferred embodiment, and additionally, the winding width (coil diameter) of the coil-shaped electrode pattern of the inductance device L gradually increases toward the radiation pattern 20, thereby improving the propagation efficiency of signals.

Twelfth Preferred Embodiment

Figure 20:
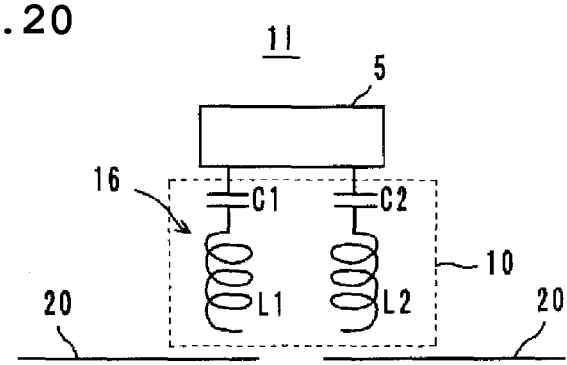
FIG. 20 is an equivalent circuit diagram illustrating a twelfth preferred embodiment of the wireless IC device according to the present invention.

A wireless IC device 1l according to a twelfth preferred embodiment, as illustrated in FIG. 20 as an equivalent circuit, is a dipole type, wherein the power supply circuit 16 includes two LC series resonant circuits disposed in the power supply circuit board 10.

Figure 21:
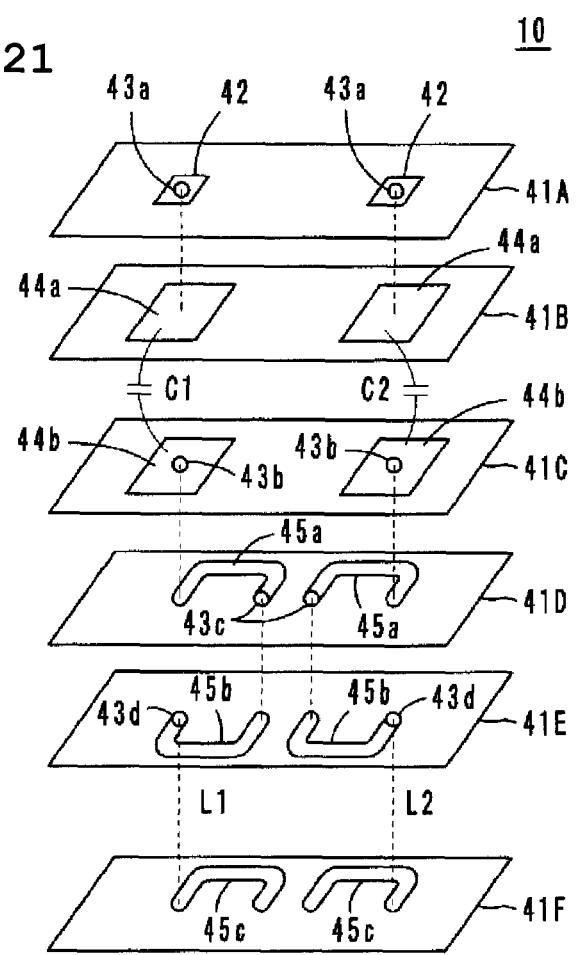
FIG. 21 is an exploded perspective view illustrating the power supply circuit board of the twelfth preferred embodiment of the present invention.

Specifically, the power supply circuit board 10 is, as illustrated in FIG. 21, obtained by layering, pressure-bonding, and sintering ceramic sheets 41A through 41F each made of a dielectric member, and includes the sheet 41A forming electrodes for connection 42 and via hole conductors 43a, the sheet 41B forming capacitance electrodes 44a, the sheet 41C forming capacitor electrodes 44b and via hole conductors 43b, the sheet 41D (one sheet or multiple sheets) forming conductor patterns 45a and via hole conductors 43c, the sheet 41E (one sheet or multiple sheets) forming conductor patterns 45b and via hole conductors 43d, and the sheet 41F forming conductor patterns 45c.

The above-described sheets 41A through 41F are layered, thereby obtaining the power supply circuit 16 including the two LC series resonant circuits wherein the capacitance devices C1 and C2 are serially connected to the inductance devices L1 and L2 of which helical winding axes are substantially perpendicular to the radiation pattern 20. The capacitance electrodes 44a are connected to the electrodes for connection 42 via the via hole conductors 43a, and further connected to the wireless IC chip 5 via a soldering bump.

The operations and advantages of the present twelfth preferred embodiment are substantially the same as those in the first preferred embodiment. That is to say, with this wireless IC device 1l, a high-frequency signal (e.g., UHF frequency band) radiated from the unshown reader/writer is received at the radiation pattern 20, the power supply circuit 16 (the LC series resonant circuit including the inductance device L1 and the capacitance device C1, and the LC series resonant circuit including the inductance device L2 and the capacitance device C2) that are primarily magnetically-coupled with the radiation pattern 20 is resonated, and only the reception signal having a predetermined frequency band is supplied to the wireless IC chip 5. On the other hand, predetermined energy is extracted from this reception signal, the information stored in the wireless IC chip 5 is provided as an input signal, and reflection modulation is applied to this input signal with that energy as a driving source to obtain a transmission signal, and the transmission signal is matched with a predetermined frequency at the power supply circuit 16, following the transmission signal is propagated from the inductance devices L1 and L2 of the power supply circuit 16 to the radiation pattern 20 via magnetic coupling, and is transmitted and transferred from the radiation pattern 20 to the reader/writer.

Also, the capacitance devices C1 and C2 are disposed downstream of the IC chip 5 and between the IC chip 5 and the inductance devices L1 and L2, so as to improve surge resistance. A surge is a low-frequency current up to about 200 MHz, which can be removed by the capacitance devices C1 and C2, and the surge breakdown of the wireless IC chip 5 is prevented.

Note that with the present twelfth preferred embodiment, the resonant circuit including the capacitance device C1 and the inductance device L1 and the resonant circuit including the capacitance device C2 and the inductance device L2 are not coupled mutually.

Thirteenth Preferred Embodiment

Figure 22:
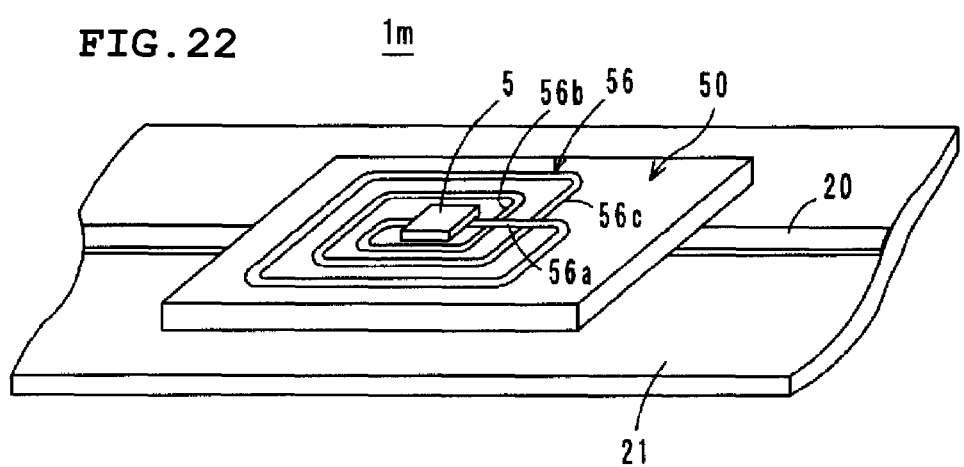
FIG. 22 is a perspective view illustrating a thirteenth preferred embodiment of the wireless IC device according to the present invention.

A wireless IC device 1m according to a thirteenth preferred embodiment is, as illustrated in FIG. 22, a device wherein the surface of a rigid single-layer power supply circuit board 50 made of a ceramic or heat-resistance resin is provided with a power supply circuit 56 defined by a coil-shaped electrode pattern, i.e., a spiral-type inductance device, provided on the surface thereof. Both end portions of the power supply circuit 56 are directly connected to the wireless IC chip 5 via a soldering bump, and the power supply circuit board 50 is adhered to the film 21 on which the radiation pattern 20 is provided using an adhesive agent. Also, a conductor pattern 56a and conductors 56b and 56c which define the power supply circuit 56, and mutually cross are isolated by an unshown insulating film.

The power supply circuit 56 according to the present thirteenth preferred embodiment defines an LC parallel resonant circuit wherein a floating capacitance provided between conductor patterns wound in a spiral manner is used as a capacitance component. Also, the power supply circuit board 50 is a single-layer board made of a dielectric member or magnetic member.

With the wireless IC device 1m according to the present preferred thirteenth embodiment, the power supply circuit 56 is primarily magnetically coupled with the radiation pattern 20. Accordingly, as with the above-described preferred embodiments, a high-frequency signal radiated from the reader/writer is received at the radiation pattern 20, the power supply circuit 56 is resonated, only the reception signal having a predetermined frequency band is supplied to the wireless IC chip 5. On the other hand, predetermined energy is extracted from this reception signal, the information stored in the wireless IC chip 5 is provided as an input signal, and reflection modulation is applied to this input signal with that energy as a driving source to obtain a transmission signal, and the transmission signal is matched with a predetermined frequency at the power supply circuit 56, following the transmission signal is propagated from the inductance device of the power supply circuit 56 to the radiation pattern 20 via magnetic coupling, and is transmitted and transferred from the radiation pattern 20 to the reader/writer.

As with the first preferred embodiment in that the wireless IC chip 5 is provided on the rigid power supply circuit board 50 having a small area, positioning accuracy is excellent, so the wireless IC chip 5 can be connected to the power supply circuit board 50 using a soldering bump.

Fourteenth Preferred Embodiment

Figure 23:
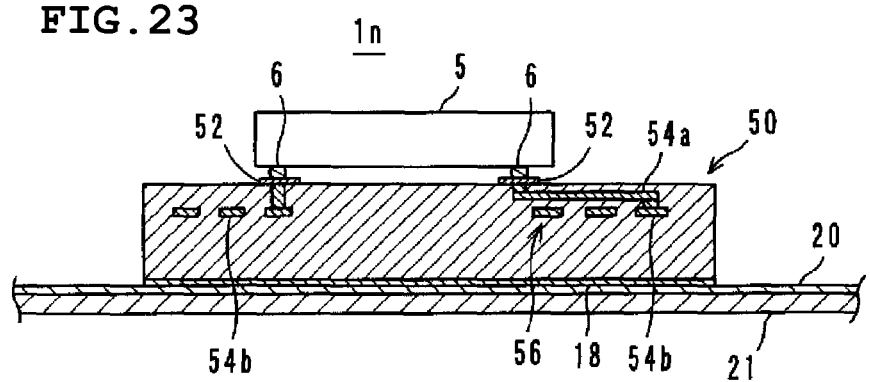
FIG. 23 is a cross-sectional view illustrating a fourteenth preferred embodiment of the wireless IC device according to the present invention.
Figure 24:
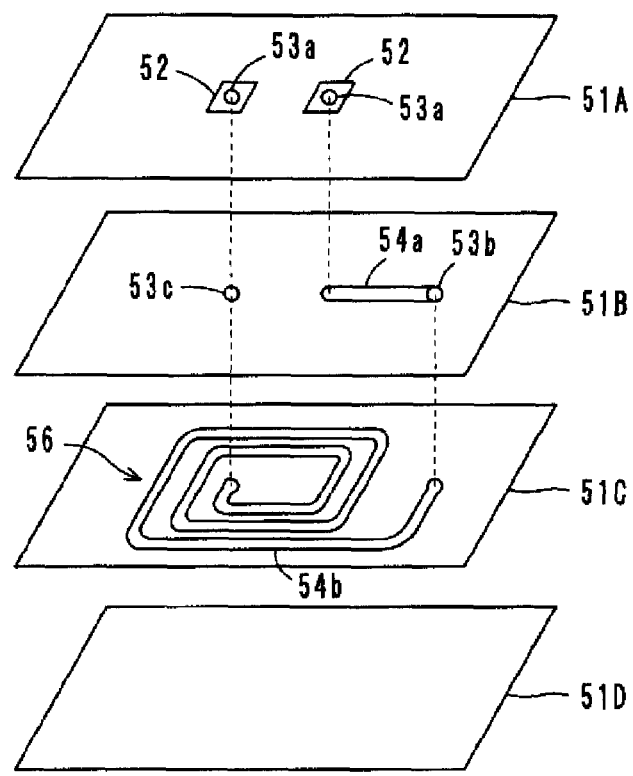
FIG. 24 is an exploded perspective view illustrating the power supply circuit board of the fourteenth preferred embodiment of the present invention.

With a wireless IC device 1n according to a fourteenth preferred embodiment, as illustrated in FIG. 23, the coil-shaped electrode pattern of the power supply circuit 56 is provided in the power supply circuit board 50. The power supply circuit board 50 is, as illustrated in FIG. 24, obtained by layering, pressure-bonding, and sintering ceramic sheets 51A through 51D each made of a dielectric member, and includes the sheet 51A forming electrodes for connection 52 and via hole conductors 53a, the sheet 51B forming a conductor pattern 54a and via hole conductors 53b and 53c, the sheet 51C forming a conductor pattern 54b, and the plain sheet 51D (multiple sheets).

The sheets 51A through 51D are layered, thereby obtaining the power supply circuit board 50 which includes the power supply circuit 56 including a resonant circuit defined by the inductance device wound in a spiral shape, and the capacitance component defined by a floating capacitance between lines of the spiral-shaped conductor in the coil-shaped electrode pattern. The electrodes for connection 52 positioned on both ends of the power supply circuit 56 are connected to the wireless IC chip 5 via a soldering bump 6. The operations and advantages of the present fourteenth preferred embodiment are substantially the same as those in the thirteenth preferred embodiment.

Fifteenth Preferred Embodiment

Figure 25:
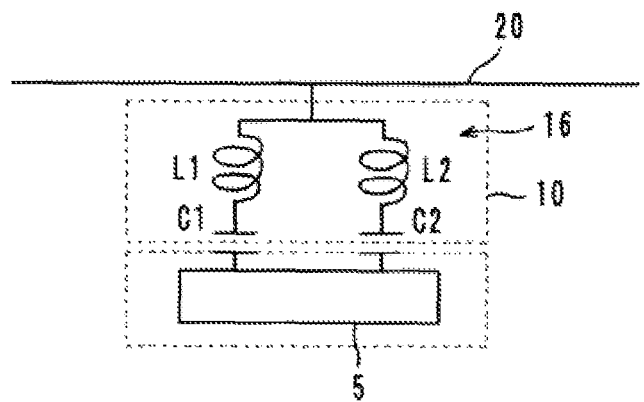
FIG. 25 is an equivalent circuit diagram illustrating a fifteenth preferred embodiment of the wireless IC device according to the present invention.

A wireless IC device 10 according to a fifteenth preferred embodiment is, as illustrated in FIG. 25 as an equivalent circuit, a device which is subjected to capacitive coupling between the wireless IC chip 5 and the power supply circuit board 10, and the power supply circuit board 10 and the radiation pattern 20 are connected by DC connection. The power supply circuit board 10 includes the power supply circuit 16 made up of two LC series resonant circuits disposed therein. With the inductance devices L1 and L2, the winding axes thereof are positioned substantially perpendicular to the radiation pattern 20, and one of the ends thereof is connected to capacitor electrodes 65a and 65b (see FIG. 26) defining the capacitance devices C1 and C2, and the other ends thereof are mutually direct-connected by an electrode for connection 62 provided on the bottom surface of the board 10. Also, capacitor electrodes 66a and 66b (see FIG. 26) defining the capacitance devices C1 and C2 are provided on the rear side of the wireless IC chip 5.

Figure 26:
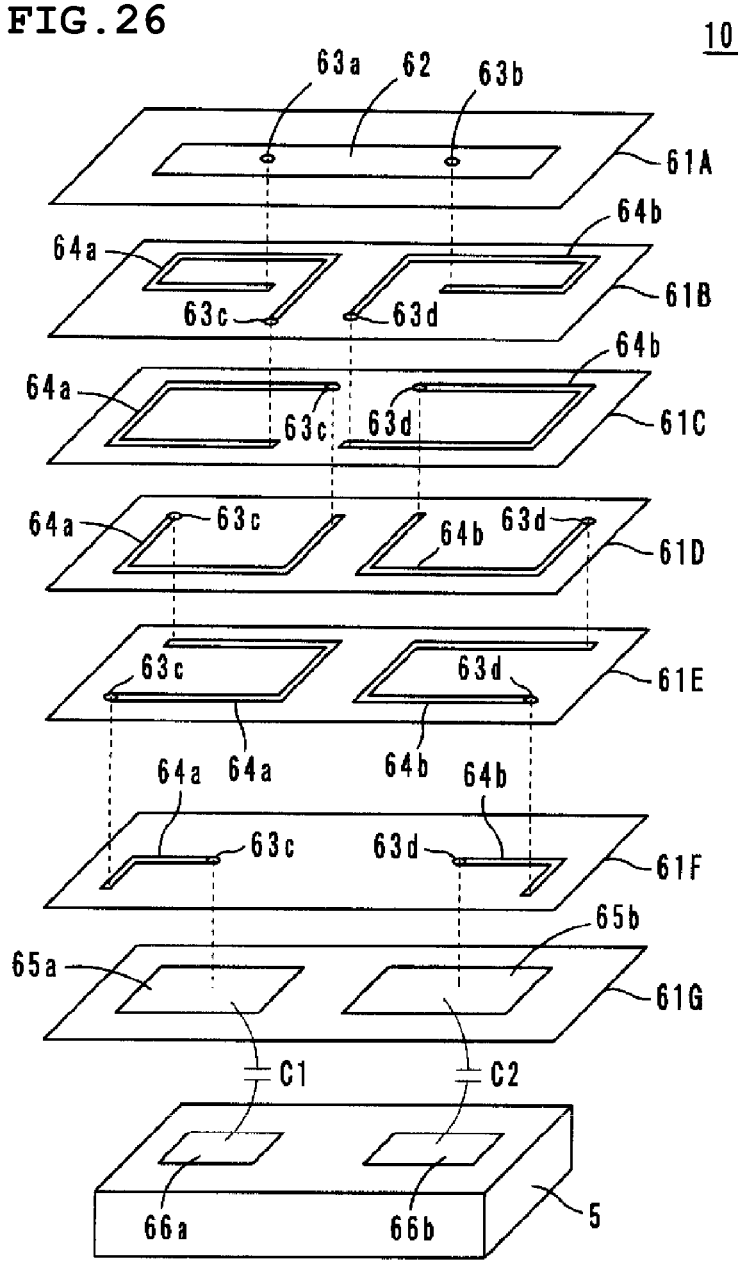
FIG. 26 is an exploded perspective view illustrating the power supply circuit board of the fifteenth preferred embodiment of the present invention.

Specifically, the power supply circuit board 10 is, as illustrated in FIG. 26, obtained by layering, pressure-bonding, and sintering ceramic sheets 61A through 61G each made up of a dielectric member, and includes the sheet 61A forming an electrode for connection 62 and via hole conductors 63a and 63b, the sheets 61B through 61F forming conductor patterns 64a and 64b and via hole conductors 63c and 63d, and the sheet 61G forming capacitor electrodes 65a and 65b.

The above-described sheets 61A through 61G are layered, thereby obtaining the power supply circuit 16 including the two LC series resonant circuits wherein the capacitance devices C1 and C2 are serially connected to the inductance devices L1 and L2.

That is to say, the capacitance device C1 is defined between the plane electrode patterns of the electrode 66a functioning as a chip-side electrode pattern and the electrode 65a functioning as a board-side electrode pattern which are mutually parallel. The capacitance device C2 is provided between the plane electrode patterns of the electrode 66b functioning as a chip-side electrode pattern and the electrode 65b functioning as a board-side electrode pattern which are substantially mutually parallel. The wireless IC chip 5 is adhered to the power supply circuit board 10 using an insulating adhesive layer, and is connected to the power supply circuit board 10 via this insulating adhesive layer. Also, the power supply circuit board 10 is DC-connected to the radiation pattern 20 via the electrode for connection 62 functioning as a second-board-side electrode pattern. Here, between the electrode for connection 62 of the power supply circuit board 10 and the radiation pattern 20 may be connected using soldering, an electroconductive adhesive agent, or other suitable agent.

The operations and advantages of the present fifteenth embodiment are basically the same as those in the first preferred embodiment. That is to say, with this wireless IC device 1o, a high-frequency signal (e.g., UHF frequency band) radiated from the unshown reader/writer is received at the radiation pattern 20, the power supply circuit 16 (the LC series resonant circuit including the inductance device L1 and the capacitance device C1, and the LC series resonant circuit including the inductance device L2 and the capacitance device C2) DC-connected to the radiation pattern 20 is resonated, and only the reception signal having a predetermined frequency band is supplied to the wireless IC chip 5. On the other hand, predetermined energy is extracted from this reception signal, the information stored in the wireless IC chip 5 is provided as an input signal, and reflection modulation is applied to this input signal with that energy as a driving source to obtain a transmission signal, and the transmission signal is matched with a predetermined frequency at the power supply circuit 16, following the transmission signal is propagated to the radiation pattern 20 DC-connected to the power supply circuit 16, and is transmitted and transferred from the radiation pattern 20 to the reader/writer. The power supply circuit 16 and the wireless IC chip 5 are subjected to capacitive coupling by the capacitance devices C1 and C2, whereby electric power and a transmission/reception signal are transmitted therebetween.

Incidentally, the areas of the capacitor electrodes 65a and 65b provided on the power supply circuit board 10 are configured so as to be greater than the areas of the capacitor electrodes 66a and 66b provided on the wireless IC chip 5. Accordingly, even if the positional accuracy somewhat varies at the time of mounting the wireless IC chip 5 on the power supply circuit board 10, variations of capacitance provided between the capacitor electrodes 65a, 66a and 65b, 66b are prevented. Also, the capacitance devices C1 and C2 are inserted downstream of the wireless IC chip 5, whereby surge-resistance capabilities improve.

Sixteenth Preferred Embodiment

Figure 27:
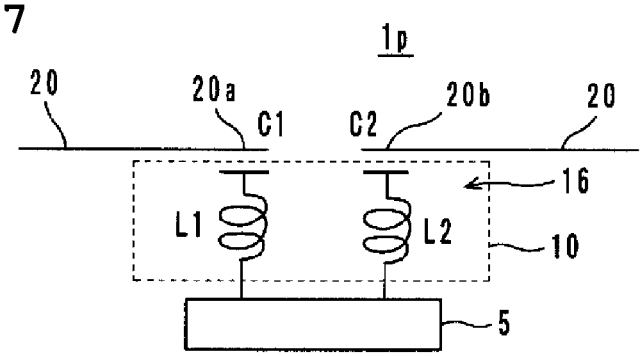
FIG. 27 is an equivalent circuit diagram illustrating a sixteenth preferred embodiment of the wireless IC device according to the present invention.

A wireless IC device 1p according to a sixteenth preferred embodiment includes, as illustrated in FIG. 27 as an equivalent circuit, capacitive coupling between the power supply circuit board 10 and the radiation pattern 20. The power supply circuit board 10 includes the power supply circuit 16 defined by two LC series resonant circuits. One of the ends of the inductance devices L1 and L2 is connected to the wireless IC chip 5, and the other ends thereof are connected to capacitor electrodes 72a and 72b (see FIG. 28) defining the capacitance devices C1 and C2 provided on the front side of the board 10. Also, the end portions 20a and 20b of the radiation pattern 20 functions as another capacitor electrode defining the capacitance devices C1 and C2.

Figure 28:
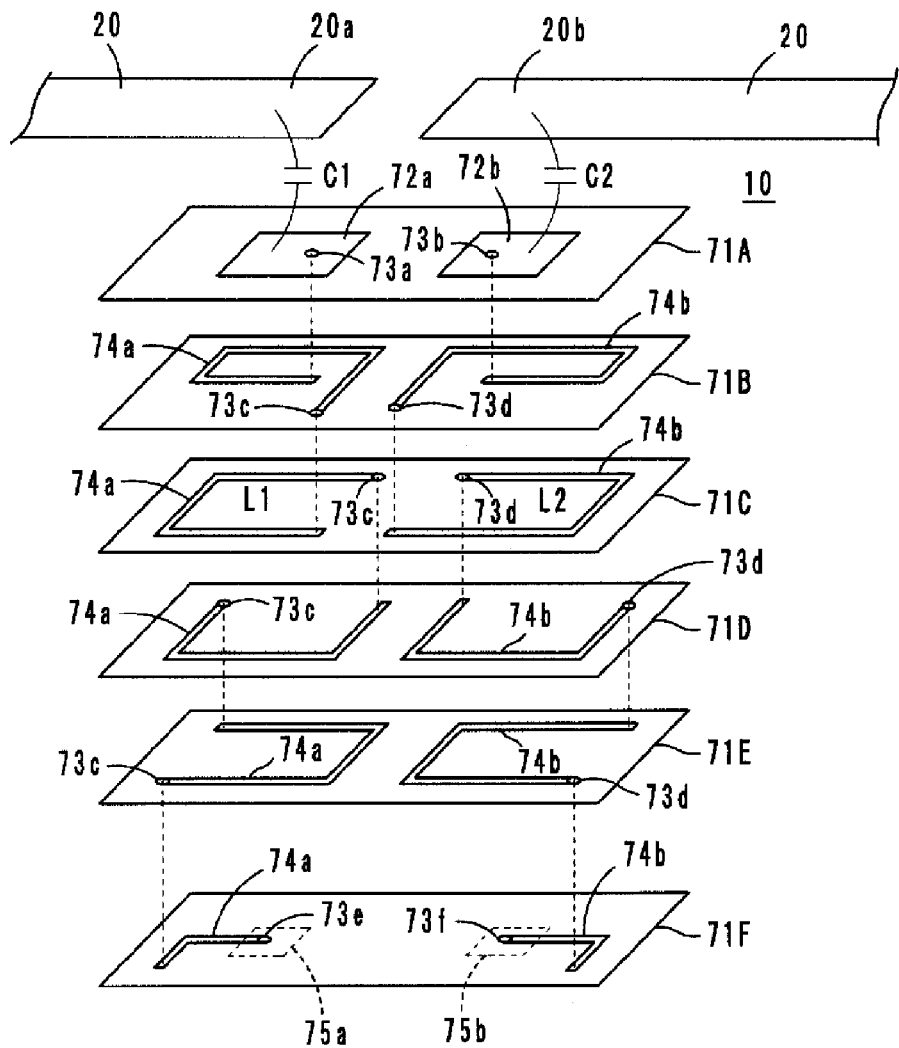
FIG. 28 is an exploded perspective view illustrating the power supply circuit board of the sixteenth preferred embodiment of the present invention.

Specifically, the power supply circuit board 10 is, as illustrated in FIG. 28, obtained by layering, pressure-bonding, and sintering ceramic sheets 71A through 71F each made of a dielectric member, and includes the sheet 71A forming capacitor electrodes 72a and 72b and via hole conductors 73a and 73b, the sheets 71B through 71E forming conductor patterns 74a and 74b and via hole conductors 73c and 73d, and the sheet 71F wherein conductor patterns 74a and 74b are formed on one side, electrodes for connection 75a and 75b are formed on the other side, and both are connected with via hole conductors 73e and 73f.

The sheets 71A through 71F are layered, thereby obtaining the power supply circuit 16 including the two LC series resonant circuits wherein the capacitance devices C1 and C2 are serially connected to the inductance devices L1 and L2. The power supply circuit board 10 is adhered to the radiation pattern 20 using an adhesive agent, whereby the capacitor electrodes 72a and 72b functioning as plane electrode patterns disposed substantially in parallel to the radiation pattern 20 face the end portions 20a and 20b of the radiation pattern 20 via the insulating adhesive layer, and define the capacitance devices C1 and C2. Also, the electrodes for connection 75a and 75b are connected to the wireless IC chip 5 via a soldering bump, whereby one of the ends of the inductance devices L1 and L2 is connected to the wireless IC chip 5, and the wireless IC chip 5 and the power supply circuit board 10 are DC-connected.

Note that when the adhesive agent includes dielectric powder, the adhesive layer consequently includes properties as a dielectric member, whereby the capacitance of the capacitance devices C1 and C2 is increased. Also, with the sixteenth preferred embodiment, the capacitor electrodes 72a and 72b functioning as the second-board-side electrode patterns are disposed on the rear-side surface of the power supply circuit board 10, but may be disposed within the power supply circuit board 10, preferably on the side near the radiation pattern 20. Also, the capacitor electrodes 72a and 72b may be provided in an inner layer of the board 10.

The operations and advantages of the present sixteenth preferred embodiment are substantially the same as those in the first preferred embodiment. That is to say, with this wireless IC device 1p, a high-frequency signal (e.g., UHF frequency band) radiated from the unshown reader/writer is received at the radiation pattern 20, the power supply circuit 16 (the LC series resonant circuit made up of the inductance device L1 and the capacitance device C1, and the LC series resonant circuit made up of the inductance device L2 and the capacitance device C2) capacitively-coupled with the radiation pattern 20 is resonated, and only the reception signal having a predetermined frequency band is supplied to the wireless IC chip 5. On the other hand, predetermined energy is extracted from this reception signal, the information stored in the wireless IC chip 5 is provided as an input signal, and reflection modulation is applied to this input signal with that energy as a driving source to obtain a transmission signal, and the transmission signal is matched with a predetermined frequency at the power supply circuit 16, following the transmission signal is propagated to the radiation pattern 20 via capacitive coupling by the capacitance devices C1 and C2, and is transmitted and transferred from the radiation pattern 20 to the reader/writer.

Seventeenth Preferred Embodiment

Figure 29:
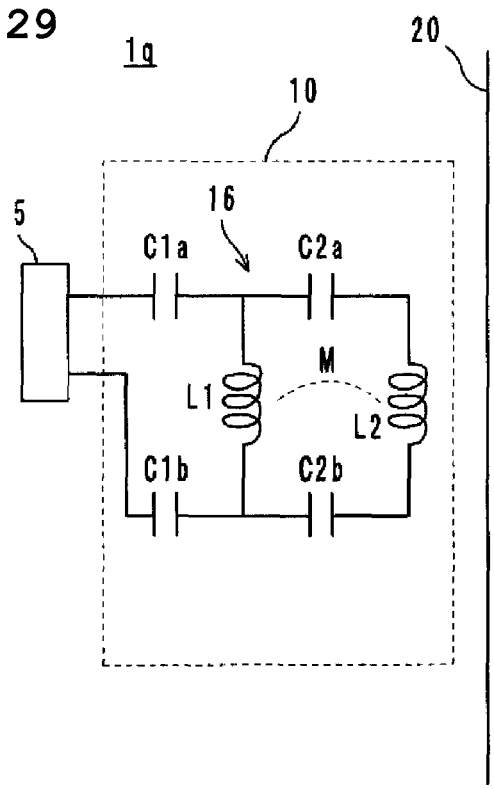
FIG. 29 is an equivalent circuit diagram illustrating a seventeenth preferred embodiment of the wireless IC device according to the present invention.

With a wireless IC device 1q according to a seventeenth preferred embodiment, as illustrated in FIG. 29 as an equivalent circuit, the power supply circuit 16 includes inductance devices L1 and L2 which are mutually magnetically-coupled, wherein the inductance device L1 is connected to the wireless IC chip 5 via capacitance devices C1a and C1b, and connected to the inductance device L2 via capacitance devices C2a and C2b substantially in parallel. In other words, the power supply circuit 16 is configured so as to include an LC series resonant circuit defining the inductance device L1 and the capacitance devices C1a and C1b, and an LC series resonant circuit defining the inductance device L2 and the capacitance devices C2a and C2b, and both resonant circuits are coupled with magnetic coupling denoted M in FIG. 29. Also, both of the inductance devices L1 and L2 are magnetically coupled with the radiation pattern 20.

Figure 30:
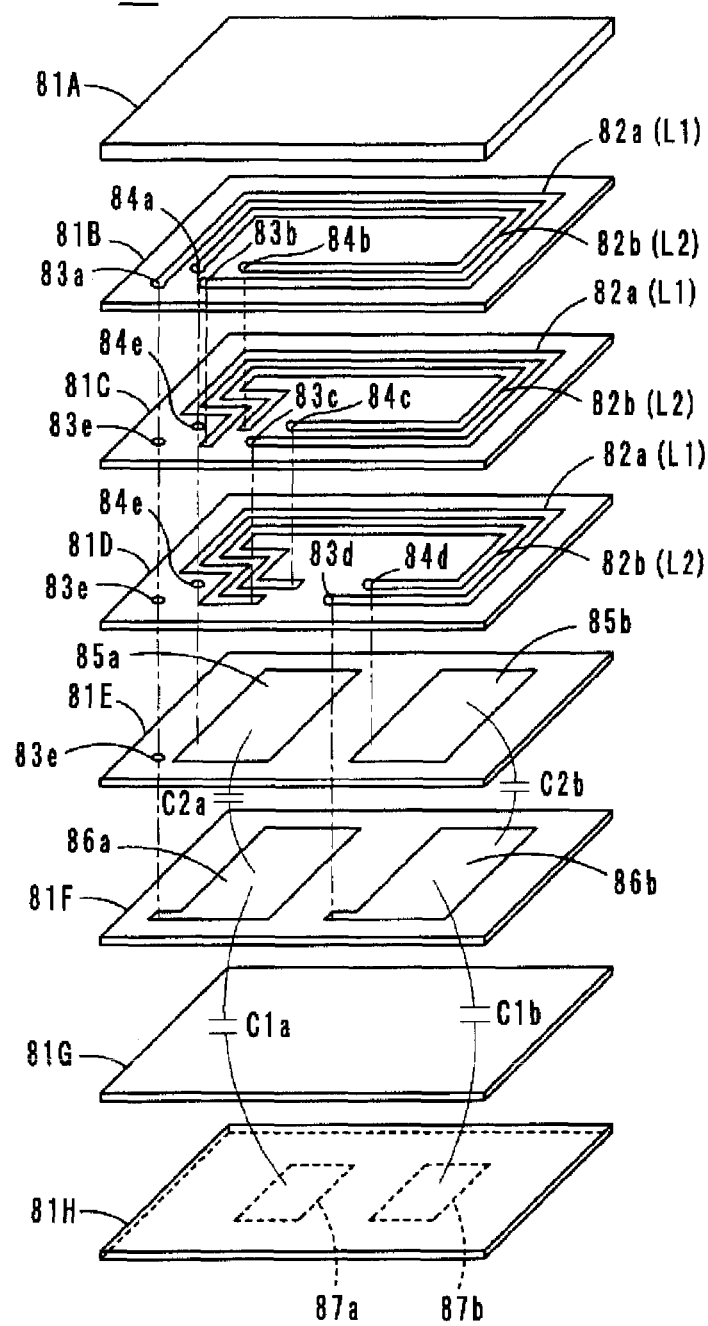
FIG. 30 is an exploded perspective view illustrating the power supply circuit board of the seventeenth preferred embodiment of the present invention.

Specifically, the power supply circuit board 10 is, as illustrated in FIG. 30, obtained by layering, pressure-bonding, and sintering ceramic sheets 81A through 81H each made of a dielectric member, and includes the plain sheet 81A, the sheet 81B forming conductor patterns 82a and 82b and via hole conductors 83a, 83b, 84a, and 84b, the sheet 81C forming conductor patterns 82a and 82b and via hole conductors 83c, 84c, 83e, and 84e, the sheet 81D forming conductor patterns 82a and 82b and via hole conductors 83d, 84d, 83e, and 84e, the sheet 81E forming capacitor electrodes 85a and 85b and a via hole conductor 83e, the sheet 81F forming capacitor electrodes 86a and 86b, the plain sheet 81G, and the sheet 81H wherein capacitor electrodes 87a and 87b are formed on the rear side thereof.

The sheets 81A through 81H are layered, whereby the conductor patterns 82a are connected via the via hole conductors 83b and 83c to define the inductance device L1, and the conductor patterns 82b are connected via the via hole conductors 84b and 84c to define the inductance device L2. The capacitor electrodes 86a and 87a define the capacitance device C1a, and the capacitor electrode 86a is connected to one end of the inductance device L1 via the via hole conductors 83e. The capacitor electrodes 86b and 87b define the capacitance device C1b, and the capacitor electrode 86b is connected to the other end of the inductance device L1 via the via hole conductor 83d. Further, the capacitor electrodes 85a and 86a define the capacitance device C2a, and the capacitor electrode 85a is connected to one end of the inductance device L2 via the via hole conductors 84e. The capacitor electrodes 85b and 86b define the capacitance device C2b, and the capacitor electrode 85b is connected to the other end of the inductance device L2 via the via hole conductor 84d.

The operations and advantages of the present seventeenth preferred embodiment are substantially the same as those in the first preferred embodiment. That is to say, with this wireless IC device 1q, a high-frequency signal (e.g., UHF frequency band) radiated from the unshown reader/writer is received at the radiation pattern 20, the power supply circuit 16 (the LC series resonant circuit defined by the inductance device L1 and the capacitance devices C1a and C1b, and the LC series resonant circuit defined by the inductance device L2 and the capacitance devices C2a and C2b) principally magnetically-coupled with the radiation pattern 20 is resonated, and only the reception signal having a predetermined frequency band is supplied to the wireless IC chip 5. On the other hand, predetermined energy is extracted from this reception signal, the information stored in the wireless IC chip 5 is provided as an input signal, and reflection modulation is applied to this input signal with that energy as a driving source to obtain a transmission signal, and the transmission signal is matched with a predetermined frequency at the power supply circuit 16, following the transmission signal is propagated to the radiation pattern 20 from the inductance devices L1 and L2 of the power supply circuit 16 via magnetic coupling, and is transmitted and transferred from the radiation pattern 20 to the reader/writer.

Figure 31:
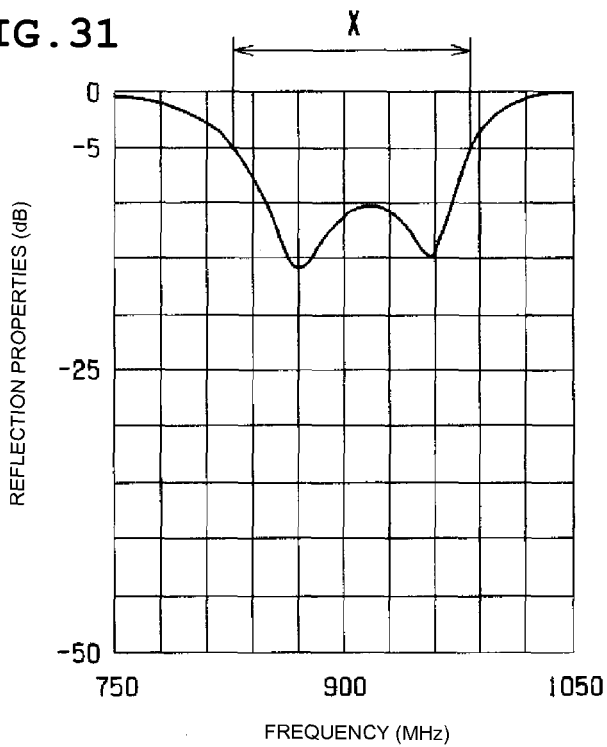
FIG. 31 is a graph illustrating reflection properties of the seventeenth preferred embodiment of the present invention.

Particularly, with the present seventeenth preferred embodiment, as illustrated in FIG. 31, a bandwidth X (bandwidth of about −5 dB) in reflection properties achieves a very wide frequency band not less than about 150 MHz. This is because the power supply circuit 16 includes the multiple LC resonant circuits including the inductance devices L1 and L2 which are mutually magnetically-coupled with high degree of coupling. Also, the capacitance devices C1a and C1b are inserted downstream of the wireless IC chip 5, thereby improving surge-resistance capabilities.

Eighteenth Preferred Embodiment

Figure 32:
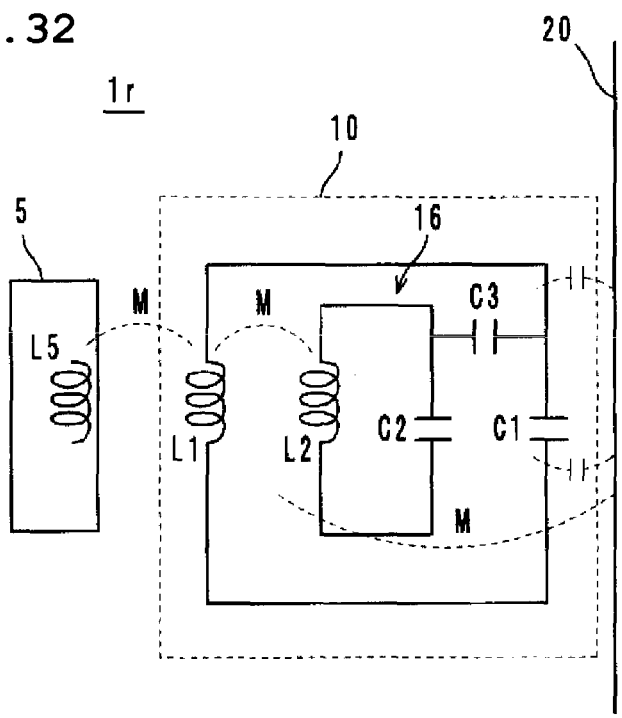
FIG. 32 is an equivalent circuit diagram illustrating an eighteenth preferred embodiment of the wireless IC device according to the present invention.

With a wireless IC device 1r according to an eighteenth preferred embodiment, as illustrated in FIG. 32 as an equivalent circuit, the power supply circuit 16 includes inductance devices L1 and L2 which are mutually magnetically-coupled with high degree of coupling. The inductance device L1 is magnetically-coupled with an inductance device L5 provided in the wireless IC chip 5, and the inductance device L2 defines an LC series resonant circuit along with the capacitance device C2. Also, the capacitance device C1 is capacitively-coupled with the radiation portion 20, and another capacitance device C3 is inserted between the capacitance devices C1 and C2.

Figure 33:
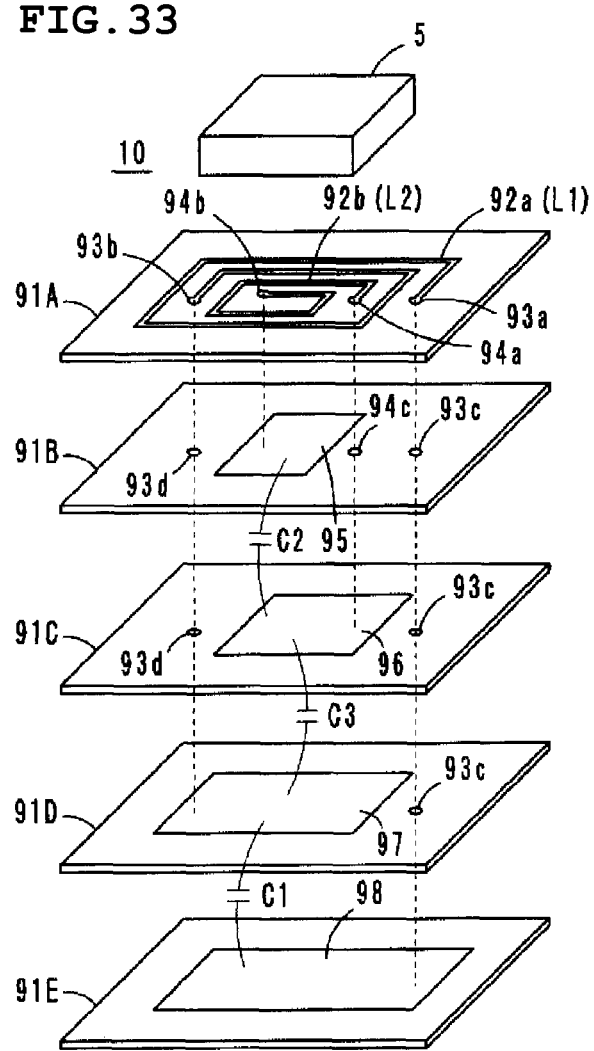
FIG. 33 is an exploded perspective view illustrating the power supply circuit board of the eighteenth preferred embodiment of the present invention.

Specifically, the power supply circuit board 10 is, as illustrated in FIG. 33, obtained by layering, pressure-bonding, and sintering ceramic sheets 91A through 91E each made of a dielectric member, and includes the sheet 91A forming conductor patterns 92a and 92b and via hole conductors 93a, 93b, 94a, and 94b, the sheet 91B forming a capacitor electrode 95 and via hole conductors 93c, 93d, and 94c, the sheet 91C forming a capacitor electrode 96 and via hole conductors 93c and 93d, the sheet 91D forming a capacitor electrode 97 and a via hole conductor 93c, and the sheet 91E forming a capacitor electrode 98.

These sheets 91A through 91E are layered, whereby the inductance device L1 is formed at the conductor pattern 92a, and the inductance device L2 is formed at the conductor pattern 92b. The capacitance device C1 is formed at the capacitor electrodes 97 and 98, one end of the inductance device L1 is connected to the capacitor electrode 98 via the via hole conductors 93a and 93c, and the other end thereof is connected to the capacitor electrode 97 via the via hole conductors 93b and 93d. The capacitance device C2 is formed at the capacitor electrodes 95 and 96, one end of the inductance device L2 is connected to the capacitor electrode 96 via the via hole conductors 94a and 94c, and the other end thereof is connected to the capacitor electrode 95 via the via hole conductor 94b. Further, the capacitor electrodes 96 and 97 define the capacitance device C3.

Figure 34A:
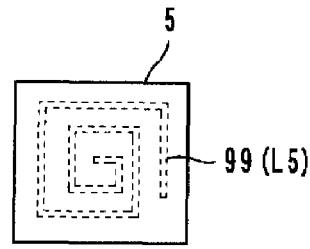
FIGS. 34A and 34B illustrate the wireless IC chip of the eighteenth embodiment.
Figure 34B:
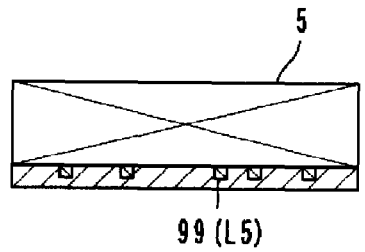

Also, as illustrated in FIG. 34, the rear side of the wireless IC chip 5 is provided with a coil-shaped electrode pattern 99 functioning as a chip-side electrode pattern, and the inductance device L5 is defined by this coil-shaped electrode pattern 99. Note that the surface of the coil-shaped electrode pattern 99 is provided with a protective film, such as a resin or other suitable film. Thus, the inductance devices L1 and L2 defined by a coil-shaped electrode pattern functioning as a board-side electrode pattern, and the coil-shaped electrode pattern 99 are magnetically-coupled.

The operations and advantages of the present eighteenth preferred embodiment are substantially the same as those in the first preferred embodiment. That is to say, with this wireless IC device 1r, a high-frequency signal (e.g., UHF frequency band) radiated from the unshown reader/writer is received at the radiation pattern 20, the power supply circuit 16 (the LC series resonant circuit defined by the inductance device L2 and the capacitance device C2) capacitively-coupled and magnetically-coupled with the radiation pattern 20 is resonated, and only the reception signal having a predetermined frequency band is supplied to the wireless IC chip 5. On the other hand, predetermined energy is extracted from this reception signal, the information stored in the wireless IC chip 5 is provided as an input signal, and reflection modulation is applied to this input signal with that energy as a driving source to obtain a transmission signal, and the transmission signal is matched with a predetermined frequency at the power supply circuit 16, following the transmission signal is propagated to the radiation pattern 20 via capacitive coupling and magnetic coupling, and is transmitted and transferred from the radiation pattern 20 to the reader/writer. Magnetic coupling is provided between the power supply circuit 16 and the wireless IC chip 5 by the inductance devices L1 and L5, thereby transmitting electric power and a transmission/reception signal.

Nineteenth Preferred Embodiment

Figure 35:
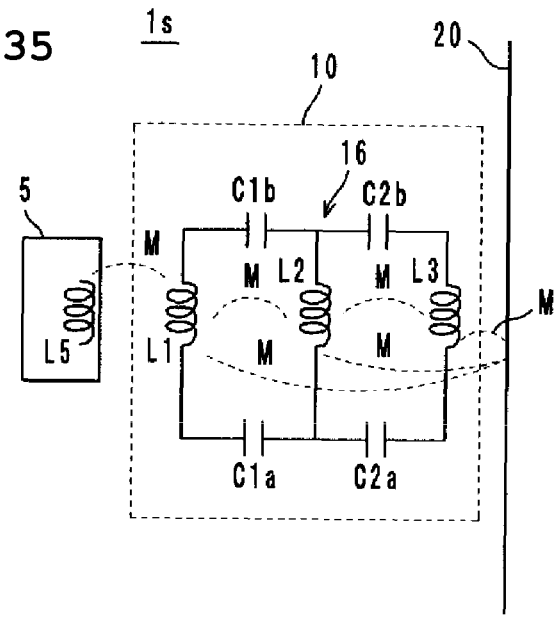
FIG. 35 is an equivalent circuit diagram illustrating a nineteenth preferred embodiment of the wireless IC device according to the present invention.

With a wireless IC device 1s according to a nineteenth preferred embodiment, as illustrated in FIG. 35 as an equivalent circuit, the power supply circuit 16 includes inductance devices L1, L2, and L3 which are mutually magnetically-coupled with a high degree of coupling. The inductance device L1 is magnetically-coupled with an inductance device L5 provided in the wireless IC chip 5, the inductance device L2 defines an LC series resonant circuit along with the capacitance devices C1a and C1b, and the inductance device L3 defines an LC series resonant circuit along with the capacitance devices C2a and C2b. Also, the inductance devices L1, L2, and L3 are each magnetically-coupled with the radiation pattern 20.

Figure 36:
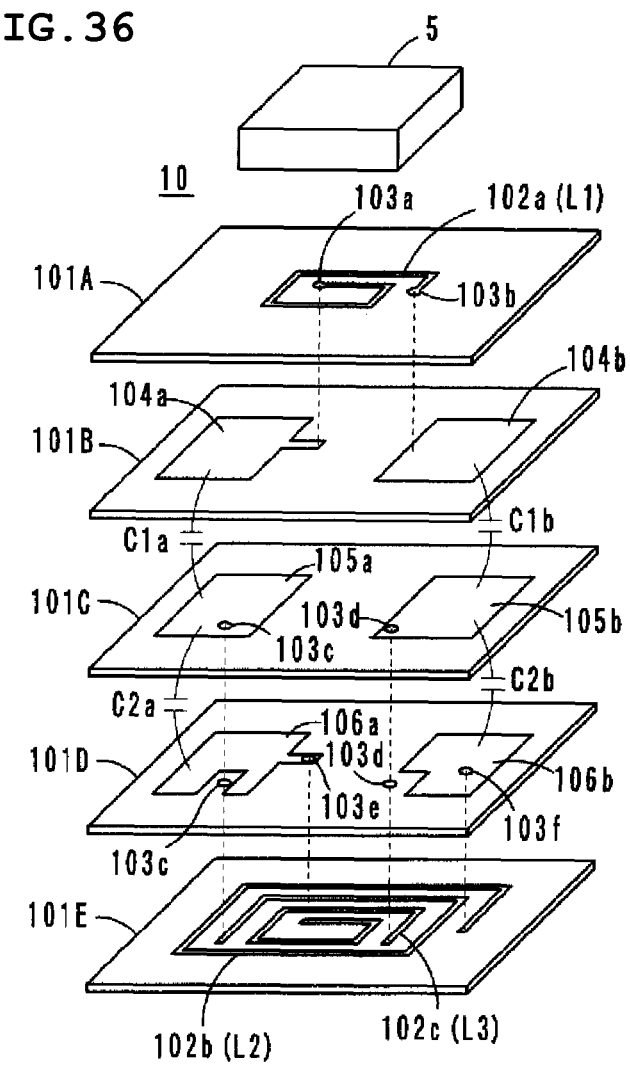
FIG. 36 is an exploded perspective view illustrating the power supply circuit board of the nineteenth preferred embodiment of the present invention.

Specifically, the power supply circuit board 10 is, as illustrated in FIG. 36, obtained by layering, pressure-bonding, and sintering ceramic sheets 101A through 101E each made of a dielectric member, and includes the sheet 101A forming a conductor pattern 102a and via hole conductors 103a and 103b, the sheet 101B forming capacitor electrodes 104a and 104b, the sheet 101C forming capacitor electrodes 105a and 105b and via hole conductors 103c and 103d, the sheet 101D forming capacitor electrodes 106a and 106b and via hole conductors 103c, 103d, 103e, and 103f, and the sheet 101E forming conductor patterns 102b and 102c. That is to say, space is provided between the electrodes 104a, 105a, and 106a, and the electrodes 104b, 105b, and 106b, which define the capacitance device, such that the magnetic flux caused by the inductance device L1 reaches the inductance devices L2, L3 and the radiation pattern 20.

These sheets 101A through 101E are layered, whereby the inductance device L1 is formed at the conductor pattern 102a, the inductance device L2 is formed at the conductor pattern 102b, and the inductance device L3 is formed at the conductor pattern 102c. The capacitance device C1a is formed at the capacitor electrodes 104a and 105a, and the capacitance device C1b is formed at the capacitor electrodes 104b and 105b. Also, the capacitance device C2a is formed at the capacitor electrodes 105a and 106a, and the capacitance device C2b is formed at the capacitor electrodes 105b and 106b.

One end of the inductance device L1 is connected to the capacitor electrode 104a via the via hole conductor 103a, and the other end thereof is connected to the capacitor electrode 104b via the via hole conductor 103b. One end of the inductance device L2 is connected to the capacitor electrode 105a via the via hole conductor 103c, and the other end thereof is connected to the capacitor electrode 106b via the via hole conductor 103f. One end of the inductance device L3 is connected to the capacitor electrode 106a via the via hole conductor 103e, and the other end thereof is connected to the capacitor electrode 105b via the via hole conductor 103d.

Also, as illustrated in FIG. 34, the rear side of the wireless IC chip 5 is provided with a coil-shaped electrode pattern 99 functioning as a chip-side electrode pattern, and the inductance device L5 is defined by this coil-shaped electrode pattern 99. Note that the surface of the coil-shaped electrode pattern 99 is provided with a protective film, such as a resin or other suitable film. Thus, the inductance device L1 defined by a coil-shaped electrode pattern functioning as a board-side electrode pattern, and the coil-shaped electrode pattern 99 are magnetically-coupled.

The operations and advantages of the present nineteenth preferred embodiment are substantially the same as those in the seventeenth preferred embodiment. That is to say, with this wireless IC device 1s, a high-frequency signal (e.g., UHF frequency band) radiated from the unshown reader/writer is received at the radiation pattern 20, the power supply circuit 16 (the LC series resonant circuit defined by the inductance device L2 and the capacitance devices C1a and C1b, and the LC series resonant circuit defined by the inductance device L3 and the capacitance devices C2a and C2b) magnetically-coupled with the radiation pattern 20 is resonated, and only the reception signal having a predetermined frequency band is supplied to the wireless IC chip 5. On the other hand, predetermined energy is extracted from this reception signal, the information stored in the wireless IC chip 5 is provided as an input signal, and reflection modulation is applied to this input signal with that energy as a driving source to obtain a transmission signal, and the transmission signal is matched with a predetermined frequency at the power supply circuit 16, following the transmission signal is propagated to the radiation pattern 20 from the inductance devices L1, L2, and L3 of the power supply circuit 16 via magnetic coupling, and is transmitted and transferred from the radiation pattern 20 to the reader/writer. Magnetic coupling is provided between the power supply circuit 16 and the wireless IC chip 5 by the inductance devices L1 and L5, thereby transmitting electric power and a transmission/reception signal.

Particularly, with the present nineteenth preferred embodiment, the power supply circuit 16 includes the multiple LC resonant circuits including the inductance devices L2 and L3 which are mutually magnetically-coupled, such that a frequency band to be used is increased as with the seventeenth preferred embodiment.

Twentieth Preferred Embodiment

Figure 37:
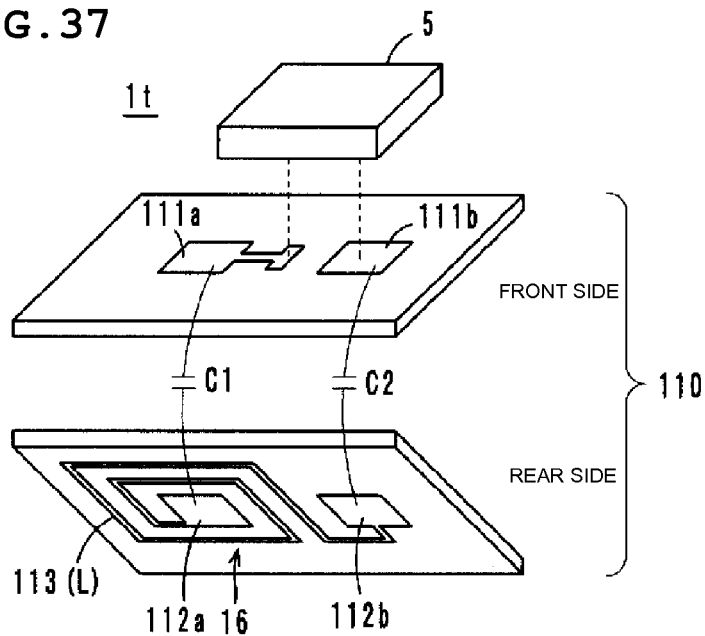
FIG. 37 is an exploded perspective view illustrating a twentieth preferred embodiment of the wireless IC device according to the present invention.

With a wireless IC device it according to a twentieth preferred embodiment, a power supply circuit board 110 is defined by a single-layer board, and the equivalent circuit thereof is the same as that in FIG. 3. That is to say, the power supply circuit 16 includes a LC series resonant circuit wherein the capacitance devices C1 and C2 are connected to both ends of the inductance device L. The power supply circuit board 110 is a ceramic board made of a dielectric member, and, as illustrated in FIG. 37, capacitor electrodes 111a and 111b are provided on the front side thereof, and capacitor electrodes 112a and 112b and a conductor pattern 113 are provided on the rear side thereof. The capacitor electrodes 111a and 112a define the capacitance device C1, and the capacitor electrodes 111b and 112b define the capacitance device C2.

The operations and advantages of the present twentieth preferred embodiment are substantially the same as those in the first preferred embodiment. That is to say, with this wireless IC device it, a high-frequency signal (e.g., UHF frequency band) radiated from the unshown reader/writer is received at the radiation pattern 20, the power supply circuit 16 (the LC series resonant circuit defined the inductance device L and the capacitance devices C1 and C2) magnetically-coupled with the radiation pattern 20 is resonated, and only the reception signal having a predetermined frequency band is supplied to the wireless IC chip 5. On the other hand, predetermined energy is extracted from this reception signal, the information stored in the wireless IC chip 5 is provided as an input signal, and reflection modulation is applied to this input signal with that energy as a driving source to obtain a transmission signal, and the transmission signal is matched with a predetermined frequency at the power supply circuit 16, following the transmission signal is propagated to the radiation pattern 20 from the inductance device L of the power supply circuit 16 via magnetic coupling, and is transmitted and transferred from the radiation pattern 20 to the reader/writer.

Figure 38:
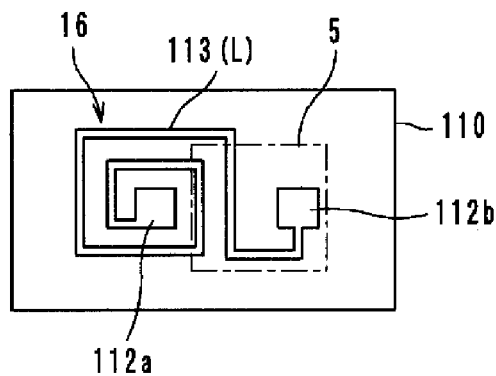
FIG. 38 is a bottom view of the power supply circuit board upon which is mounted the wireless IC chip with the twentieth preferred embodiment of the present invention.
Figure 39:
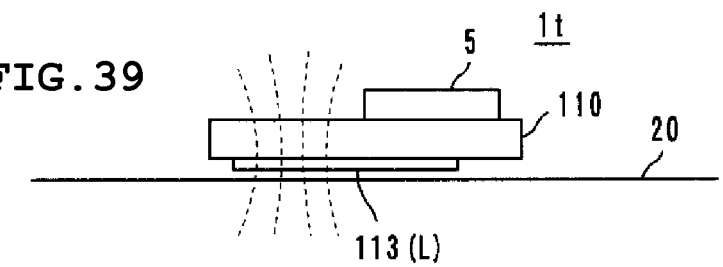
FIG. 39 is a side view of the twentieth preferred embodiment of the present invention.

Particularly, with the present twentieth preferred embodiment, as illustrated in FIG. 38 and FIG. 39, the inductance device L is disposed so as to overlap the wireless IC chip 5 only partially in a plane view. Thus, most of magnetic fluxes that occur at the inductance device L are not obstructed by the wireless IC chip 5, thereby obtaining an outstanding rising edge of a magnetic flux.

Figure 40:
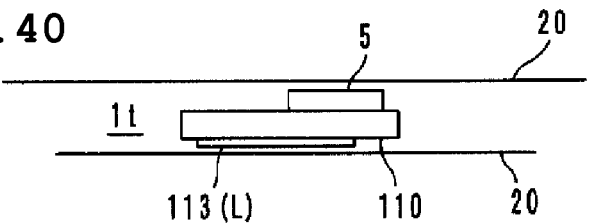
FIG. 40 is a side view illustrating a modification example of the twentieth preferred embodiment of the present invention.

Also, with the present twentieth preferred embodiment, as illustrated in FIG. 40, the power supply circuit board 110 on which the wireless IC chip 5 is mounted may be sandwiched with the radiation patterns 20 and 20 on both sides thereof. Thus, the magnetic coupling efficiency between the power supply circuit 16 and the radiation patterns 20 and 20 is improved, and gain is also improved.

As for an arrangement wherein the radiation patterns 20 and 20 are disposed on both sides of the power supply circuit board 110, the radiation patterns 20 and 20 may be disposed on one straight line on the X axis as illustrated in FIG. 41, and alternatively, may be disposed on the X axis and Y axis as illustrated in FIG. 42.

Twenty-First Preferred Embodiment

A wireless IC device 1u according to a twenty-first preferred embodiment is a device wherein the inductance device L is defined by a meandering-shaped line electrode pattern, and the equivalent circuit thereof is the same as that of in FIG. 3. That is to say, the power supply circuit 16 includes a LC series resonant circuit wherein the capacitance devices C1 and C2 are connected to both ends of the inductance device L. The power supply circuit board 110 is preferably a ceramic single-layer board made of a dielectric member, and as illustrated in FIG. 43, capacitor electrodes 121a and 121b are provided on the front side thereof, and capacitor electrodes 122a, 122b and a meandering-shaped conductor pattern 123 are provided on the rear side thereof. The capacitor electrodes 121a and 122a define the capacitance device C1, and the capacitor electrodes 121b and 122b define the capacitance device C2.

The operations and advantages of the present twenty-first preferred embodiment are substantially the same as those in the first preferred embodiment. That is to say, with this wireless IC device 1u, a high-frequency signal (e.g., UHF frequency band) radiated from the unshown reader/writer is received at the radiation pattern 20, the power supply circuit 16 (the LC series resonant circuit defined by the inductance device L and the capacitance devices C1 and C2) magnetically-coupled with the radiation pattern 20 is resonated, and only the reception signal having a predetermined frequency band is supplied to the wireless IC chip 5. On the other hand, predetermined energy is extracted from this reception signal, the information stored in the wireless IC chip 5 is provided as an input signal, and reflection modulation is applied to this input signal with that energy as a driving source to obtain a transmission signal, and the transmission signal is matched with a predetermined frequency at the power supply circuit 16, following the transmission signal is propagated to the radiation pattern 20 from the inductance device L of the power supply circuit 16 via magnetic coupling, and is transmitted and transferred from the radiation pattern 20 to the reader/writer.

Particularly, with the present twenty-first preferred embodiment, the inductance device L is defined by a meandering-shaped conductor pattern 123, which is efficient for transmission/reception of a high-frequency signal.

Note that with the twentieth preferred embodiment and the present twenty-first preferred embodiment, the power supply circuit board 110 may preferably be configured of a multilayer board, for example.

Twenty-Second Preferred Embodiment

Figure 44:
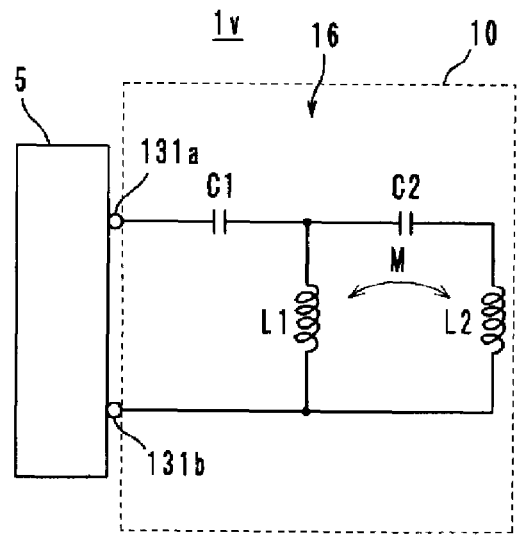
FIG. 44 is an equivalent circuit diagram illustrating a twenty-second preferred embodiment of the wireless IC device according to the present invention.

With a wireless IC device 1v according to a twenty-second preferred embodiment, as illustrated in FIG. 44 as an equivalent circuit, the power supply circuit 16 includes the inductance devices L1 and L2 which are mutually magnetically-coupled (illustrated by reference character M), wherein one end of the inductance device L1 is connected to the wireless IC chip 5 via a capacitance device C1 and an electrode for connection 131a, and connected to one end of the inductance device L2 via a capacitance device C2. Also, the other ends of the inductance devices L1 and L2 are each connected to the wireless IC chip 5 via an electrode for connection 131b. In other words, the power supply circuit 16 is configured so as to include an LC series resonant circuit defined by the inductance device L1 and the capacitance device C1, and an LC series resonant circuit defined by the inductance device L2 and the capacitance device C2, and both of the inductance devices L1 and L2 are magnetically-coupled with the radiation pattern 20.

Figure 45:
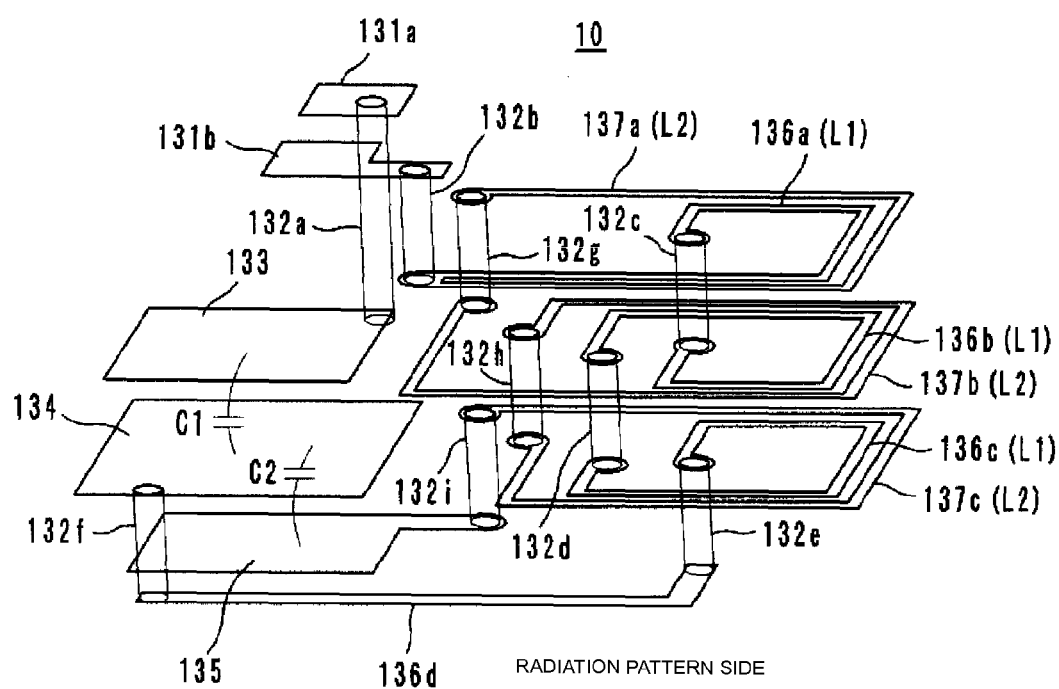
FIG. 45 is an exploded perspective view illustrating the power supply circuit board of the twenty-second preferred embodiment of the present invention.

The power supply circuit board 10 is configured as illustrated in FIG. 45. An electrode for connection 131a is connected to a capacitor electrode 133 via a via hole conductor 132a, and the capacitance electrode 133 defines the capacitance device C1, facing a capacitor electrode 134. Further, the capacitance electrode 134 defines the capacitance device C2, facing a capacitor electrode 135. An electrode for connection 131b is connected to conductor patterns 136a and 137a, which are branched in a two-forked shape, through a via hole conductor 132b, the conductor pattern 136a is connected to a conductor pattern 136b via a via hole conductor 132c, further connected to a conductor pattern 136c through a via hole conductor 132d, further connected to a conductor pattern 136d through a via hole conductor 132e, and this conductor pattern 136d is connected to the capacitor electrode 134 through a via hole conductor 132f.

On the other hand, a conductor pattern 137a is connected to a conductor pattern 137b through a via hole conductor 132g, further connected to a conductor pattern 137c through a via hole conductor 132h, and further connected to a capacitor electrode 135 through a via hole conductor 132i. The conductor patterns 136a, 136b, and 136c define the inductance device L1, and the conductor patterns 137a, 137b, and 137c define the inductance device L2. Note that in FIG. 45, drawing of ceramic sheets made of a dielectric member is omitted.

The operations and advantages of the present twenty-second preferred embodiment are substantially the same as those in the first preferred embodiment. That is to say, with this wireless IC device 1v, a high-frequency signal (e.g., UHF frequency band) radiated from the unshown reader/writer is received at the radiation pattern 20, the power supply circuit 16 (the LC series resonant circuit defined by the inductance device L1 and the capacitance device C1, and the LC series resonant circuit defined by the inductance device L2 and the capacitance device C2) principally magnetically-coupled with the radiation pattern 20 is resonated, and only the reception signal having a predetermined frequency band is supplied to the wireless IC chip 5. On the other hand, predetermined energy is extracted from this reception signal, the information stored in the wireless IC chip 5 is provided as an input signal, and reflection modulation is applied to this input signal with that energy as a driving source to obtain a transmission signal, and the transmission signal is matched with a predetermined frequency at the power supply circuit 16, following the transmission signal is propagated to the radiation pattern 20 from the inductance devices L1 and L2 of the power supply circuit 16 via magnetic coupling, and is transmitted and transferred from the radiation pattern 20 to the reader/writer.

Particularly, with the present twenty-second preferred embodiment, the capacitor electrodes 133, 134, and 135, and the inductor conductor patterns 136a through 136c, and 137a through 137c are disposed substantially in parallel to the radiation pattern 20. Therefore, the magnetic field formed by the inductor conductor patterns 136a through 136c, and 137a through 137c is not obstructed by the capacitor electrodes 133, 134, and 135, whereby the radiation properties from the inductor conductor patterns 136a through 136c, and 137a through 137c are improved.

Twenty-Third Preferred Embodiment

Figure 46:
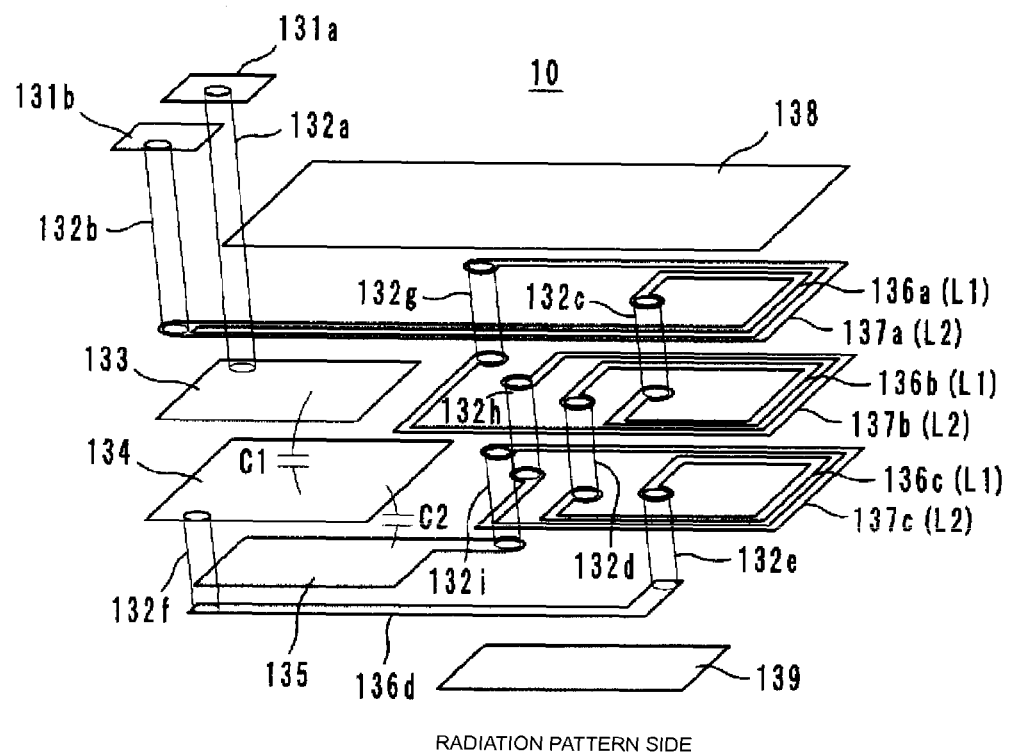
FIG. 46 is an exploded perspective view illustrating the power supply circuit board according to a twenty-third preferred embodiment of the wireless IC device according to the present invention.

A wireless IC device according to a twenty-third preferred embodiment includes the power supply circuit board 10 including the power supply circuit 16 having the equivalent circuit illustrated in FIG. 44. This power supply circuit board 10, as illustrated in FIG. 46, includes substantially the same configuration as the power supply circuit board 10 illustrated in FIG. 45, and additionally, a reflector (reflection pattern) 138 and a wave director (waveguide pattern) 139 are provided at a portion where magnetic field is formed by the inductor conductor patterns 136a through 136c, and 137a though 137c. The reflector 138 and the wave director 139 adjust the radiation properties and directivity from the power supply circuit 16 to the radiation pattern 20, and eliminate external electromagnetic influence to the greatest extent possible to stabilize the resonant properties.

The operations and advantages of the present twenty-third preferred embodiment are the same as those in the twenty-second preferred embodiment.

Twenty-Fourth Preferred Embodiment

Figure 47:
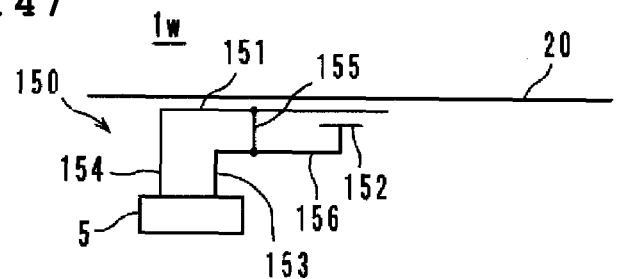
FIG. 47 is an equivalent circuit diagram illustrating a twenty-fourth preferred embodiment of the wireless IC device according to the present invention.
Figure 48:
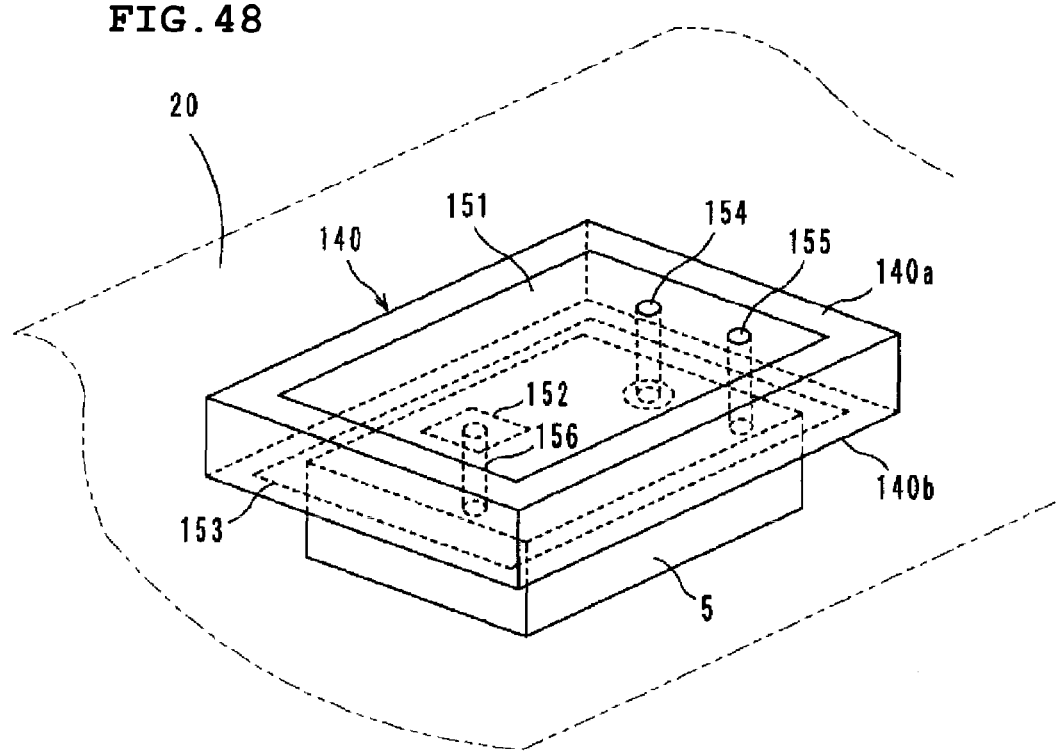
FIG. 48 is a perspective view illustrating the power supply circuit board of the twenty-fourth preferred embodiment of the present invention.

With a wireless IC device 1w according to a twenty-fourth preferred embodiment, a power supply circuit 150 is configured as a distributed-constant-type resonant circuit arranged in an inverted F antenna configuration, which includes the equivalent circuit illustrated in FIG. 47. Specifically, as illustrated in FIG. 48, a power supply circuit board 140 made of a ceramic multilayer board includes a high-side electrode 151 provided on a first plane 140a, a built-in capacitor electrode 152, and a low-side electrode 153 provided on a second plane 140b. The high-side electrode 151 is electrically connected to the radiation pattern 20 by magnetic coupling and capacitive coupling, and connected to a high-side terminal of the wireless IC chip 5 by a power supply pin 154. The low-side electrode 153 is connected to a low-side terminal of the wireless IC chip 5, and connected to the high-side electrode 151 via a short pin 155. The capacitor electrode 152 faces the high-side electrode 151 to form capacitance, and connected to the low-side electrode 153 via a short pin 156.

With this wireless IC device 1w, a high-frequency signal radiated from the unshown reader/writer is received at the radiation pattern 20, the power supply circuit 150 magnetically-coupled and capacitively-coupled with the radiation pattern 20 is resonated, and only the reception signal having a predetermined frequency is supplied to the wireless IC chip 5. On the other hand, predetermined energy is extracted from this reception signal, the information stored in the wireless IC chip 5 is provided as an input signal, and reflection modulation is applied to this input signal with that energy as a driving source to obtain a transmission signal, and the transmission signal is matched with a predetermined frequency at the power supply circuit 150, following which the transmission signal is transmitted and transferred from the radiation pattern 20 to the reader/writer.

Twenty-Fifth Preferred Embodiment

Figure 49:
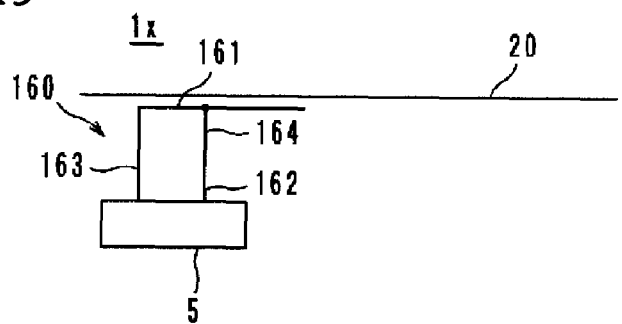
FIG. 49 is an equivalent circuit diagram illustrating a twenty-fifth preferred embodiment of the present invention.
Figure 50:
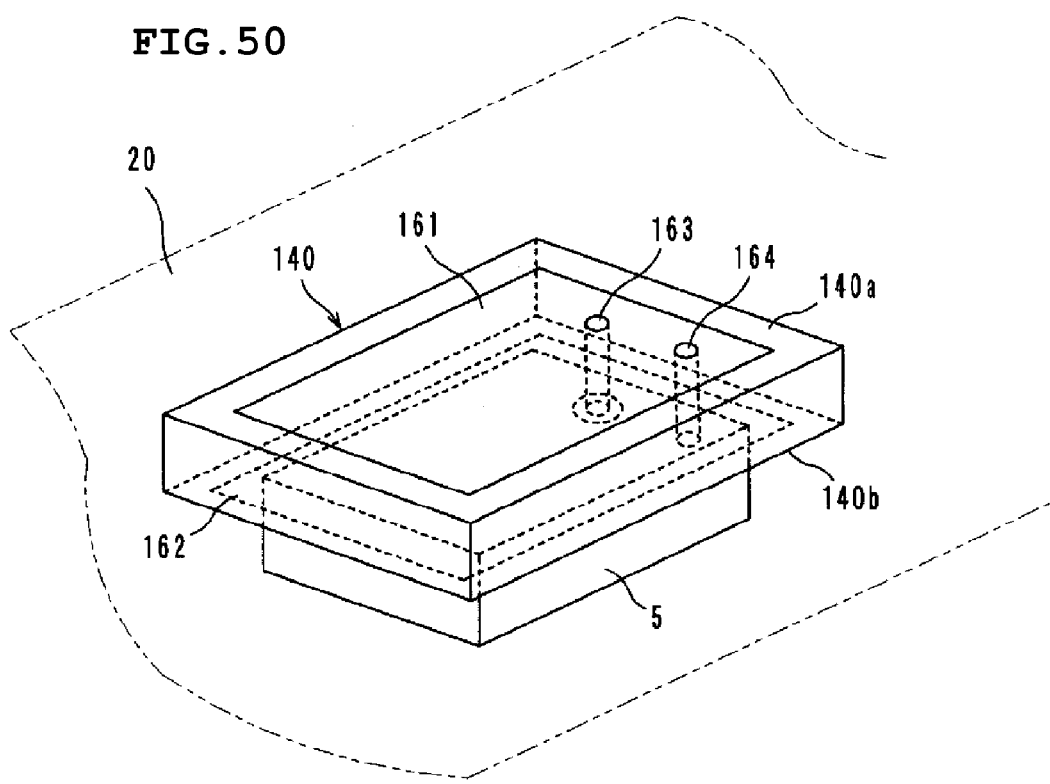
FIG. 50 is a perspective view illustrating the power supply circuit board of the twenty-fifth preferred embodiment of the present invention.

With a wireless IC device 1x according to a twenty-fifth preferred embodiment, a power supply circuit 160 is configured as a distributed-constant-type resonant circuit arranged in an inverted F antenna configuration, which includes the equivalent circuit illustrated in FIG. 49. Specifically, as illustrated in FIG. 50, a power supply circuit board 140 made of a ceramic multilayer board includes a high-side electrode 161 provided on a first plane 140a, and a low-side electrode 162 provided on a second plane 140b. The high-side electrode 161 is electrically connected to the radiation pattern 20 by magnetic coupling and capacitive coupling, and connected to a high-side terminal of the wireless IC chip 5 by a power supply pin 163. The low-side electrode 162 is connected to a low-side terminal of the wireless IC chip 5, and connected to the high-side electrode 161 via a short pin 164.

With this wireless IC device 1x, a high-frequency signal radiated from the unshown reader/writer is received at the radiation pattern 20, the power supply circuit 160 magnetically-coupled and capacitively-coupled with the radiation pattern 20 is resonated, and only the reception signal having a predetermined frequency is supplied to the wireless IC chip 5. On the other hand, predetermined energy is extracted from this reception signal, the information stored in the wireless IC chip 5 is provided as an input signal, and reflection modulation is applied to this input signal with that energy as a driving source to obtain a transmission signal, and the transmission signal is matched with a predetermined frequency at the power supply circuit 160, following which the transmission signal is transmitted and transferred from the radiation pattern 20 to the reader/writer.

Twenty-Sixth Preferred Embodiment

Figure 51:
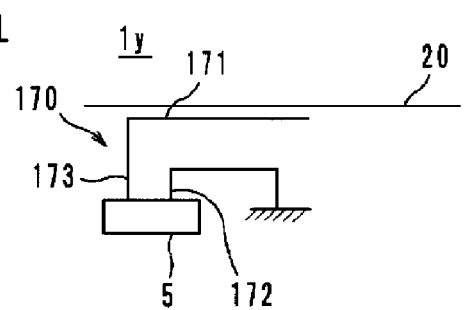
FIG. 51 is an equivalent circuit diagram illustrating a twenty-sixth preferred embodiment of the wireless IC device according to the present invention.
Figure 52:
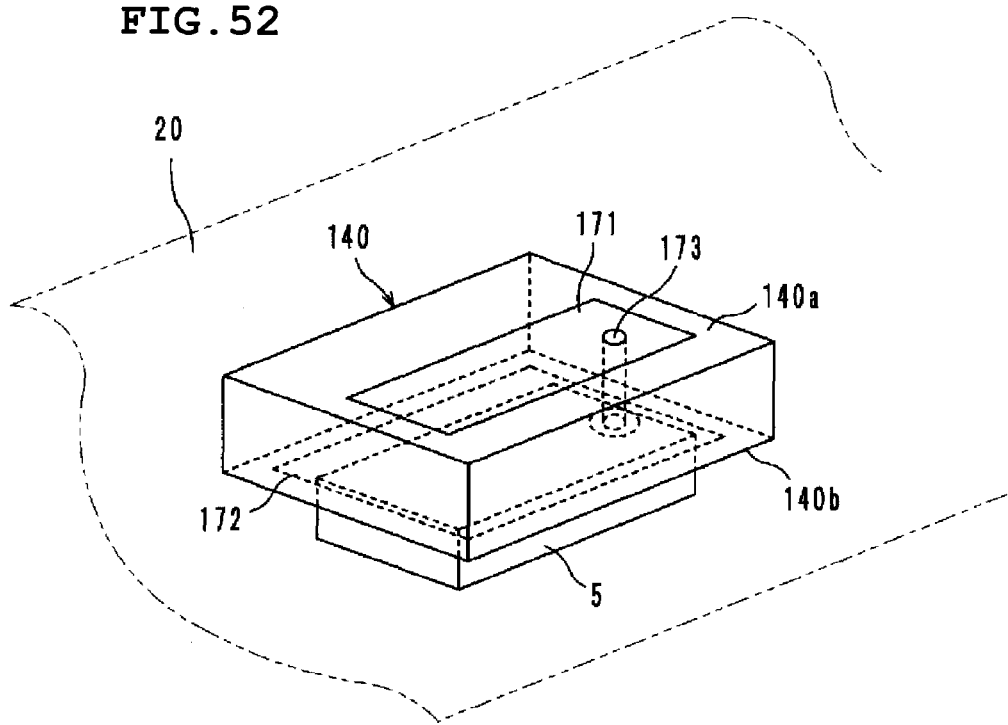
FIG. 52 is a perspective view illustrating the power supply circuit board of the twenty-sixth preferred embodiment of the present invention.

With a wireless IC device 1y according to a twenty-sixth preferred embodiment, a power supply circuit 170 is configured as a distributed-constant-type resonant circuit arranged in an inverted L antenna configuration, which includes the equivalent circuit illustrated in FIG. 51. Specifically, as illustrated in FIG. 52, a power supply circuit board 140 made of a ceramic multilayer board includes a high-side electrode 171 provided on a first plane 140a, and a low-side electrode 172 provided on a second plane 140b. The high-side electrode 171 is electrically connected to the radiation pattern 20 by magnetic coupling and capacitive coupling, and connected to a high-side terminal of the wireless IC chip 5 by a power supply pin 173. The low-side electrode 172 is connected to a low-side terminal of the wireless IC chip 5.

With this wireless IC device 1y, a high-frequency signal radiated from the unshown reader/writer is received at the radiation pattern 20, the power supply circuit 170 magnetically-coupled and capacitively-coupled with the radiation pattern 20 is resonated, and only the reception signal having a predetermined frequency is supplied to the wireless IC chip 5. On the other hand, predetermined energy is extracted from this reception signal, the information stored in the wireless IC chip 5 is provided as an input signal, and reflection modulation is applied to this input signal with that energy as a driving source to obtain a transmission signal, and the transmission signal is matched with a predetermined frequency at the power supply circuit 170, following the transmission signal is transmitted and transferred from the radiation pattern 20 to the reader/writer.

Twenty-Seventh Preferred Embodiment

Figure 53:
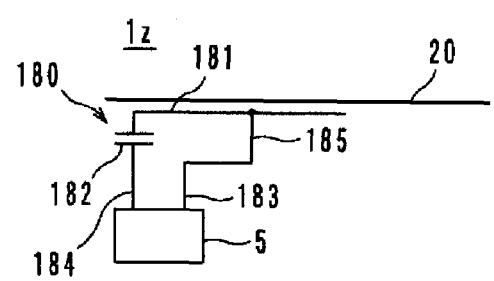
FIG. 53 is an equivalent circuit diagram illustrating a twenty-seventh preferred embodiment of the wireless IC device according to the present invention.
Figure 54:
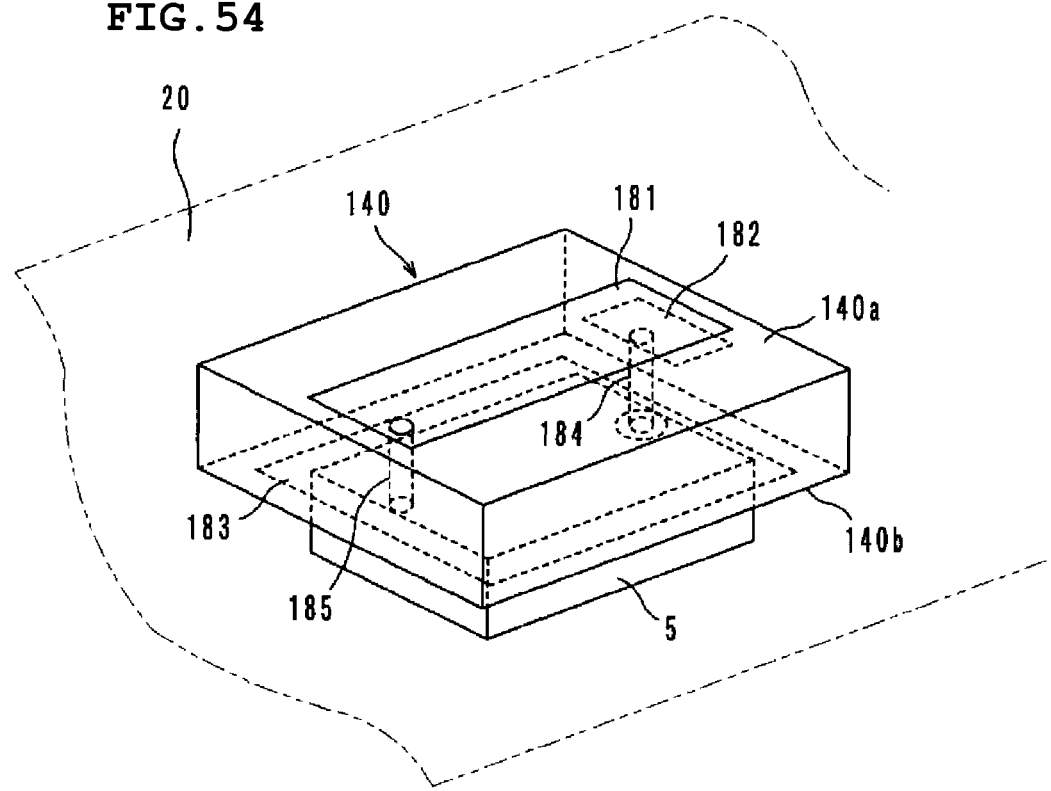
FIG. 54 is a perspective view illustrating the power supply circuit board of the twenty-seventh preferred embodiment of the present invention.

With a wireless IC device 1z according to a twenty-seventh preferred embodiment, a power supply circuit 180 preferably includes a distributed-constant-type resonant circuit arranged in an inverted L antenna configuration, which includes the equivalent circuit illustrated in FIG. 53. Specifically, as illustrated in FIG. 54, a power supply circuit board 140 made of a ceramic multilayer board includes a high-side electrode 181 provided on a first plane 140a, a built-in capacitor electrode 182 and a low-side electrode 183 provided on a second plane 140b. The high-side electrode 181 is electrically connected to the radiation pattern 20 by magnetic coupling and capacitive coupling. The capacitor electrode 182 faces the high-side electrode 181 to form capacitance, and connected to a high-side terminal of the wireless IC chip 5 at a power supply pin 184. The low-side electrode 183 is connected to a low-side terminal of the wireless IC chip 5, and connected to the high-side electrode 181 via a short pin 185.

With this wireless IC device 1z, a high-frequency signal radiated from the unshown reader/writer is received at the radiation pattern 20, the power supply circuit 180 magnetically-coupled and capacitively-coupled with the radiation pattern 20 is resonated, and only the reception signal having a predetermined frequency is supplied to the wireless IC chip 5. On the other hand, predetermined energy is extracted from this reception signal, the information stored in the wireless IC chip 5 is provided as an input signal, and reflection modulation is applied to this input signal with that energy as a driving source to obtain a transmission signal, and the transmission signal is matched with a predetermined frequency at the power supply circuit 180, following which the transmission signal is transmitted and transferred from the radiation pattern 20 to the reader/writer.

Twenty-Eighth Preferred Embodiment

Figure 55:
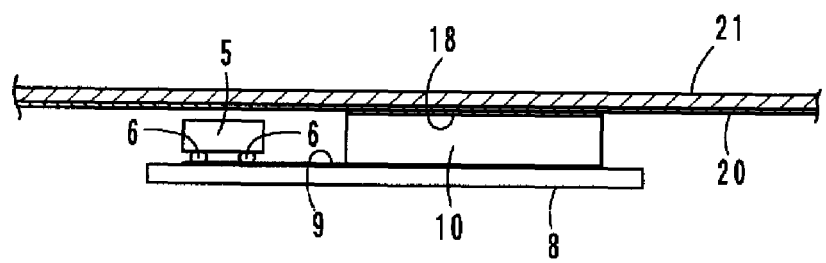
FIG. 55 is a cross-sectional view illustrating a twenty-eighth preferred embodiment of the wireless IC device according to the present invention.

With a wireless IC chip 2a according to a twenty-eighth preferred embodiment, as illustrated in FIG. 55, the wireless IC chip 5 and the power supply circuit board 10 are mounted, disposed substantially in parallel on a rigid wiring board 8, and the power supply circuit board 10 is adhered to the radiation pattern 20 with the adhesive agent 18. The power supply circuit board 10 is, for example, a board which includes the power supply circuit 16 illustrated in FIG. 2, and is electrically connected to the wireless IC chip 5 by multiple conductors 9 provided on the wiring board 8.

With this wireless IC device 2a also, the power supply circuit 16 is primarily magnetically-coupled with the radiation pattern 20, and performs substantially the same operations as the first preferred embodiment to communicate with the reader/writer. Note that with the twenty-eighth preferred embodiment, for the power supply circuit board 10 those shown in the above respective preferred embodiments other than that shown in the first preferred embodiment can be used. This point can also be applied to the following twenty-ninth preferred embodiment.

Twenty-Ninth Preferred Embodiment

Figure 56:
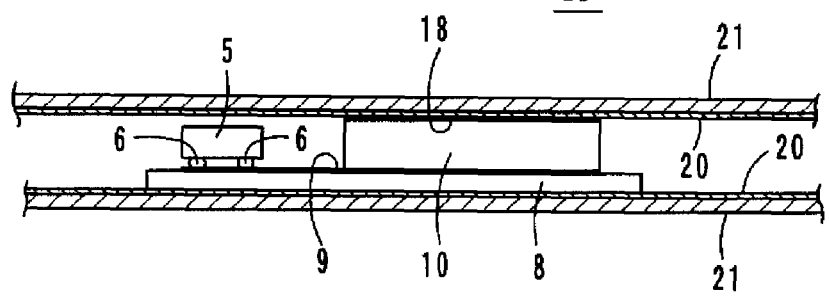
FIG. 56 is a cross-sectional view illustrating a twenty-ninth preferred embodiment of the wireless IC device according to the present invention.

A wireless IC device 2b according to a twenty-ninth preferred embodiment is, as illustrated in FIG. 56, a device obtained by including an arrangement wherein another radiation pattern 20 is adhered to the wiring board 8, and the wireless IC chip 5, power supply circuit board 10, and wiring board 8 are sandwiched by the pair of radiation pattern 20 in the device according to the twenty-eighth preferred embodiment. The operations thereof are substantially the same as those in the twenty-eighth preferred embodiment, and particularly, the magnetic coupling efficiency between the power supply circuit 16 and the radiation patterns 20 is improved.

Thirtieth Preferred Embodiment

Figure 57:
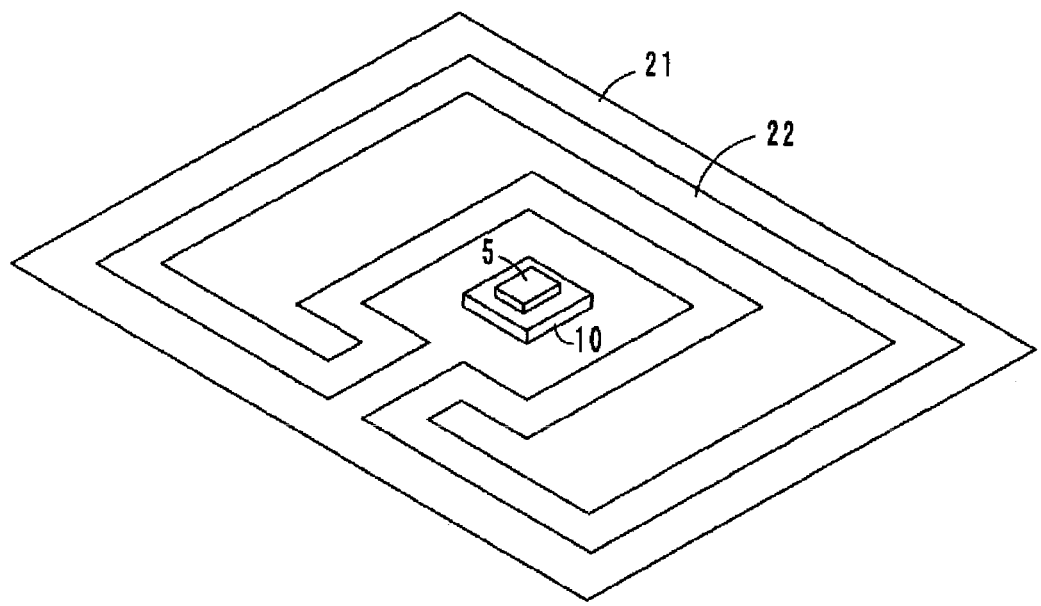
FIG. 57 is a perspective view illustrating a thirtieth preferred embodiment of the wireless IC device according to the present invention.

With a wireless IC device 2c according to a thirtieth preferred embodiment, as illustrated in FIG. 57, a radiation pattern 22 having a double closed loop shape is disposed in a symmetrical manner on the surface of the resin film 21, and the power supply circuit board 10 that mounts the wireless IC chip 5 is disposed on the center portion of the inner side loop of the radiation pattern 22.

With the present thirtieth preferred embodiment, the power supply circuit board 10 is disposed adjacent to the radiation pattern 22 without being adhered to the radiation pattern 22. The radiation pattern 22 has a loop shape, so the linear length of the radiation pattern 22 is relatively short. With this configuration, the power supply circuit board 10 and the radiation pattern 22 are subjected to electromagnetic induction coupling, exchange of a signal is performed as with the above-described preferred embodiments, and communication with the reader/writer can be performed. Also, minimal positional accuracy is required as long as the power supply circuit board 10 is disposed substantially at the center portion of the radiation pattern 22.

Thirty-First Preferred Embodiment

Figure 58:
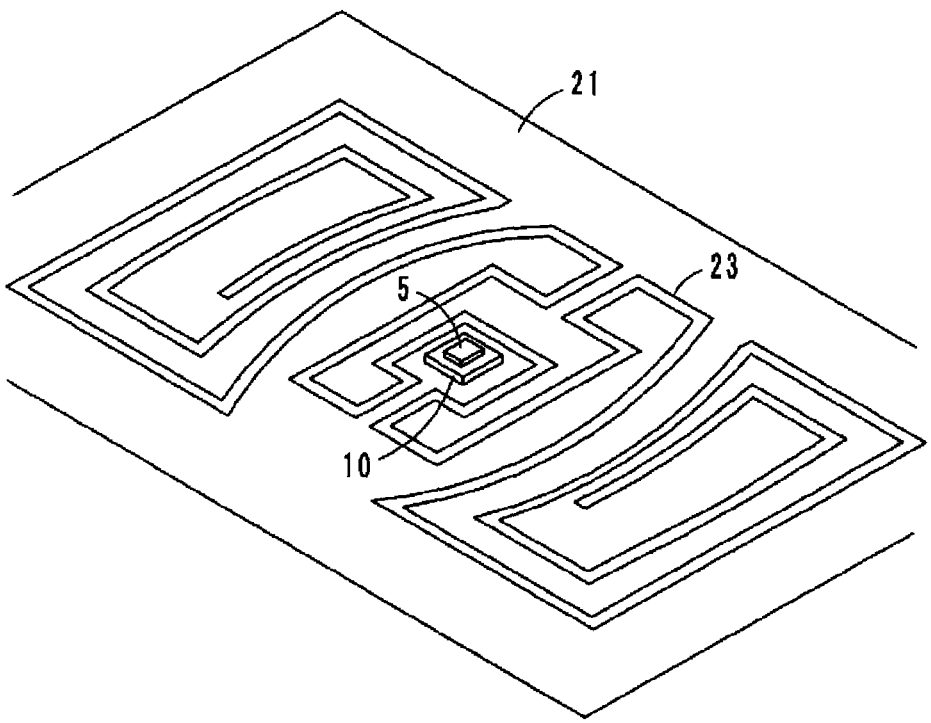
FIG. 58 is a perspective view illustrating a thirty-first preferred embodiment of the wireless IC device according to the present invention.
Figure 59:
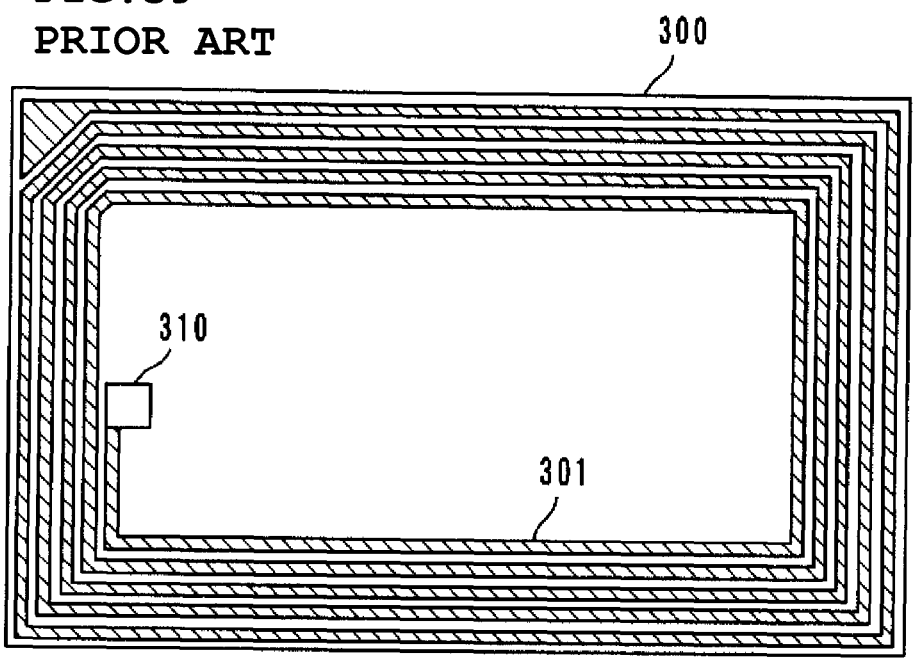
FIG. 59 is a plan view illustrating a first example of a conventional wireless IC device.
Figure 60:
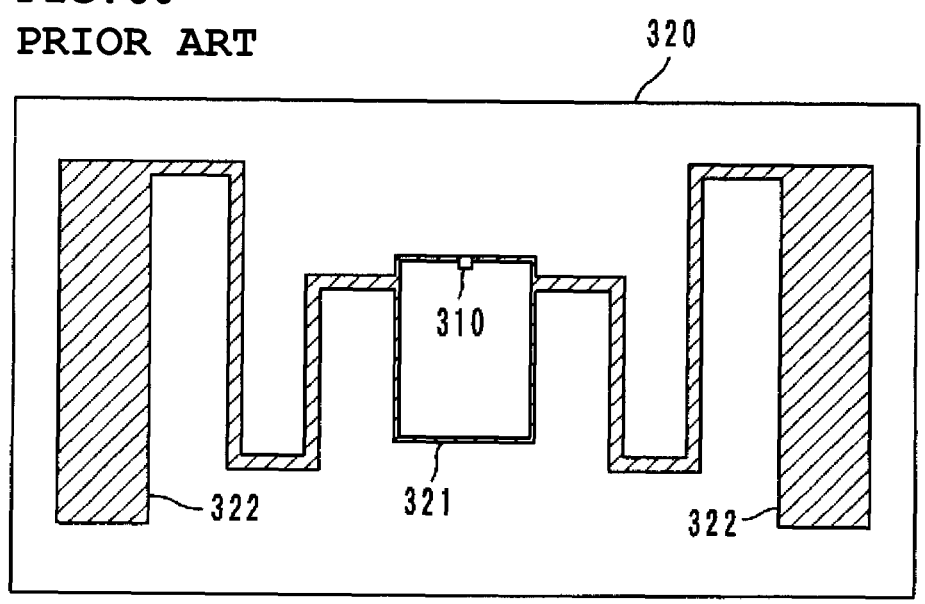
FIG. 60 is a plan view illustrating a second example of a conventional wireless IC device.

With a wireless IC device 2d according to a thirty-first preferred embodiment, as illustrated in FIG. 58, a radiation pattern 23 having a combination of a meander shape, a loop shape, and a spiral shape is disposed in a symmetrical manner on the surface of the resin film 21, and the power supply circuit board 10 that mounts the wireless IC chip 5 is disposed at the center portion of the inner side loop of the radiation pattern 23.

With the present thirty-first preferred embodiment, the power supply circuit board 10 is disposed adjacent to the radiation pattern 23 without being adhered to the radiation pattern 23. The radiation pattern 23 is a combination of a meander shape, a loop shape, and a spiral shape, such that the linear length of the radiation pattern 23 is relatively short. With this configuration, the power supply circuit board 10 and the radiation pattern 23 are subjected to electromagnetic induction coupling, exchange of a signal is performed as with the above-described preferred embodiments, and communication with the reader/writer can be performed. Also, minimal positional accuracy is required regarding the placement of the power supply circuit board 10 as with the above thirtieth preferred embodiment.

Note that the wireless IC device according to the present invention is not restricted to the above-described preferred embodiments, and various modifications can be made within the scope thereof.

For example, the details of the internal configuration of the power supply circuit board, the detailed shapes of the radiation pattern and film can be arbitrarily determined. Also, when connecting the wireless IC chip on the power supply circuit board, processing other than soldering bump may be used. Further, it is not required that the power supply circuit board be rigid, and accordingly, the power supply circuit board may be configured as a flexible substrate using an organic resin material (e.g., polyimide or liquid crystal polymer).

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A wireless IC device for an RFID system comprising:
a wireless IC chip;
a power supply circuit board including a power supply circuit connected to the wireless IC chip; and
a radiation pattern, to which the power supply circuit board is adhered or disposed adjacent, and arranged to perform at least one of radiating a transmission signal supplied from the power supply circuit and receiving a reception signal and supplying the reception signal to the power supply circuit; wherein
the power supply circuit includes a matching circuit to perform matching between an impedance of the wireless IC chip and an impedance of the radiation pattern; and
the matching circuit is located inside of the power supply circuit board.

2. The wireless IC device for an RFID system according to claim 1, wherein the power supply circuit includes a resonant circuit including the matching circuit.

3. The wireless IC device for an RFID system according to claim 2, wherein the resonant circuit is a concentrated-constant resonant circuit including a capacitor pattern and an inductor pattern.

4. The wireless IC device for an RFID system according to claim 3, wherein the resonant circuit includes a plurality of LC series resonant circuits or a plurality of LC parallel resonant circuits.

5. The wireless IC device for an RFID system according to claim 1, wherein
the power supply circuit board is a multilayer board including a plurality of dielectric layers or a plurality of magnetic layers; and
the matching circuit is provided inside of the multilayer board.

6. The wireless IC device for an RFID system according to claim 1, wherein
the power supply circuit board is a rigid board; and
the wireless IC chip is mounted on the power supply circuit board.

7. The wireless IC device for an RFID system according to claim 1, wherein
the power supply circuit board includes a board-side electrode pattern; and
the power supply circuit board and the radiation pattern are connected by DC connection via the board-side electrode pattern.

8. The wireless IC device for an RFID system according to claim 1, wherein
the radiation pattern includes an opening portion; and
the power supply circuit board is arranged adjacent to the opening portion.

9. The wireless IC device for an RFID system according to claim 8, wherein the opening portion is partially disposed in the radiation pattern.

10. The wireless IC device for an TFID system according to claim 9, wherein
the power supply circuit includes a coil-shaped electrode pattern; and
a winding axis of the coil-shaped electrode pattern is substantially perpendicular to a surface of the radiation pattern.

* * * * *